United States Patent
Seo et al.

(10) Patent No.: US 12,262,574 B2
(45) Date of Patent: *Mar. 25, 2025

(54) LIGHT-EMITTING ELEMENT

(71) Applicant: SEMICONDUCTOR ENERGY LABORATORY CO., LTD., Atsugi (JP)

(72) Inventors: Satoshi Seo, Kanagawa (JP); Hiromi Seo, Kanagawa (JP); Tatsuyoshi Takahashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,861

(22) Filed: Aug. 11, 2023

(65) Prior Publication Data

US 2024/0049493 A1 Feb. 8, 2024

Related U.S. Application Data

(63) Continuation of application No. 17/829,498, filed on Jun. 1, 2022, now Pat. No. 11,730,007, which is a
(Continued)

(30) Foreign Application Priority Data

Aug. 3, 2012 (JP) .................................. 2012-172830

(51) Int. Cl.
*H10K 50/11* (2023.01)
*C09K 11/02* (2006.01)
(Continued)

(52) U.S. Cl.
CPC .............. *H10K 50/11* (2023.02); *C09K 11/02* (2013.01); *C09K 11/06* (2013.01); *H10K 50/15* (2023.02);
(Continued)

(58) Field of Classification Search
None
See application file for complete search history.

(56) References Cited

U.S. PATENT DOCUMENTS 5,574,288 A 11/1996 Harklau et al.
5,955,836 A 9/1999 Boerner et al.
(Continued)

FOREIGN PATENT DOCUMENTS

CN 101114700 A 1/2008
CN 101471423 A 7/2009
(Continued)

OTHER PUBLICATIONS

Levitus.M et al., "Polarized Electronic Spectroscopy and Photophysical Properties of 9,10-Bis(phenylethynyl)anthracene", J. Phys. Chem. A (The Journal of Physical Chemistry A), Aug. 31, 2000, vol. 104, No. 38, pp. 8632-8637.
(Continued)

*Primary Examiner* — Telly D Green
(74) *Attorney, Agent, or Firm* — Fish & Richardson P.C.

(57) ABSTRACT

To provide a light-emitting element which uses a fluorescent material as a light-emitting substance and has higher luminous efficiency. To provide a light-emitting element which includes a mixture of a thermally activated delayed fluorescent substance and a fluorescent material. By making the emission spectrum of the thermally activated delayed fluorescent substance overlap with an absorption band on the longest wavelength side in absorption by the fluorescent material in an $S_1$ level of the fluorescent material, energy at an $S_1$ level of the thermally activated delayed fluorescent substance can be transferred to the $S_1$ of the fluorescent material. Alternatively, it is also possible that the $S_1$ of the thermally activated delayed fluorescent substance is generated from part of the energy of a $T_1$ level of the thermally
(Continued)

activated delayed fluorescent substance, and is transferred to the $S_1$ of the fluorescent material.

19 Claims, 28 Drawing Sheets

Related U.S. Application Data continuation of application No. 16/944,257, filed on Jul. 31, 2020, now Pat. No. 11,355,722, which is a continuation of application No. 16/412,529, filed on May 15, 2019, now Pat. No. 10,734,594, which is a continuation of application No. 15/946,094, filed on Apr. 5, 2018, now Pat. No. 10,644,254, which is a continuation of application No. 15/412,515, filed on Jan. 23, 2017, now Pat. No. 9,947,885, which is a continuation of application No. 15/051,910, filed on Feb. 24, 2016, now Pat. No. 9,559,313, which is a continuation of application No. 13/957,612, filed on Aug. 2, 2013, now Pat. No. 9,276,228.

(51) Int. Cl.
| | | |
|---|---|---|
| *C09K 11/06* | (2006.01) | |
| *H10K 50/15* | (2023.01) | |
| *H10K 50/16* | (2023.01) | |
| *H10K 85/30* | (2023.01) | |
| *H10K 85/60* | (2023.01) | |
| *H10K 101/10* | (2023.01) | |
| *H10K 101/30* | (2023.01) | |
| *H10K 101/40* | (2023.01) | |

(52) U.S. Cl.
CPC ........... *H10K 50/16* (2023.02); *H10K 85/321* (2023.02); *H10K 85/611* (2023.02); *H10K 85/622* (2023.02); *H10K 85/633* (2023.02); *H10K 85/636* (2023.02); *H10K 85/6572* (2023.02); *H10K 85/6576* (2023.02); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1092* (2013.01); *H10K 85/615* (2023.02); *H10K 85/624* (2023.02); *H10K 85/654* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 6,863,997 | B2 | 3/2005 | Thompson et al. |
| 6,869,695 | B2 | 3/2005 | Thompson et al. |
| 6,951,694 | B2 | 10/2005 | Thompson et al. |
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,553,557 | B2 | 6/2009 | Thompson et al. |
| 7,572,522 | B2 | 8/2009 | Seo et al. |
| 7,597,967 | B2 | 10/2009 | Kondakova et al. |
| 7,943,925 | B2 | 5/2011 | Yamazaki |
| 7,993,760 | B2 | 8/2011 | Komori et al. |
| 8,034,465 | B2 | 10/2011 | Liao et al. |
| 8,080,811 | B2 | 12/2011 | Yokoyama et al. |
| 8,247,086 | B2 | 8/2012 | Inoue et al. |
| 8,274,214 | B2 | 9/2012 | Ikeda et al. |
| 8,343,639 | B2 | 1/2013 | Seo et al. |
| 8,435,811 | B2 | 5/2013 | Yokoyama et al. |
| 8,476,823 | B2 | 7/2013 | Kuma et al. |
| 8,643,268 | B2 | 2/2014 | Ogiwara et al. |
| 8,729,310 | B2 | 5/2014 | Osaka et al. |
| 8,766,249 | B2 | 7/2014 | Sawada et al. |
| 8,810,125 | B2 | 8/2014 | Ikeda et al. |
| 8,853,680 | B2 | 10/2014 | Yamazaki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,099,658 | B2 | 8/2015 | Kawamura et al. |
| 9,159,941 | B2 | 10/2015 | Ogiwara |
| 9,159,942 | B2 | 10/2015 | Seo et al. |
| 9,175,213 | B2 | 11/2015 | Seo et al. |
| 9,276,228 | B2 | 3/2016 | Seo et al. |
| 9,356,250 | B2 | 5/2016 | Ohsawa et al. |
| 9,543,530 | B2 | 1/2017 | Kim et al. |
| 9,559,313 | B2 | 1/2017 | Seo et al. |
| 9,604,928 | B2 | 3/2017 | Shitagaki et al. |
| 9,620,723 | B2 | 4/2017 | Seo et al. |
| 9,947,885 | B2 | 4/2018 | Seo et al. |
| 10,062,861 | B2 | 8/2018 | Seo et al. |
| 10,243,151 | B2 | 3/2019 | Seo et al. |
| 10,505,132 | B2 | 12/2019 | Seo et al. |
| 10,644,254 | B2 | 5/2020 | Seo et al. |
| 10,734,594 | B2 | 8/2020 | Seo et al. |
| 10,879,482 | B2 | 12/2020 | Ogiwara et al. |
| 11,355,722 | B2 * | 6/2022 | Seo .................. H10K 85/636 |
| 11,730,007 | B2 * | 8/2023 | Seo .................. C09K 11/06 257/40 |
| 2002/0146589 | A1 | 10/2002 | Akiyama et al. |
| 2003/0175553 | A1 | 9/2003 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2006/0228577 | A1 | 10/2006 | Nagara |
| 2007/0090756 | A1 | 4/2007 | Okada et al. |
| 2007/0244320 | A1 | 10/2007 | Inoue et al. |
| 2008/0160345 | A1 | 7/2008 | Inoue et al. |
| 2008/0286604 | A1 | 11/2008 | Inoue et al. |
| 2009/0166563 | A1 | 7/2009 | Yokoyama et al. |
| 2010/0052527 | A1 | 3/2010 | Ikeda et al. |
| 2010/0090209 | A1 | 4/2010 | Ikari et al. |
| 2010/0145044 | A1 | 6/2010 | Inoue et al. |
| 2010/0301318 | A1 | 12/2010 | Kuma et al. |
| 2011/0001146 | A1 | 1/2011 | Yamazaki et al. |
| 2011/0210316 | A1 | 9/2011 | Kadoma et al. |
| 2011/0215714 | A1 | 9/2011 | Seo et al. |
| 2011/0233604 | A1 | 9/2011 | Ikeda |
| 2011/0272679 | A1 | 11/2011 | Yokoyama et al. |
| 2011/0297922 | A1 | 12/2011 | Krause et al. |
| 2012/0098417 | A1 | 4/2012 | Inoue et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0235127 | A1 | 9/2012 | Takasu et al. |
| 2012/0242219 | A1 | 9/2012 | Seo et al. |
| 2012/0248421 | A1 | 10/2012 | Yamazaki et al. |
| 2012/0248968 | A1 | 10/2012 | Ogiwara et al. |
| 2012/0256535 | A1 | 10/2012 | Seo et al. |
| 2013/0048964 | A1 | 2/2013 | Takeda et al. |
| 2013/0056720 | A1 | 3/2013 | Kim et al. |
| 2013/0207047 | A1 | 8/2013 | Suda et al. |
| 2013/0207088 | A1 | 8/2013 | Seo |
| 2013/0270531 | A1 | 10/2013 | Seo et al. |
| 2013/0277653 | A1 | 10/2013 | Osaka et al. |
| 2013/0277655 | A1 | 10/2013 | Seo et al. |
| 2013/0277656 | A1 | 10/2013 | Seo et al. |
| 2013/0292656 | A1 | 11/2013 | Seo et al. |
| 2013/0306945 | A1 | 11/2013 | Seo |
| 2014/0014930 | A1 | 1/2014 | Hirose et al. |
| 2014/0034925 | A1 | 2/2014 | Osaka et al. |
| 2014/0034926 | A1 | 2/2014 | Matsubara et al. |
| 2014/0034927 | A1 | 2/2014 | Seo et al. |
| 2014/0034930 | A1 | 2/2014 | Seo et al. |
| 2014/0034931 | A1 | 2/2014 | Inoue et al. |
| 2014/0034932 | A1 | 2/2014 | Seo et al. |
| 2014/0061604 | A1 | 3/2014 | Seo et al. |
| 2014/0103329 | A1 | 4/2014 | Ogiwara et al. |

(56) References Cited

U.S. PATENT DOCUMENTS

| | | |
|---|---|---|
| 2015/0069352 A1 | 3/2015 | Kim et al. |
| 2015/0166886 A1 | 6/2015 | Endo et al. |
| 2017/0250352 A1 | 8/2017 | Seo et al. |
| 2021/0074941 A1 | 3/2021 | Ogiwara et al. |

FOREIGN PATENT DOCUMENTS

| | | |
|---|---|---|
| CN | 101728415 A | 6/2010 |
| CN | 102144313 A | 8/2011 |
| CN | 103443949 A | 12/2013 |
| EP | 1202608 A | 5/2002 |
| EP | 2175491 A | 4/2010 |
| EP | 2363398 A | 9/2011 |
| EP | 2366753 A | 9/2011 |
| EP | 2380888 A | 10/2011 |
| EP | 2511360 A | 10/2012 |
| EP | 2568030 A | 3/2013 |
| EP | 2628743 A | 8/2013 |
| EP | 2690681 A | 1/2014 |
| EP | 2858136 A | 4/2015 |
| EP | 3176241 A | 6/2017 |
| EP | 3598520 A | 1/2020 |
| JP | 07-085972 A | 3/1995 |
| JP | 10-106748 A | 4/1998 |
| JP | 2000-252076 A | 9/2000 |
| JP | 2002-050483 A | 2/2002 |
| JP | 2004-241374 A | 8/2004 |
| JP | 2005-032629 A | 2/2005 |
| JP | 2005-514754 | 5/2005 |
| JP | 2006-024830 A | 1/2006 |
| JP | 2006-203172 A | 8/2006 |
| JP | 2007-217312 A | 8/2007 |
| JP | 2008-288344 A | 11/2008 |
| JP | 2010-083876 A | 4/2010 |
| JP | 2011-088887 A | 5/2011 |
| JP | 2011-201869 A | 10/2011 |
| JP | 2011-204673 A | 10/2011 |
| JP | 2011-213643 A | 10/2011 |
| JP | 2012-004526 A | 1/2012 |
| JP | 2012-044125 A | 3/2012 |
| JP | 2012-079915 A | 4/2012 |
| JP | 2010/084729 | 7/2012 |
| JP | 2012-195517 A | 10/2012 |
| JP | 2013-116975 A | 6/2013 |
| JP | 2013-533604 | 8/2013 |
| JP | 2014-022666 A | 2/2014 |
| JP | 2014-045179 A | 3/2014 |
| JP | 2017-195389 A | 10/2017 |
| JP | 2019-087743 A | 6/2019 |
| KR | 2010-0027073 A | 3/2010 |
| KR | 2011-0099645 A | 9/2011 |
| KR | 2011-0122051 A | 11/2011 |
| KR | 2013-0139996 A | 12/2013 |
| KR | 2014-0015385 A | 2/2014 |
| TW | 201136931 | 11/2011 |
| TW | 201248965 | 12/2012 |
| WO | WO-2000/070655 | 11/2000 |
| WO | WO-2001/091203 | 11/2001 |
| WO | WO-2003/059015 | 7/2003 |
| WO | WO-2006/033857 | 3/2006 |
| WO | WO-2010/027004 | 3/2010 |
| WO | WO-2010/084729 | 7/2010 |
| WO | WO-2011/070963 | 6/2011 |
| WO | WO-2011/139055 | 11/2011 |
| WO | WO-2012/050002 | 4/2012 |
| WO | WO-2012/099219 | 7/2012 |
| WO | WO-2012/133188 | 10/2012 |
| WO | WO-2013/081088 | 6/2013 |
| WO | WO-2013/180241 | 12/2013 |
| WO | WO-2014/189122 | 11/2014 |
| WO | WO-2019/087003 | 5/2019 |

OTHER PUBLICATIONS

Baldo.M et al., "Highly Efficient Phosphorescent Emission From Organic Electroluminescent Devices", Nature, Sep. 10, 1998, vol. 395, pp. 151-154.
Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Gu.G et al., "Transparent Organic Light Emitting Devices", Appl. Phys. Lett. (Applied Physics Letters), May 6, 1996, vol. 68, No. 19, pp. 2606-2608.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.
Baldo.M et al., "Prospects for Electrically Pumped Organic Lasers", Phys. Rev. B (Physical Review. B), Jul. 19, 2002, vol. 66, p. 035321-1-035321-16.
Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.
Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.
Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.
Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.
Yoshida.K et al., "High efficiency reverse intersystem crossing of exciplex states", THE 71st Autumn Meeting of the Japan Society of Applied Physics and Related Societies, 2010, p. 319, The Japan Society of Applied Physics.
Goushi.K et al., "Delayed fluorescence organic light-emitting diodes based on exciplex", The 59th Spring Meeting of the Japan Society of Applied Physics and Related Societies Preliminary Drafts, 2012, p. 251.
Nakagawa.T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.
Yokoyama.D et al., "Dual efficiency enhancement by delayed fluorescence and dipole orientation in high-efficiency fluorescent organic light-emitting diodes", Appl. Phys. Lett. (Applied Physics Letters), Sep. 22, 2011, vol. 99, No. 12, pp. 123303-1-123303-4, AIP Publishing.
Mehes.G et al., "Thermally Activated Delayed Fluorescence and its Application for OLED", The 2nd Phoenics International Symposium, Mar. 5, 2012.
Yang.C et al., "Excited State Luminescence of Multi-(5-phenyl-1,3,4-oxadiazo-2-yl)benzenes in an Electron-Donating Matrix: Exciplex or Electroplex?", J. Phys. Chem. B (The Journal of Physical Chemistry B), Dec. 29, 2009, vol. 114, No. 2, pp. 756-768.
Chinese Office Action (Application No. 201310333077.6) Dated Jul. 5, 2016.
Goushi.K et al., "Delayed fluorescence by reverse intersystem crossing and application to organic light-emitting diodes", Cleo Technical Digest (2012 Conference on Lasers and Electro-Optics (CLEO)), May 1, 2012, pp. 1-2pages, IEEE.
Taiwanese Office Action (Application No. 102126105) Dated Nov. 17, 2016.
Chinese Office Action (Application No. 201310333077.6) Dated Mar. 20, 2017.

(56) References Cited

OTHER PUBLICATIONS

Taiwanese Office Action (Application No. 102126105) Dated Apr. 12, 2017.
Yersin.H et al., Highly Efficient OLEDs with Phosphorescent Materials, 2008, pp. 1-97,283-309, Wiley-VCH Verlag Gmbh & Co.
Tokito.S et al., "Improvement in performance by doping", Organic EL Display, Aug. 20, 2004, pp. 67-99, Ohmsha.
Jeon.W et al., "Ideal host and guest system in phosphorescent OLEDs", Organic Electronics, 2009, vol. 10, pp. 240-246, Elsevier.
SU.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.
Rausch.A et al., "Matrix Effects on the Triplet State of the OLED Emitter Ir(4,6-dFppy)2(pic)(Flrpic):Investigations by High-Resolution Optical Spectroscopy", Inorg. Chem. (Inorganic Chemistry), 2009, vol. 48, No. 5, pp. 1928-1937.
Gong.X et al., "Phosphorescence from iridium complexes doped into polymer blends", J. Appl. Phys. (Journal of Applied Physics), Feb. 1, 2004, vol. 95, No. 3, pp. 948-953.
Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.
Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794, The Japan Society of Applied Physics.
Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, p. 12971-12979.
Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy On Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.
Park. Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.
Goushi.K et al., "Efficient organic light-emitting diodes through up-conversion from triplet to singlet excited states of exciplexes", Appl. Phys. Lett. (Applied Physics Letters), Jul. 12, 2012, vol. 101, No. 2, pp. 023306-1-023306-4.
Korean Office Action (Application No. 2013-0091374) Dated Jun. 30, 2018.
Goushi.K et al., "High reverse intersystem crossing efficiency using exciplex formation", Materials Research Society(MRS), Nov. 29, 2010.
Chinese Office Action (Application No. 201710710202.9) Dated Sep. 27, 2018.
Chinese Office Action (Application No. 201710710105.X) Dated Sep. 27, 2018.
Seo.S et al., "Exciplex-triplet energy transfer: A new method to achieve extremely efficient organic light-emitting diode with external quantum efficiency over 30% and drive voltage below 3V", Jpn. J. Appl. Phys. (Japanese Journal of Applied Physics), Mar. 17, 2014, vol. 53, No. 4, pp. 042102-1-042102-8, The Japan Society of Applied Physics.
Song.W et al., "Light emission mechanism of mixed host organic light-emitting diodes", Appl. Phys. Lett. (Applied Physics Letters), Mar. 1, 2015, vol. 106, No. 12, p. 123306-1-123306-4.
Tris[2-phenylpyridinato-C2, N]iridium(III), https://www.sigmaaldrich.com/catalog/product/aldrich/688096?lang=de&region=DE.
Organic Light-emitting Materials and Devices, 2007, pp. 330-334, Taylor & Francis Group.
Rho.H et al., "Synthesis and Photophysical Studies of Iridium Complexes Having Different Ligands", Jpn. J. Appl. Phys. (Japanese Journal of Applied Physics), Jan. 20, 2006, vol. 45, No. 1B, pp. 568-573, The Japan Society of Applied Physics.
Negres.R et al., "Origin of efficient light emission from a phosphorescent polymer/organometallic guest-host system", Phys. Rev. B (Physical Review. B), Sep. 29, 2003, vol. 68, No. 11, pp. 115209-1-115209-8.
Gong.X et al., "High-Efficiency Polymer-Based Electrophosphorescent Devices", Adv. Mater. (Advanced Materials), Apr. 18, 2002, vol. 14, No. 8, pp. 581-585.
Hamed.Z et al., "Fluorescence quenching in PVK:ZnSe nanocomposite structure", Synthetic Metals, Jun. 12, 2014, vol. 195, pp. 102-109.
Holzer.W et al., "Absorption and emission spectroscopic characterization of Ir(ppy)3", Chemical Physics, 2005, vol. 308, No. 1-2, pp. 93-102.
Tamayo.A et al., "Synthesis and Characterization of Facial and Meridional Tris-cyclometalated Iridium (III) Complexes", J. Am. Chem. Soc. (Journal of the American Chemical Society), Jun. 18, 2003, vol. 125, No. 24, pp. 7377-7387.
Okada.S et al., "Substituent effects of iridium complexes for highly efficient red OLEDs", Dalton Transactions, May 5, 2005, No. 9, pp. 1583-1590.
Notice of Opposition (Patent number. German Patent No. 112012000831) Dated Jun. 4, 2018.
Notice of Opposition (Patent number. German Patent No. 112012000828) Dated Jun. 8, 2018.
Notice of Opposition (Patent number. German Patent No. 112012001364) Dated Jun. 27, 2018.
Petition for Cancellation of Patent (Patent number. Korean Patent No. 10-1793880-00-00) Dated May 24, 2018.
Petition for Cancellation of Patent (Patent number. Korean Patent No. 10-1812673-00-00) Dated Jul. 6, 2018.
Written Opposition To the Grant of Patent (Patent number. Japanese Patent No. 5981726) Dated Feb. 28, 2017.
Goushi.K et al., "Organic light-emitting diodes employing efficient reverse intersystem crossing for triplet-to-singlet state conversion", Nature Photonics, Mar. 11, 2012, vol. 6, pp. 253-258, Nature Publishing Group.
Claims from U.S. Appl. No. 15/946,094 (Year:2018).
Chinese Office Action (Application No. 201710710202.9) Dated Feb. 2, 2021.
Wang.Q et al., "Harvesting Excitons Via Two Parallel Channels for Efficient White Organic LEDs with Nearly 100% Internal Quantum Efficiency: Fabrication and Emission-Mechanism Analysis", Adv. Funct. Mater. (Advanced Functional Materials), 2009, vol. 19, No. 1, pp. 84-95.
Yang.S et al., "White light generation combining emissions from exciplex, excimer and electromer in TAPC-based organic light-emitting diodes", Chem. Phys. Lett. (Chemical Physics Letters), 2009, vol. 484, pp. 54-58.

* cited by examiner

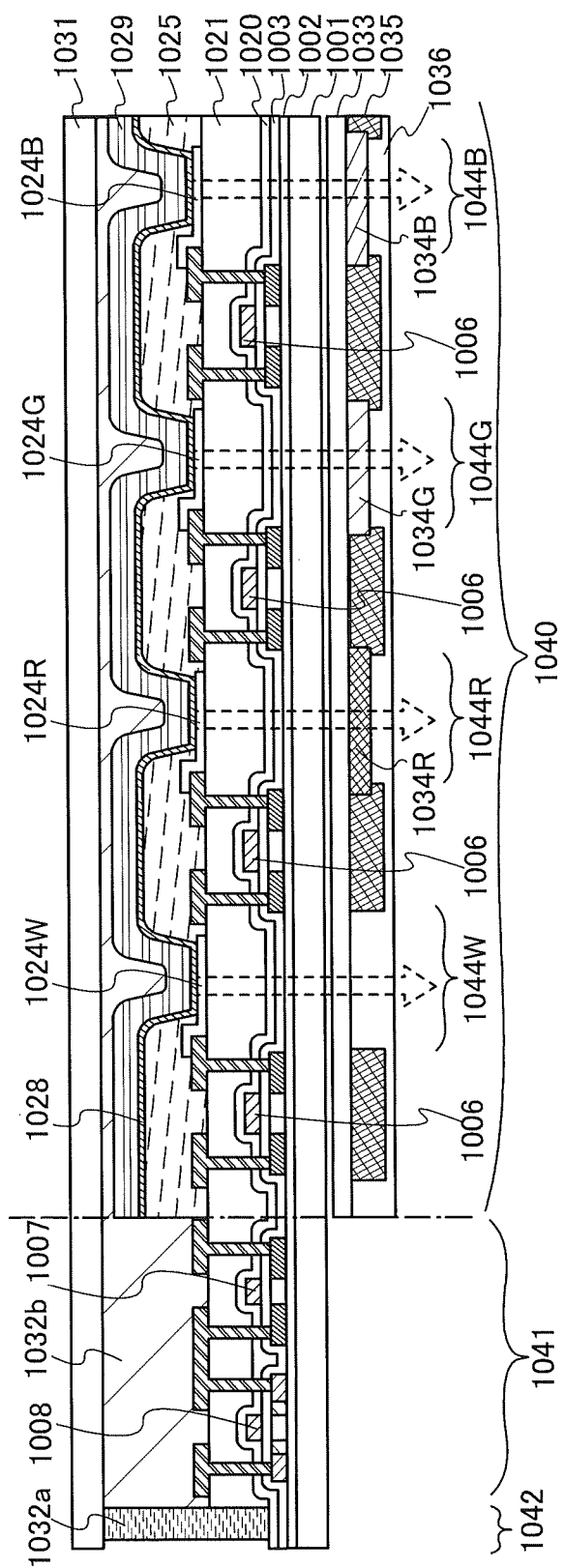
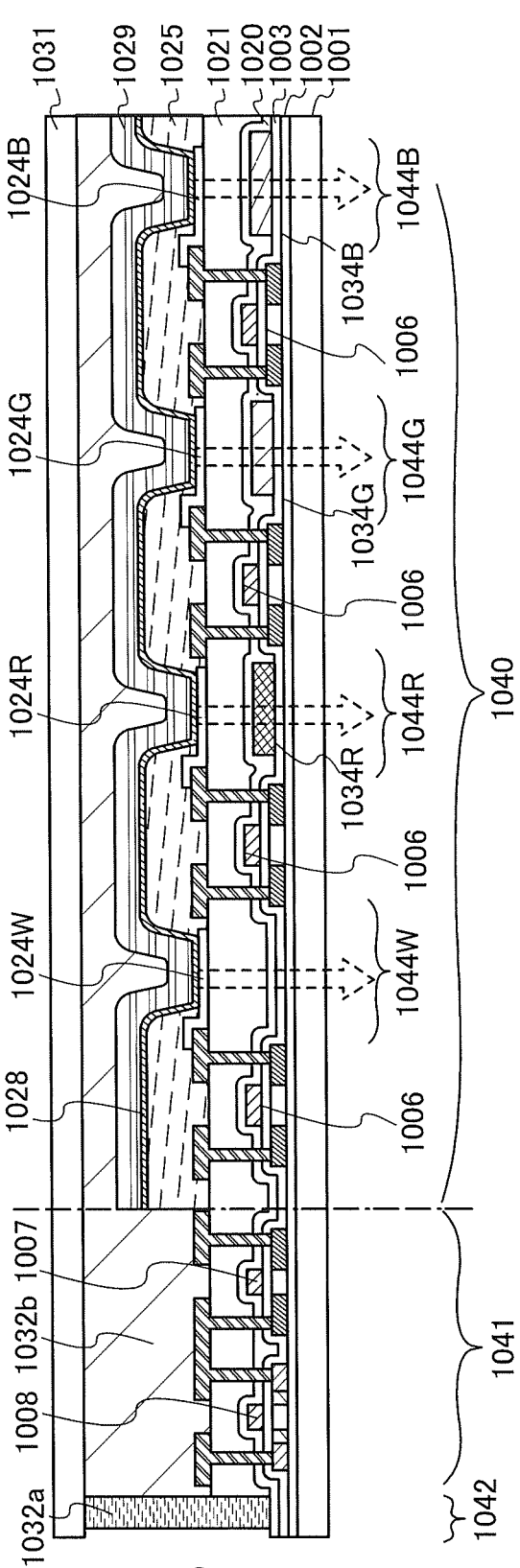

LIGHT-EMITTING ELEMENT

CROSS-REFERENCE TO RELATED APPLICATIONS

This application is a continuation of U.S. application Ser. No. 17/829,498, filed Jun. 1, 2022, now allowed, which is a continuation of U.S. application Ser. No. 16/944,257, filed Jul. 31, 2020, now U.S. Pat. No. 11,355,722, which is a continuation of U.S. application Ser. No. 16/412,529, filed May 15, 2019, now U.S. Pat. No. 10,734,594, which is a continuation of U.S. application Ser. No. 15/946,094, filed Apr. 5, 2018, now U.S. Pat. No. 10,644,254, which is a continuation of U.S. application Ser. No. 15/412,515, filed Jan. 23, 2017, now U.S. Pat. No. 9,947,885, which is a continuation of U.S. application Ser. No. 15/051,910, filed Feb. 24, 2016, now U.S. Pat. No. 9,559,313, which is a continuation of U.S. application Ser. No. 13/957,612, filed Aug. 2, 2013, now U.S. Pat. No. 9,276,228, which claims the benefit of a foreign priority application filed in Japan as Serial No. 2012-172830 on Aug. 3, 2012, all of which are incorporated by reference.

FIELD OF THE INVENTION

The present invention relates to a light-emitting element which includes an organic compound as a light-emitting substance.

DESCRIPTION OF THE RELATED ART

In recent years, research and development have been extensively conducted on light-emitting elements using electroluminescence (EL). In a basic structure of such a light-emitting element, a layer containing a light-emitting substance (an EL layer) is interposed between a pair of electrodes. By applying voltage to this element, light emission from the light-emitting substance can be obtained.

Since such a light-emitting element is of self-light-emitting type, the light-emitting element has advantages over a liquid crystal display in that visibility of pixels is high, backlight is not required, and so on and is therefore suitable as flat panel display elements. In addition, it is also a great advantage that a display including such a light-emitting element can be manufactured as a thin and lightweight display. Furthermore, very high speed response is also one of the features of such an element.

Since a light-emitting layer of such a light-emitting element can be formed in the form of a film, planar light emission can be achieved. Therefore, large-area light sources can be easily formed. This feature is difficult to obtain with point light sources typified by incandescent lamps and LEDs or linear light sources typified by fluorescent lamps. Thus, light-emitting elements also have great potential as planar light sources which can be applied to lighting devices and the like.

In the case of an organic EL element in which an organic compound is used as the light-emitting substance and an EL layer containing the light-emitting substance is provided between a pair of electrodes, application of a voltage between the pair of electrodes causes injection of electrons from the cathode and holes from the anode into the EL layer having a light-emitting property, and thus a current flows. By recombination of the injected electrons and holes, the organic compound having a light-emitting property is put in an excited state to provide light emission.

The excited state of an organic compound can be a singlet excited state or a triplet excited state, and light emission from the singlet excited state ($S_1$) is referred to as fluorescence, and light emission from the triplet excited state ($T_1$) is referred to as phosphorescence. The statistical generation ratio of the excited states in the light-emitting element is considered to be $S_1:T_1=1:3$. Therefore, a light-emitting element including a phosphorescent compound capable of converting the triplet excited state into light emission has been actively developed in recent years.

However, most phosphorescent compounds currently available are complexes containing a rare metal such as iridium as a central metal, which raises concern about the cost and the stability of supply.

Therefore, as materials which do not contain a rare metal and can convert part of a triplet excited state into light emission, materials emitting delayed fluorescence have been studied. In the materials emitting delayed fluorescence, a singlet excited state is generated from a triplet excited state by reverse intersystem crossing, and the singlet excited state is converted into light emission.

Patent Documents 1 and 2 disclose a material emitting thermally activated delayed fluorescence (TADF).

REFERENCE

Patent Document

[Patent Document 1] Japanese Published Patent Application No. 2004-241374
[Patent Document 2] Japanese Published Patent Application No. 2006-24830

SUMMARY OF THE INVENTION

In order to increase the luminous efficiency of the light-emitting element, it is important not only to generate a singlet excited state from a triplet excited state but also to obtain light emission efficiently from the singlet excited state, that is, to increase the fluorescence quantum efficiency. Thus, in a structure in the above patent document 1 or the like, in order to further increase the luminous efficiency, a material which emits TADF and has high fluorescence quantum yield is needed; however, it is very difficult to make such a material which satisfies the two conditions at the same time.

In view of the above, an object of one embodiment of the present invention is to provide a light-emitting element having higher luminous efficiency in which a material which emits fluorescence (hereinafter, referred to as a fluorescent material) is used as a light-emitting substance.

In order to achieve the object, one embodiment of the present invention includes a material for generating a singlet excited state from a triplet excited state and another material for obtaining light emission efficiently from the singlet excited state.

Specifically, for a light-emitting layer, a material which can generate a singlet excited state from a triplet excited state and another material which can obtain light emission efficiently from the singlet excited state are mixed to be used.

As the material which can generate a singlet excited state from a triplet excited state, a thermally activated delayed fluorescent substance is used.

In this specification and the like, a thermally activated delayed fluorescent substance is a material which can generate a singlet excited state from a triplet excited state by reverse intersystem crossing and thermal activation. The thermally activated delayed fluorescent substance may include a material which can generate a singlet excited state by itself from a triplet excited state by reverse intersystem crossing, for example, a material which emits TADF. Alternatively, the thermally activated delayed fluorescent substance may include a combination of two kinds of materials which form an exciplex.

It also can be said that the thermally activated delayed fluorescent substance is a material of which a triplet excited state is close to a singlet excited state. Specifically, a material in which the difference between the levels of the triplet excited state and the singlet excited state is 0.2 eV or less is preferably used. That is, it is preferable that the difference between the levels of the triplet excited state and the singlet excited state be 0.2 eV or less in a material which can generate a singlet excited state by itself from a triplet excited state by reverse intersystem crossing, for example, a material which emits TADF, or it is preferable that the difference between the levels of the triplet excited state and the singlet excited state be 0.2 eV or less in an exciplex.

As a material which can obtain light emission efficiently from the singlet excited state, a known fluorescent material is used. In particular, a material having high fluorescence quantum yield, for example, a material whose fluorescence quantum yield is 50% or more, is preferably used.

As described above, one embodiment of the present invention provides a light-emitting element in which a thermally activated delayed fluorescent substance is used for an energy donor and a fluorescent material is used for an energy acceptor. With such a structure, by making the emission spectrum of the thermally activated delayed fluorescent substance overlap with an absorption band on the longest wavelength side in absorption by the fluorescent material in a singlet excited state, energy of a singlet excited state of the thermally activated delayed fluorescent substance can be transferred to the singlet excited state of the fluorescent material. Alternatively, it is also possible that a singlet excited state of the thermally activated delayed fluorescent substance is generated from part of the energy of a triplet excited state of the thermally activated delayed fluorescent substance, and is transferred to the singlet excited state of the fluorescent material.

For example, in the case of a structure using a material which emits TADF for an energy acceptor, a material which emits TADF and has high fluorescence quantum yield is needed in order to increase luminous efficiency. However, with the above-described structure in which a thermally activated delayed fluorescent substance is used for an energy donor, a material having high fluorescence quantum yield can be selected for an energy acceptor with or without TADF.

Thus, the singlet excited state of the thermally activated delayed fluorescent substance and the singlet excited state of the thermally activated delayed fluorescent substance which is generated from part of the energy of the triplet excited state of the thermally activated delayed fluorescent substance can be converted into light emission more efficiently through the singlet excited state of the fluorescent material. Accordingly, a light-emitting element having high luminous efficiency can be formed.

One embodiment of the present invention is a light-emitting element which includes a pair of electrodes and an EL layer sandwiched between the pair of electrodes. The EL layer includes at least a light-emitting layer. The light-emitting layer includes at least a thermally activated delayed fluorescent substance and a fluorescent material.

In the above light-emitting element, it is preferable that the thermally activated delayed fluorescent substance include a first organic compound and a second organic compound which form an exciplex.

In the above light-emitting element, it is preferable that light emission of the thermally activated delayed fluorescent substance be overlapped with an absorption band on the lowest energy side of the fluorescent material.

In the above light-emitting element, it is preferable that the difference in equivalent energy value between the peak wavelength in the absorption band on the lowest energy side of the fluorescent material and the peak wavelength of light emission of the thermally activated delayed fluorescent substance be 0.2 eV or less.

In the above light-emitting element, it is preferable that the difference between the peak wavelength of light emission of the thermally activated delayed fluorescent substance and the peak wavelength of light emission of the fluorescent material be 30 nm or less.

In the above light-emitting element, it is preferable that one of the first organic compound and the second organic compound be a material having an electron-transport property and the other be a material having a hole-transport property.

In the above light-emitting element, it is preferable that one of the first organic compound and the second organic compound be a π-electron deficient heteroaromatic compound and the other be a π-electron rich heteroaromatic compound or an aromatic amine compound.

According to one embodiment of the present invention, in a light-emitting element using a fluorescent material as a light-emitting substance, higher luminous efficiency can be obtained.

BRIEF DESCRIPTION OF THE DRAWINGS

FIGS. 5A and 5B are schematic diagrams of active matrix light-emitting devices.

DETAILED DESCRIPTION OF THE INVENTION

Figure 1A:
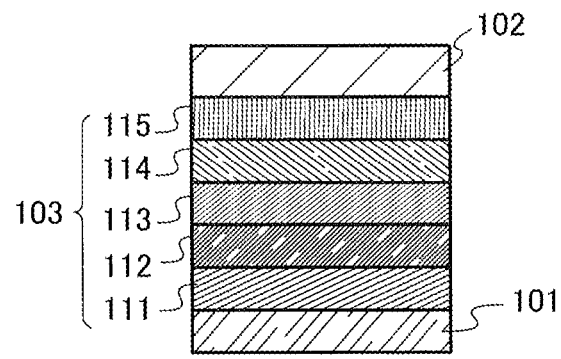
FIGS. 1A to 1C are conceptual diagrams of light-emitting elements.

Embodiments of the present invention are described below with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments.

Embodiment 1

In a light-emitting element in which a thermally activated delayed fluorescent substance and a fluorescent material are mixed to be used, light emission occurs through the following energetic process.

(1) where an electron and a hole are recombined in a fluorescent material, and the fluorescent material is excited (direct recombination process)

(1-1) where the fluorescent material emits fluorescence when the excited state of the fluorescent material is a singlet excited state (1-2) where thermal deactivation occurs when the excited state of the fluorescent material is a triplet excited state In the direct recombination process in (1), when the fluorescence quantum efficiency is high, high luminous efficiency can be obtained. The level of the singlet excited state of the thermally activated delayed fluorescent substance is preferably higher than the level of the singlet excited state of the fluorescent material.

(2) where an electron and a hole are recombined in a thermally activated delayed fluorescent substance and the thermally activated delayed fluorescent substance is put in an excited state (energy transfer process)

(2-1) when the excited state of the thermally activated delayed fluorescent substance is a singlet excited state In the case where the level of the singlet excited state of the thermally activated delayed fluorescent substance is higher than the level of the singlet excited state of the fluorescent material, excitation energy is transferred from the thermally activated delayed fluorescent substance to the fluorescent material, and thus, the fluorescent material is put in a singlet excited state. The fluorescent material in the singlet excited state emits fluorescence. Note that since direct transition of the fluorescent material from a singlet ground state to a triplet excited state is forbidden, energy transfer from the level of the singlet excited state of the thermally activated delayed fluorescent substance to the level of the triplet excited state of the fluorescent material is unlikely to be a main energy transfer process; therefore, a description thereof is omitted here. In other words, energy transfer from the thermally activated delayed fluorescent substance in the singlet excited state ($^1H^*$) to the fluorescent material in the singlet excited state ($^1G^*$) is important as represented by Formula (2-1) below (where $^1G$ represents the singlet ground state of the fluorescent material and $^1H$ represents the singlet ground state of the thermally activated delayed fluorescent substance).

$$^1H^* + {}^1G \rightarrow {}^1H + {}^1G^* \qquad (2\text{-}1)$$

(2-2) when the excited state of the thermally activated delayed fluorescent substance is a triplet excited state In the case where the level of the singlet excited state of the thermally activated delayed fluorescent substance is higher than the level of the singlet excited state of the fluorescent material, light is emitted through the following steps. First, excitation energy is transferred from the level of the triplet excited state of the thermally activated delayed fluorescent substance to the level of the singlet excited state of the thermally activated delayed fluorescent substance by reverse intersystem crossing. Then, the excitation energy is transferred from the level of the singlet excited state of the thermally activated delayed fluorescent substance to the level of the singlet excited state of the fluorescent material, so that the fluorescent material is brought into the singlet excited state. The fluorescent material in the singlet excited state emits fluorescence.

In other words, as in Formula (2-2) below, the singlet excited state ($^1H^*$) of the thermally activated delayed fluorescent substance is generated from the triplet excited state ($^3H^*$) of the thermally activated delayed fluorescent substance by reverse intersystem crossing, and then energy is transferred to the singlet excited state ($^1G^*$) of the fluorescent material.

$$^3H^* + {}^1G \rightarrow \text{(reverse intersystem crossing)} \rightarrow {}^1H^* + {}^1G \rightarrow {}^1H + {}^1G^* \quad (2\text{-}2)$$

When all the energy transfer processes described above in (2) occur efficiently, both the triplet excitation energy and the singlet excitation energy of the thermally activated delayed fluorescent substance are efficiently converted into the singlet excited state ($^1G^*$) of the fluorescent material. Thus, high-efficiency light emission is possible. In contrast, before the excitation energy of the thermally activated delayed fluorescent substance is transferred to the fluorescent material, when the thermally activated delayed fluorescent substance itself is deactivated by emitting the excitation energy as light or heat, the luminous efficiency is decreased.

Next, factors controlling the above-described processes of intermolecular energy transfer between the thermally activated delayed fluorescent substance and the fluorescent material are described. As mechanisms of the intermolecular energy transfer, two mechanisms, i.e., Förster mechanism and Dexter mechanism, have been proposed.

In Förster mechanism (dipole-dipole interaction), energy transfer does not require direct contact between molecules and energy is transferred through a resonant phenomenon of dipolar oscillation between a thermally activated delayed fluorescent substance and a fluorescent material. By the resonant phenomenon of dipolar oscillation, the thermally activated delayed fluorescent substance provides energy to the fluorescent material, and thus, the thermally activated delayed fluorescent substance is put in a ground state and the fluorescent material is put in an excited state. Note that the rate constant $k_{h^* \rightarrow g}$ of Förster mechanism is expressed by Formula (1).

[Formula 1]

$$k_{h^* \rightarrow g} = \frac{9000c^4 K^2 \phi \ln 10}{128\pi^5 n^4 N \tau R^6} \int \frac{f'_h(v)\varepsilon_g(v)}{v^4} dv \quad (1)$$

In Formula (1), $v$ denotes a frequency, $f'_h(v)$ denotes a normalized emission spectrum of a thermally activated delayed fluorescent substance (a fluorescent spectrum in energy transfer from a singlet excited state, and a phosphorescent spectrum in energy transfer from a triplet excited state), $\varepsilon_g(v)$ denotes a molar absorption coefficient of a fluorescent material, N denotes Avogadro's number, n denotes a refractive index of a medium, R denotes an intermolecular distance between the thermally activated delayed fluorescent substance and the fluorescent material, $\tau$ denotes a measured lifetime of an excited state (fluorescence lifetime or phosphorescence lifetime), $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the thermally activated delayed fluorescent substance and the fluorescent material. Note that $K^2 = 2/3$ in random orientation.

In Dexter mechanism (electron exchange interaction), a thermally activated delayed fluorescent substance and a fluorescent material are close to a contact effective range where their orbitals overlap, and the thermally activated delayed fluorescent substance in an excited state and the fluorescent material in a ground state exchange their electrons, which leads to energy transfer. Note that the rate constant $k_{h^* \rightarrow g}$ of Dexter mechanism is expressed by Formula (2).

[Formula 2]

$$k_{h^* \rightarrow g} = \left(\frac{2\pi}{h}\right) K^2 \exp\left(-\frac{2R}{L}\right) \int f'_h(v) \varepsilon'_g(v) dv \quad (2)$$

In Formula (2), h denotes a Planck constant, K denotes a constant having an energy dimension, $v$ denotes a frequency, $f'_h(v)$ denotes a normalized emission spectrum of a thermally activated delayed fluorescent substance (a fluorescent spectrum in energy transfer from a singlet excited state, and a phosphorescent spectrum in energy transfer from a triplet excited state), $\varepsilon'_g(v)$ denotes a normalized absorption spectrum of a fluorescent material, L denotes an effective molecular radius, and R denotes an intermolecular distance between the thermally activated delayed fluorescent substance and the fluorescent material.

Here, the energy transfer efficiency $\Phi_{ET}$ from the thermally activated delayed fluorescent substance to the fluorescent material is thought to be expressed by Formula (3). In the formula, $k_r$ denotes a rate constant of a light-emission process (fluorescence in energy transfer from a singlet excited state, and phosphorescence in energy transfer from a triplet excited state) of a thermally activated delayed fluorescent substance, $k_n$ denotes a rate constant of a non-light-emission process (thermal deactivation or intersystem crossing) of a thermally activated delayed fluorescent substance, and $\tau$ denotes a measured lifetime of an excited state of a thermally activated delayed fluorescent substance.

[Formula 3]

$$\Phi_{ET} = \frac{k_{h^* \rightarrow g}}{k_r + k_n + k_{h^* \rightarrow g}} = \frac{k_{h^* \rightarrow g}}{\left(\frac{1}{\tau}\right) + k_{h^* \rightarrow g}} \quad (3)$$

According to Formula (3), it is found that the energy transfer efficiency $\Phi_{ET}$ can be increased by increasing the rate constant $k_{h^* \rightarrow g}$ of energy transfer so that another competing rate constant $k_r + k_n (=1/\tau)$ becomes relatively small.

In both the energy transfer processes of (2-1) and (2-2), since energy is transferred from the singlet excited state ($^1H^*$) of the thermally activated delayed fluorescent substance to the fluorescent material, energy transfers by both Förster mechanism (Formula (1)) and Dexter mechanism (Formula (2)) are possible.

First, an energy transfer by Förster mechanism is considered. When $\tau$ is eliminated from Formula (1) and Formula (3), it can be said that the energy transfer efficiency $\Phi_{ET}$ is higher when the quantum yield $\phi$ (here, a fluorescence quantum efficiency because energy transfer from a singlet excited state is discussed) is higher. However, in practice, a more important factor is that the emission spectrum of the thermally activated delayed fluorescent substance (here, a fluorescent spectrum because energy transfer from a singlet excited state is discussed) largely overlaps with the absorption spectrum of the fluorescent material (absorption corresponding to the transition from the singlet ground state to the singlet excited state) (note that it is preferable that the molar absorption coefficient of the fluorescent material be also high). This means that the fluorescent spectrum of the thermally activated delayed fluorescent substance overlaps with the absorption band on the longest wavelength side of the fluorescent material.

Next, an energy transfer by Dexter mechanism is considered. According to Formula (2), in order to increase the rate constant $k_{h^* \to g}$, it is preferable that an emission spectrum of a thermally activated delayed fluorescent substance (here, a fluorescent spectrum because energy transfer from a singlet excited state is discussed) largely overlap with an absorption spectrum of a fluorescent material (absorption corresponding to transition from a singlet ground state to a singlet excited state).

The above description suggests that in both the energy transfer processes of (2-1) and (2-2), the energy transfer efficiency can be optimized by making the emission spectrum of the thermally activated delayed fluorescent substance overlap with the absorption band on the longest wavelength side of the fluorescent material.

In order to increase the luminous efficiency of the light-emitting element, it is important that the thermally activated delayed fluorescent substance generates a singlet excited state from a triplet excited state and the fluorescent material has high fluorescence quantum yield.

However, it is very difficult to form a material which can generate a singlet excited state from a triplet excited state and has high fluorescence quantum yield.

It is preferable that the ratio of the energy transfer process of (2) be high and the ratio of the direct recombination process of (1) be low because the thermal deactivation process of (1-2) can be reduced. Thus, the concentration of the fluorescent material is preferably 5 wt % or lower, more preferably 1 wt % or lower.

Therefore, one embodiment of the present invention provides an effective technique which can overcome problems of the energy transfer efficiency from the thermally activated delayed fluorescent substance in the triplet excited state to the fluorescent material and the fluorescence quantum efficiency of the singlet excited state of the fluorescent material in the case where the fluorescent material is used as a light-emitting substance. Specific embodiments thereof are described below.

One embodiment of the present invention provides a light-emitting element in which a thermally activated delayed fluorescent substance is used as an energy donor capable of efficiently transferring energy to a fluorescent material. The thermally activated delayed fluorescent substance has a feature that its singlet and triplet excited states are close to each other. Thus, in the thermally activated delayed fluorescent substance, a triplet excited state is easily transferred to a singlet excited state. By making the emission spectrum of the thermally activated delayed fluorescent substance overlap with an absorption band on the longest wavelength side in absorption by the fluorescent material, i.e., an energy acceptor, in a singlet excited state (an absorption corresponding to the transition from the singlet ground state to the singlet excited state), it becomes possible to improve the energy transfer efficiency from the triplet excited state and the singlet excited state of the thermally activated delayed fluorescent substance to the singlet excited state of the fluorescent material.

In the case where a light-emitting substance includes a material for generating a singlet excited state from a triplet excited state and another material for obtaining light emission efficiently from the singlet excited state, a material having high fluorescence quantum yield, for example, a material whose fluorescence quantum yield is 50% or more, can be selected as the light-emitting substance with or without thermally activated delay.

Thus, the energy of the singlet excited state and the triplet excited state of the then tally activated delayed fluorescent substance can be converted into light emission more efficiently through the singlet excited state of the fluorescent material. Accordingly, a light-emitting element having high luminous efficiency can be formed.

Figure 2:
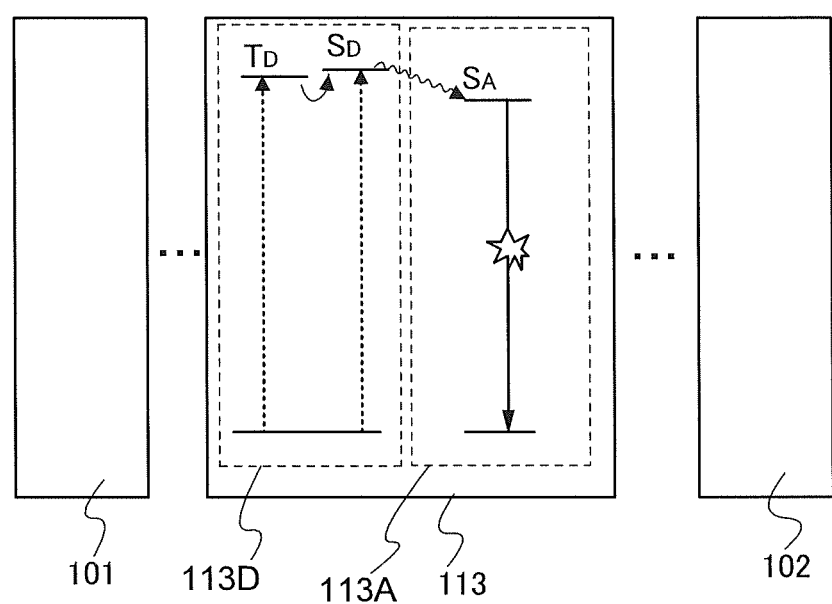
FIG. 2 illustrates energy transfer in a light-emitting layer.

In a light-emitting element having the above structure, energy transfer occurs efficiently as illustrated in FIG. 2. FIG. 2 shows that a light-emitting layer 113 is provided between an electrode 101 and an electrode 102. There may be a given layer between each electrode and the light-emitting layer 113. Energy is transferred from a singlet excited state $S_D$ of a thermally activated delayed fluorescent substance 113D to a singlet excited state $S_A$ of a light-emitting substance 113A. Further, a triplet excited state $T_D$ of the thermally activated delayed fluorescent substance 113D is changed to the singlet excited state $S_D$ of the thermally activated delayed fluorescent substance 113D by reverse intersystem crossing, and then energy is transferred to the singlet excited state $S_A$ of the light-emitting substance 113A. Then, the singlet excited state $S_A$ of the light-emitting substance 113A emits light. As described above, in the light-emitting element of one embodiment of the present invention, energy transfer and light emission are performed well by including a material for generating a singlet excited state from a triplet excited state and another material for obtaining light emission efficiently from the singlet excited state; thus, the light-emitting element can have high luminous efficiency.

Figure 1B:
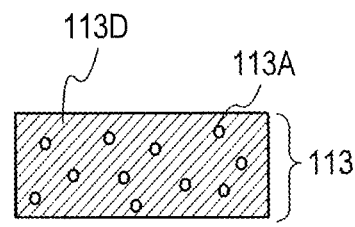
Figure 1C:
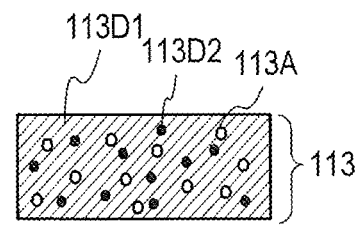

FIGS. 1A to 1C are schematic diagrams of the light-emitting element of this embodiment. FIG. 1A is a diagram of the light-emitting element, and FIGS. 1B and 1C are enlarged diagrams of only the light-emitting layer 113.

The light-emitting element includes an EL layer 103 between a pair of electrodes, the first electrode 101 and the second electrode 102, and the EL layer 103 contains an organic compound as a light-emitting substance. In addition, the EL layer includes the light-emitting layer 113, and the light-emitting substance is contained at least in the light-emitting layer 113. There is no limitation on layers other than the light-emitting layer 113, and any layer may be used as the other layers. A typical stacked-layer structure includes a hole-injection layer 111, a hole-transport layer 112, an electron-transport layer 114, an electron-injection layer 115, and the like. Besides, a carrier-blocking layer or the like may be provided, or a plurality of light-emitting layers may be provided.

The light-emitting layer 113 includes the thermally activated delayed fluorescent substance 113D and the light-emitting substance 113A. As illustrated in FIG. 1B, the thermally activated delayed fluorescent substance 113D may include a material which can generate a singlet excited state by itself from a triplet excited state by reverse intersystem crossing. The thermally activated delayed fluorescent substance 113D may include a plurality of materials. As illustrated in FIG. 1C, it is particularly preferable that the thermally activated delayed fluorescent substance 113D include two kinds of materials, which are a first organic compound 113D1 and a second organic compound 113D2 which form an exciplex. An exciplex has a small difference between the level of the singlet excited state and the level of the triplet excited state, and thus energy is easily transferred from the level of the triplet excited state to the level of the singlet excited state in the exciplex. Thus, the thermally activated delayed fluorescent substance formed using the combination of the first organic compound and the second organic compound which than an exciplex is suitable for the thermally activated delayed fluorescent substance of one embodiment of the present invention. Further, in terms of luminous efficiency and reliability, it is preferable to use a material having a hole-transport property as one of the first organic compound and the second organic compound and to use a material having an electron-transport property as the other because the carrier balance between holes and electrons in the light-emitting layer can be easily optimized by adjustment of the mixture ratio of the first organic compound and the second organic compound. Note that this does not exclude the possibility that the light-emitting layer 113 in the light-emitting element of this embodiment contains another substance.

In the thermally activated delayed fluorescent substance, the singlet excited state is close to the triplet excited state; in particular, the energy difference between the singlet excited state and the triplet excited state is preferably larger than or equal to 0 eV and smaller than or equal to 0.2 eV.

The thermally activated delayed fluorescent substance and the fluorescent material are preferably combined so that light emission of the thermally activated delayed fluorescent substance is overlapped with an absorption band on the longest wavelength side of the light-emitting substance 113A as described above. Accordingly, energy is efficiently transferred from the singlet excited state of the thermally activated delayed fluorescent substance to the singlet excited state of the fluorescent material.

As examples of a fluorescent material which can be used for the light-emitting substance 113A, the following can be given. Examples of the fluorescent substance are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N', N'',N'',N''',N'''-octaphenyldibenzo[g,p]chhrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N',N'-triphenyl-1,4-phenylenediamine (abbreviation: 2DPABPhA), 9,10-bis(1, 1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho [1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

The concentration of the fluorescent material in the light-emitting layer 113 is preferably 5 wt % or lower, more preferably 1 wt % or lower. With such a concentration, the ratio of the energy transfer process of (2) can be increased and the ratio of the direct recombination process of (1) can be decreased, so that the thermal deactivation process of (1-2) can be reduced.

In the case where the thermally activated delayed fluorescent substance is formed using one kind of material, the following can be used, for example.

First, a fullerene, a derivative thereof, an acridine derivative such as proflavine, and eosin can be given. Further, a metal-containing porphyrin, such as a porphyrin containing magnesium (Mg), zinc (Zn), cadmium (Cd), tin (Sn), platinum (Pt), indium (In), or palladium (Pd) can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$ (Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae.

[Chemical formula 1]
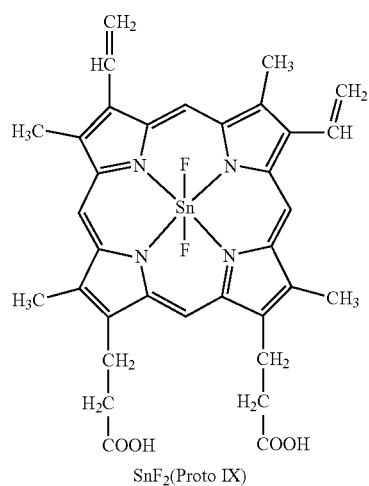
SnF$_2$(Proto IX)
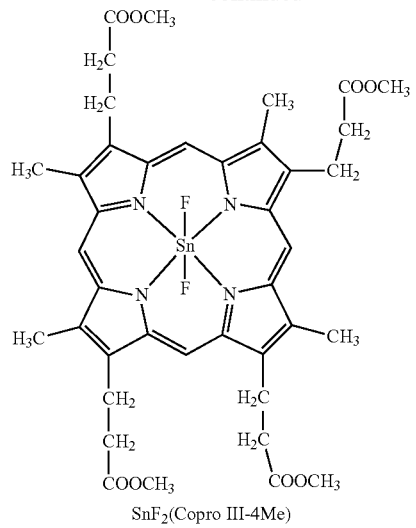
SnF$_2$(Copro III-4Me)
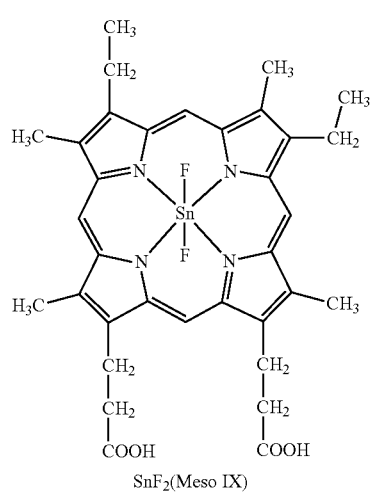
SnF$_2$(Meso IX)
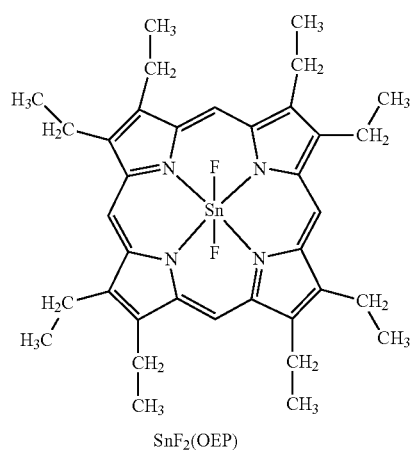
SnF$_2$(OEP)
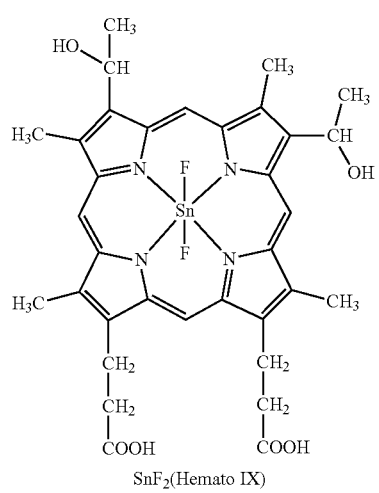
SnF$_2$(Hemato IX)
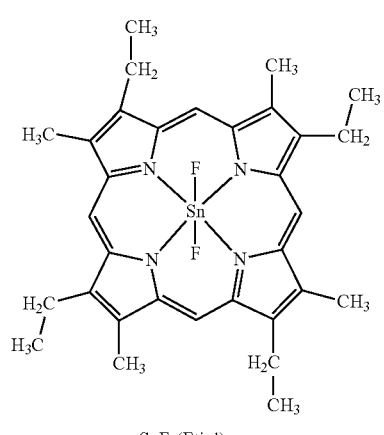
SnF$_2$(Etiol)

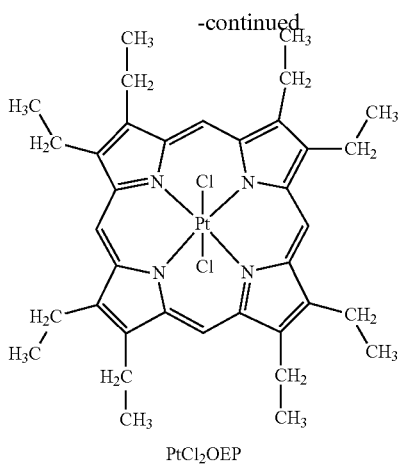

PtCl2OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]charbazol-11-yl)-1,3,5-triazine (PIC-TRZ) shown in the following structural formula, can be used as the thermally activated delayed fluorescent substance, which is formed using one kind of material. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the difference between the level of the singlet excited state and the level of the triplet excited state becomes small.

[Chemical formula 2]

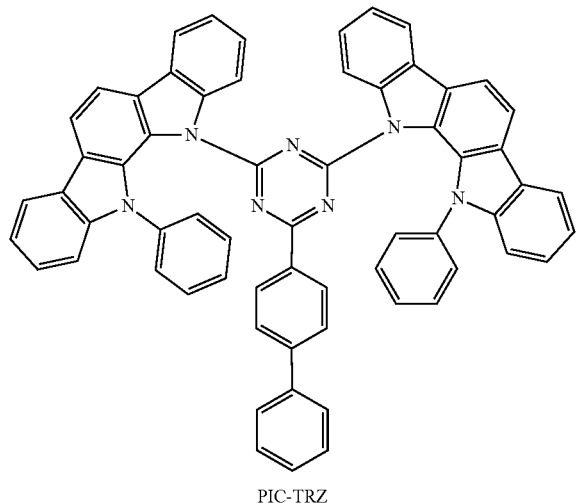

PIC-TRZ

As the thermally activated delayed fluorescent substance, two kinds of organic compounds, which are the first organic compound and the second organic compound which form an exciplex, can be used. In this case, a known carrier-transport material can be used as appropriate. In order to form an exciplex efficiently, it is particular preferable to combine a compound which easily accepts electrons (a compound having an electron-transport property) and a compound which easily accepts holes (a compound having a hole-transport property).

This is because the carrier balance between holes and electrons in the light-emitting layer can be easily optimized by the use of the combination of a material having an electron-transport property and a material having a hole-transport property as the thermally activated delayed fluorescent substance and by adjustment of the mixture ratio of the material having an electron-transport property and the material having a hole-transport property. The optimization of the carrier balance between holes and electrons in the light-emitting layer can prevent a region in which electrons and holes are recombined from existing on one side in the light-emitting layer. By preventing the region in which electrons and holes are recombined from existing to one side, the reliability of the light-emitting element can be improved.

As the compound which easily accepts electrons (the material having an electron-transport property), a π-electron deficient heteroaromatic compound, a metal complex, or the like can be used. Specific examples include a metal complex such as bis(10-hydroxybenzo [h]quinolinato)beryllium(II) (abbreviation: BeBq$_2$), bis(2-methyl-8-quinolinolato)(4-phenylphenolato)aluminum(III) (abbreviation: BAlq), bis (8-quinolinolato)zinc(II) (abbreviation: Znq), bis[2-(2-benzoxazolyl)phenolato]zinc(II) (abbreviation: ZnPBO), or bis [2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f h]quinoxaline (abbreviation: 2mCzBPDB q), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis [3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

As the compound which easily accepts holes (material having a hole-transport property), a π-electron rich heteroaromatic compound, an aromatic amine compound, or the like can be favorably used. Specific examples include a compound having an aromatic amine skeleton such as 2-[N-(9-phenylcarbazol-3-yl)-N-phenylamino]spiro-9,9'-bifluorene (abbreviation: PCASF), 4,4'-bis[N-(1-naphthyl)-N- phenylamino]biphenyl (abbreviation: NPB), N,N'-bis (3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), or N-phenyl-N-[4-(9-phenyl-9H-carbazol-3-yl)phenyl]-spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenyl-carbazole (abbreviation: CzTP), or 9-phenyl-9H-3-(9-phenyl-9H-carbazol-3-yl)carbazole (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

The first organic compound and the second organic compound are not limited to these examples, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other known materials may be used.

Note that in the case where a material having an electron-transport property and a material having a hole-transport property are used as the first organic compound and the second organic compound, carrier balance can be controlled by the mixture ratio of the compounds. Specifically, the ratio of the first organic compound to the second organic compound is preferably 1:9 to 9:1.

Here, compounds which form an exciplex (the first organic compound 113D1 and the second organic compound 113D2) and the exciplex are described in a little more detail.

Figure 10A:
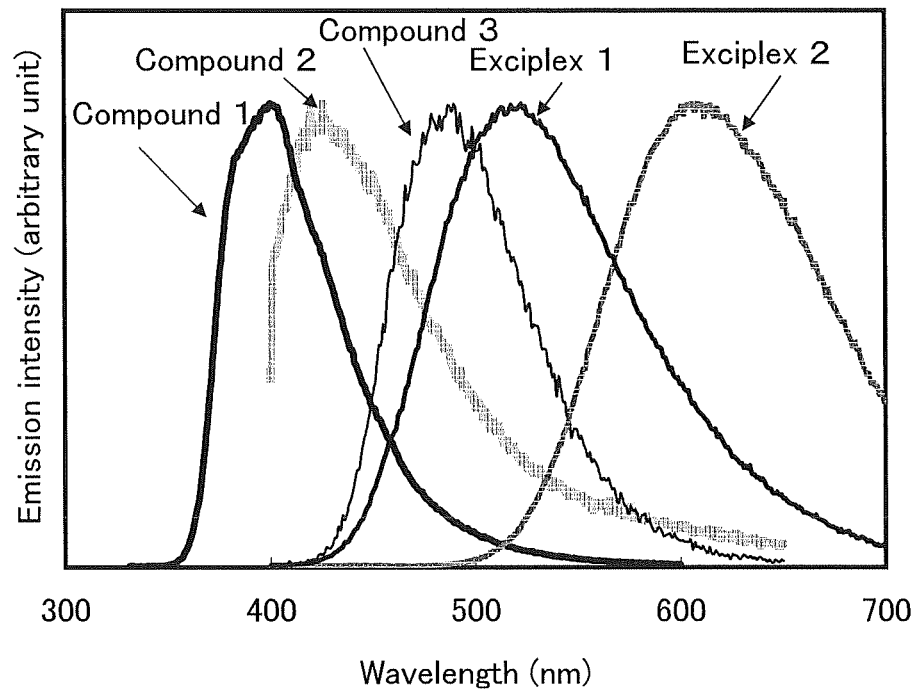
FIGS. 10A and 10B show emission wavelengths of exciplexes.
Figure 10B:
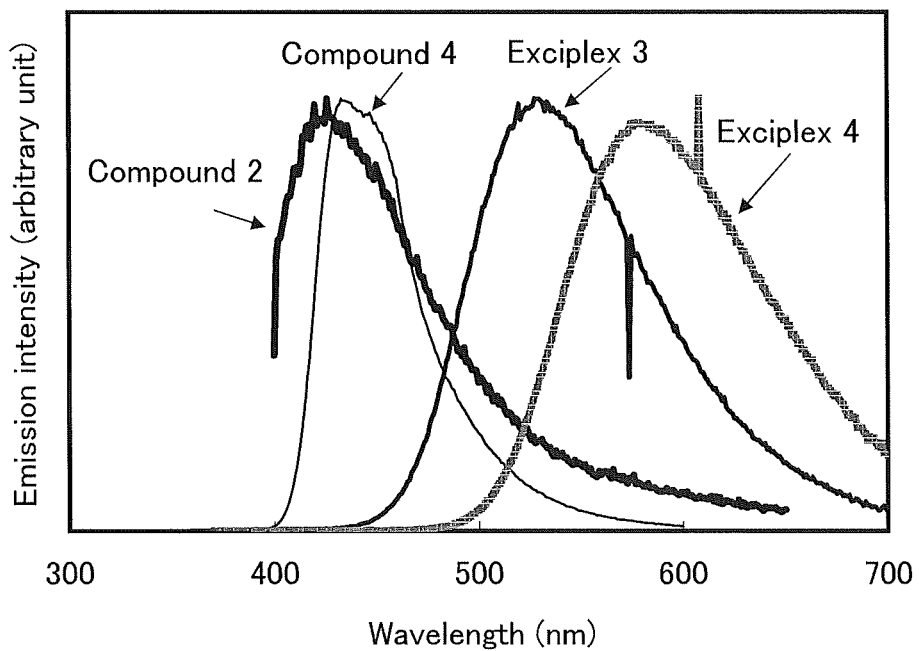
Figure 11:
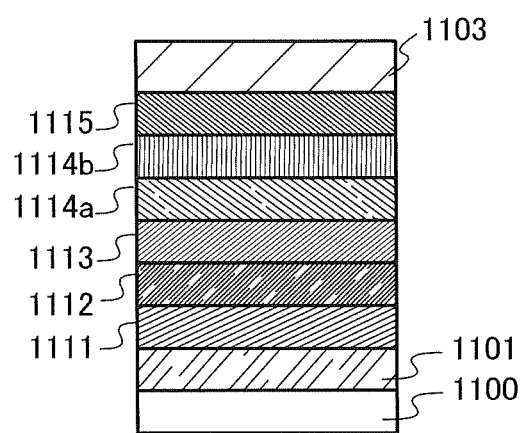
FIG. 11 shows a structure of a light-emitting element 1 and a comparison light-emitting element 1 of Example 1.

FIGS. 10A and 10B show emission spectra of four kinds of organic compounds and emission spectra of exciplexes formed using the organic compounds. Note that in the figures, a compound 1 is 2-[4-(dibenzothiophen-4-yl)phenyl]-1-phenyl-1H-benzimidazole (abbreviation: DBTBIm-II); a compound 2 is 2-[3-(dibenzothiophen-4-yl)phenyl]dibenzo[f,h]quinoxaline (abbreviation: 2mDBTPDBq-II); a compound 3 is 4,4',4''-tris[N-(1-naphthyl)-N-phenylamino]triphenylamine (abbreviation: 1'-TNATA); a compound 4 is 2,7-bis[N-(4-diphenylaminophenyl)-N-phenylamino]-spiro-9,9'-bifluorene (abbreviation: DPA2SF). An exciplex 1 is an exciplex of the compound 1 and the compound 3. An exciplex 2 is an exciplex of the compound 2 and the compound 3. An exciplex 3 is an exciplex of the compound 2 and 4,4'-bis[N-(1-naphthyl)-N-phenylamino]biphenyl (abbreviation: NPB). An exciplex 4 is an exciplex of the compound 2 and the compound 4.

Structural formulae of the compounds are shown below.

[Chemical formula 3]

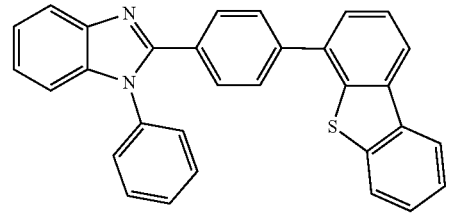

Compound 1:DBTBIm-II

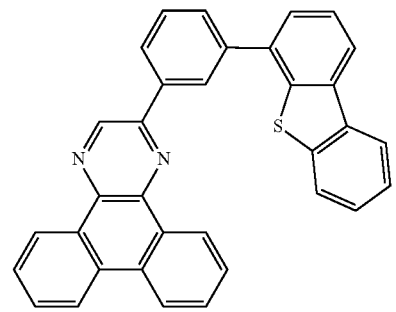

Compound 2:2mDBTPDBq-II

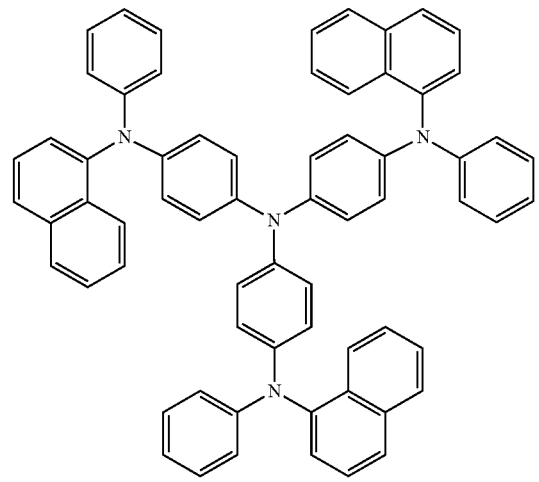

Compound 3:1'-TNATA

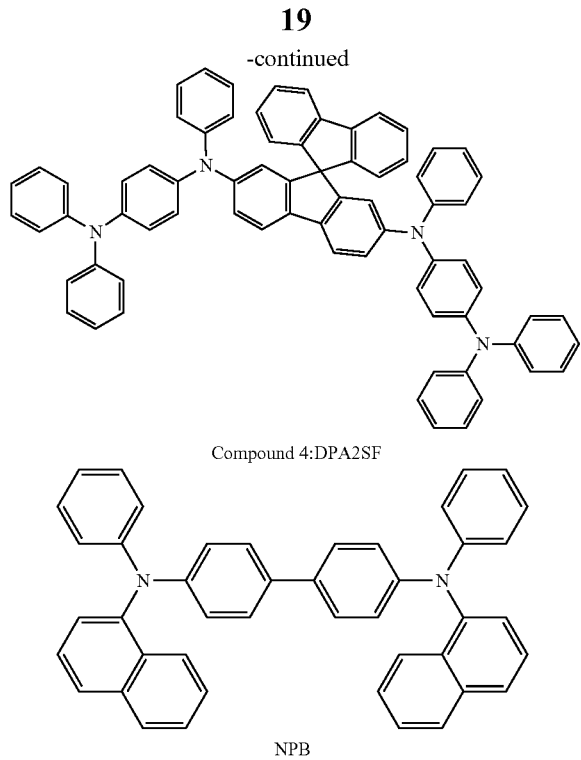

Compound 4:DPA2SF

NPB

FIG. 10A shows emission spectra of the exciplexes 1 and 2 and the compounds 1 to 3. The spectrum of the exciplex 1 is the result of measuring light emission of a material based on the compound 1 to which a slight amount of compound 3 is added, and the spectrum of the exciplex 2 is the result of measuring light emission of a material based on the compound 2 to which a slight amount of compound 3 is added. That is, in a sample used for measurement of the exciplex 1, one of the compounds 1 and 3 corresponds to the first organic compound 113D1, and the other corresponds to the second organic compound 113D2. In a sample used for measurement of the exciplex 2, one of the compounds 2 and 3 corresponds to the first organic compound 113D1, and the other corresponds to the second organic compound 113D2.

As can be seen from FIG. 10A, there is a difference of 100 nm or more between light emission of the exciplex 1 and light emission of the exciplex 2 even though both materials contain the compound 3 as a slight-amount component. This means that the emission wavelength of an exciplex can be easily adjusted by changing a base substance.

The peak wavelength of the emission spectrum of the exciplex 1 is approximately 520 nm, and thus the thermally activated delayed fluorescent substance containing the compound 1 and the compound 3 can be preferably used together with a material which emits blue-green to red fluorescence.

The peak wavelength of the emission spectrum of the exciplex 2 is approximately 610 nm, and thus the thermally activated delayed fluorescent substance containing the compound 2 and the compound 3 can be preferably used together with a material which emits red fluorescence.

FIG. 10B shows emission spectra of the exciplexes 3 and 4 and the compounds 2 and 4. The spectrum of the exciplex 3 is the result of measuring light emission of a material based on the compound 2 to which a slight amount of NPB is added, and the spectrum of the exciplex 4 is the result of measuring light emission of a material based on the compound 2 to which a slight amount of compound 4 is added. That is, in a sample used for measurement of the exciplex 3, one of the compound 2 and NPB corresponds to the first organic compound 113D1, and the other corresponds to the second organic compound 113D2. In a sample used for measurement of the exciplex 4, one of the compounds 2 and 4 corresponds to the first organic compound 113D1, and the other corresponds to the second organic compound 113D2.

As can be seen from FIG. 10B, there is a difference of about 100 nm between light emission of the exciplex 3 and light emission of the exciplex 4 even though both materials contain the same base material. This means that the emission wavelength of an exciplex can be easily adjusted by changing a substance that is a slight-amount component.

The peak wavelength of the emission spectrum of the exciplex 3 is approximately 520 nm, and thus the thermally activated delayed fluorescent substance containing the compound 2 and NPB can be preferably used together with a material which emits blue-green to red fluorescence.

The peak wavelength of the emission spectrum of the exciplex 4 is approximately 580 nm, and thus the thermally activated delayed fluorescent substance containing the compounds 2 and 4 can be preferably used together with a material which emits orange to red fluorescence.

The light-emitting element having the above structure has high energy transfer efficiency to the fluorescent material and has high luminous efficiency.

In the case where the two kinds of organic compounds which form an exciplex are used as the thermally activated delayed fluorescent substance, the driving voltage of the light-emitting element can be lowered, which is also preferable. By lowering the driving voltage, a light-emitting element with low power consumption can be formed. The reason why the driving voltage of the light-emitting element can be lowered by the use of the exciplex is described below.

In the case where the organic compounds which form an exciplex are used as the thermally activated delayed fluorescent substance, the threshold value of the voltage at which the exciplex is formed by carrier recombination (or a singlet exciton) is determined depending on the energy of the peak of the emission spectrum of the exciplex. When the emission spectrum of the exciplex peaks at 620 nm (2.0 eV), for example, the threshold value of voltage needed when the exciplex is fanned with electric energy is also approximately 2.0 V.

Here, when the energy of the peak of the emission spectrum of the exciplex is too high (i.e., when the wavelength is too short), the threshold value of the voltage with which an exciplex is formed also increases. That case is not preferred because higher voltage is needed to make the fluorescent material emit light by energy transfer from the exciplex to the fluorescent material, and thus extra energy is consumed. From this point of view, it is preferable that energy of the peak of the emission spectrum of the exciplex be lower (the wavelength be longer) because the threshold value of the voltage is lowered.

Thus, the peak wavelength of the emission spectrum of the exciplex is made to be longer than or equal to the peak wavelength of the absorption band on the longest wavelength side in the absorption spectrum of the fluorescent material, whereby a light-emitting element with low driving voltage can be obtained. Even in this case, energy can be transferred by utilizing an overlap of the emission spectrum of the exciplex with the absorption band on the longest wavelength side in the absorption spectrum of the fluorescent material; thus, high luminous efficiency can be obtained. As described above, high luminous efficiency (external quantum efficiency) is obtained with the drive voltage reduced, whereby high power efficiency can be achieved.

In the light-emitting element, the threshold voltage at which an exciplex is formed due to the carrier recombination is lower than the threshold voltage at which the fluorescent material starts to emit light due to the carrier recombination. In other words, even when voltage that is lower than the threshold voltage with which the fluorescent material starts to emit light is applied to the light-emitting element, carrier recombination occurs and an exciplex is formed; thus, recombination current starts to flow through the light-emitting element. Therefore, a light-emitting element with lower drive voltage (with more favorable voltage-current characteristics) can be provided.

Accordingly, at the time when the voltage reaches the threshold value with which the fluorescent material starts to emit light, a sufficient number of carriers exist in the light-emitting layer and carrier recombination which can contribute to light emission of the fluorescent material smoothly occurs many times. Therefore, luminance becomes remarkably high at a voltage close to the threshold voltage (light emission start voltage) of the fluorescent material. In other words, a curve representing the voltage-luminance characteristics can be steep in a rising portion near the emission start voltage; thus, drive voltage needed to obtain desired luminance can be low. Further, to obtain practical luminance, driving is performed with voltage higher than or equal to the threshold voltage (light emission start voltage) of the fluorescent material, in which case emitted light originates mostly from the fluorescent material and the light-emitting element is thus allowed to have high current efficiency.

The effect of the reduction in voltage is seen notably when the peak of the emission spectrum of the exciplex is located in a region ranging from the peak of the emission spectrum of the fluorescent material to a wavelength 30 nm longer than the peak of the emission spectrum of the fluorescent material or when the difference in equivalent energy value between peak wavelength of the emission spectrum of the exciplex and the peak wavelength of the emission spectrum of the fluorescent material is smaller than or equal to +0.2 eV. In the case of a region when the peak of the emission spectrum of the exciplex is located in a region ranging from the peak of the emission spectrum of the fluorescent material to a wavelength 30 nm shorter than the peak of the emission spectrum of the fluorescent material or when the difference in equivalent energy value between peak wavelength of the emission spectrum of the exciplex and the peak wavelength of the emission spectrum of the fluorescent material is greater than or equal to −0.2 eV, relatively high luminous efficiency can be kept.

Embodiment 2

In this embodiment, a detailed example of the structure of the light-emitting element described in Embodiment 1 is described below with reference to FIGS. 1A to 1C.

A light-emitting element in this embodiment includes, between a pair of electrodes, an EL layer including a plurality of layers. In this embodiment, the light-emitting element includes the first electrode 101, the second electrode 102, and the EL layer 103 which is provided between the first electrode 101 and the second electrode 102. Note that the following description in this embodiment is made on the assumption that the first electrode 101 functions as an anode and that the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the light-emitting layer 113 has the structure described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Specific examples of materials used for each layer are given below.

The hole-injection layer 111 is a layer containing a material having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'diphenyl-(1,1'-biphenyl)-4,4'-diamine (abbreviation: DNTPD), a high molecular compound such as poly(ethylenedioxythiophene)/poly(styrenesulfonic acid) (PEDOT/PSS), or the like.

Alternatively, a composite material in which a material having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these oxides, molybdenum oxide is particularly preferable in that it is stable in the air, has a low hygroscopic property, and is easy to handle.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ $cm^2/Vs$ or more is preferably used. Organic compounds that can be used as the substance having a hole-transport property in the composite material are specifically given below.

Examples of the aromatic amine compounds are N,N'-di (p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis (3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl) biphenyl (abbreviation: CBP), 1,3,5-tris[4-(N-carbazolyl) phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthypanthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di (2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1 \times 10^{-6}$ $cm^2/Vs$ or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A high molecular compound such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: poly-TPD) can also be used.

By providing the hole-injection layer 111, a high hole-injection property can be achieved to allow a light-emitting element to be driven at a low voltage.

The hole-transport layer 112 is a layer that contains a material having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino) triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ $cm^2/Vs$ or more. An organic compound given as an example of the substance having a hole-transport property in the composite material described above can also be used for the hole-transport layer 112. A high molecular compound such as poly(N-vinylcarbazole) (abbreviation: PVK) or poly(-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 contains at least a light-emitting substance and a thermally activated delayed fluorescent substance. Since the light-emitting layer 113 has the structure described in Embodiment 1, the light-emitting element in this embodiment can have extremely high luminous efficiency. Embodiment 1 can be referred to for the main components of the light-emitting layer 113.

The light-emitting layer 113 having the above-described structure can be deposited by co-evaporation by a vacuum evaporation method, or an inkjet method, a spin coating method, a dip coating method, or the like using a mixed solution.

The electron-transport layer 114 is a layer containing a material having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl) benzoxazolato]zinc (abbreviation: Zn(BOX)$_2$) or bis[2-(2- hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of 10$^{-6}$ cm$^2$/Vs or more. Note that any of the above-described thermally activated delayed fluorescent substances having electron-transport properties may be used for the electron-transport layer 114.

The electron-transport layer 114 is not limited to a single layer, and may be a stack of two or more layers containing any of the above substances.

Between the electron-transport layer and the light-emitting layer, a layer that controls transport of electrons may be provided. This is a layer formed by addition of a small amount of a substance having a high electron-trapping property to the aforementioned material having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, the electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride (CaF$_2$), can be used. For example, a layer that is formed using a material having an electron-transport property and contains an alkali metal, an alkaline earth metal, or a compound thereof can be used. Note that a layer that is formed using a material having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference which is generated between the first electrode 101 and the second electrode 102, and holes and electrons recombine in the light-emitting layer 113 which contains a light-emitting substance, so that light is emitted. That is, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the light-emitting substance.

The light-emitting element in this embodiment is provided over a substrate of glass, plastic, a metal, or the like. As a substrate which transmits light from the light-emitting element, a substrate having a high visible light transmitting property is used. As the way of stacking layers over a substrate which transmits light, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered 11-T. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

Figure 3A:
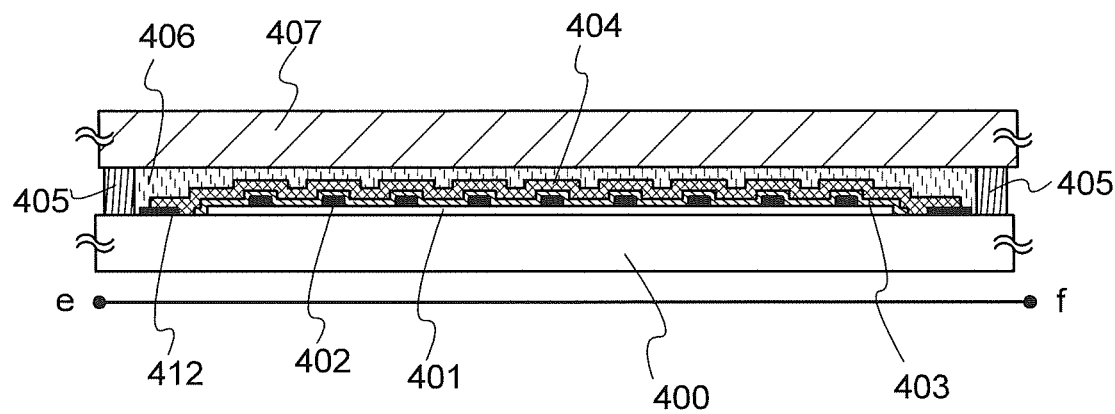
FIGS. 3A and 3B are schematic diagrams of a lighting device.
Figure 3B:
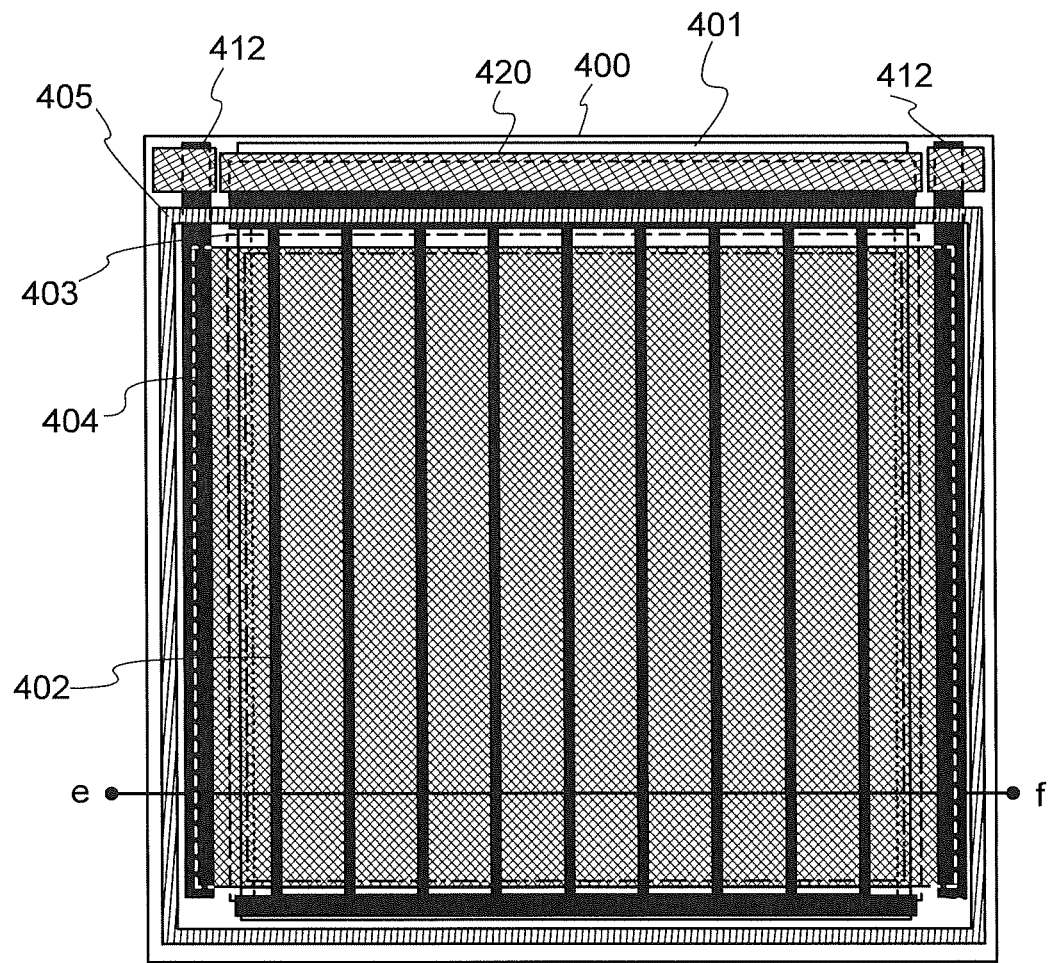

In this embodiment, an example in which the light-emitting element described in Embodiment 1 or 2 is used for a lighting device is described with reference to FIGS. 3A and 3B. FIG. 3B is a top view of the lighting device, and FIG. 3A is a cross-sectional view taken along e-f in FIG. 3B.

In the lighting device in this embodiment, a first electrode 401 is formed over a substrate 400 which is a support and has a light-transmitting property. The first electrode 401 corresponds to the first electrode 101 in Embodiment 2.

An auxiliary electrode 402 is provided over the first electrode 401. Since this embodiment shows an example in which light emission is extracted through the first electrode 401 side, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that surfaces of the auxiliary electrode 402 other than a portion thereof in contact with the first electrode 401 are preferably covered with an insulating layer. This is for suppressing light emission over the upper portion of the auxiliary electrode 402, which cannot be extracted, for reducing a reactive current, and for suppressing a reduction in power efficiency. Note that a pad 412 for applying a voltage to a second electrode 404 may be formed at the same time as the formation of the auxiliary electrode 402.

An EL layer 403 is formed over the first electrode 401 and the auxiliary electrode 402. The EL layer 403 has the structure described in Embodiment 1 or 2. Note that the EL layer 403 is preferably formed to be slightly larger than the first electrode 401 when seen from above so as to also serve as an insulating layer that suppresses a short circuit between the first electrode 401 and the second electrode 404.

The second electrode 404 is formed to cover the EL layer 403. The second electrode 404 corresponds to the second electrode 102 in Embodiment 2 and has a structure similar to the second electrode 102. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element has high luminous efficiency, the lighting device in this embodiment can be a lighting device with low power consumption.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 can be mixed with a desiccant, whereby moisture is adsorbed and the reliability is increased.

When extended to the outside of the sealing materials 405 and 406, the pad 412, the first electrode 401, and the auxiliary electrode 402 can each partly serve as external input terminal. An IC chip 420 mounted with a converter or the like may be provided over the external input terminals.

As described above, since the lighting device described in this embodiment includes the light-emitting element described in Embodiment 1 or 2 as an EL element, the lighting device can have high luminous efficiency and low power consumption.

Embodiment 4

Figure 4A:
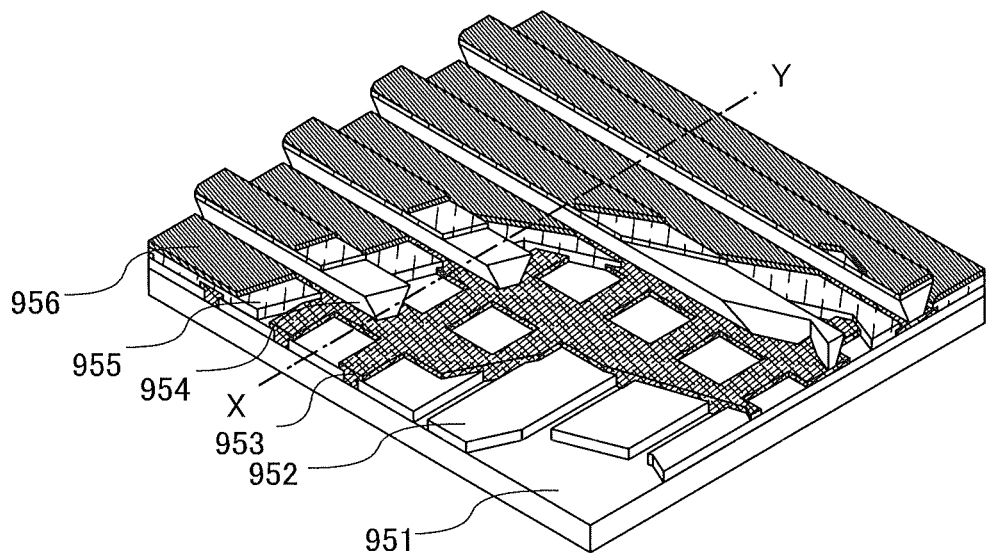
FIGS. 4A and 4B are schematic diagrams of a passive matrix light-emitting device.
Figure 4B:
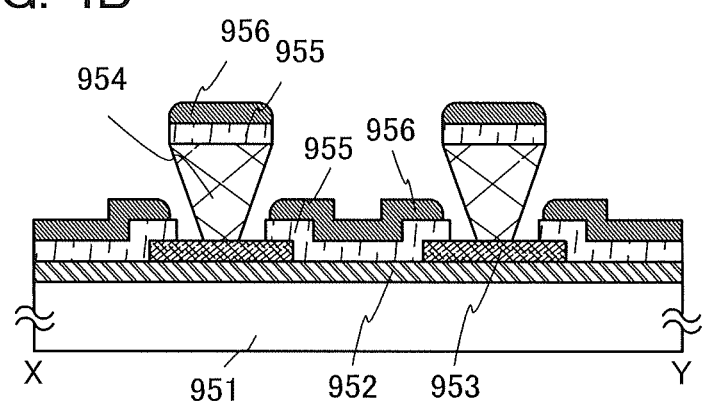

In this embodiment, a passive matrix light-emitting device manufactured using a light-emitting element described in Embodiment 1 or 2 is described with reference to FIGS. 4A and 4B. FIG. 4A is a perspective view of the light-emitting device, and FIG. 4B is a cross-sectional view taken along the line X-Y in FIG. 4A. In FIGS. 4A and 4B, over a substrate 951, an EL layer 955 is provided between an electrode 952 and an electrode 956. An end portion of the electrode 952 is covered with an insulating layer 953. In addition, a partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side which is in a direction similar to a plane direction of the insulating layer 953 and is in contact with the insulating layer 953) is shorter than the upper side (a side which is in a direction similar to a plane direction of the insulating layer 953 and is not in contact with the insulating layer 953). By providing the partition layer 954 in this manner, defects of the light-emitting element due to static electricity and the like can be prevented. The passive matrix light-emitting device can have high luminous efficiency and low power consumption by including the light-emitting element in Embodiment 1 or 2.

Embodiment 5

In this embodiment, an active matrix light-emitting device including the light-emitting element described in Embodiment 1 or 2 is described with reference to FIGS. 5A and 5B.

An example of a light-emitting device in which full color display is achieved with the use of a coloring layer and the like is illustrated in FIGS. 5A and 5B. In FIG. 5A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, an EL layer 1028, a second electrode 1029 of the light-emitting elements, a sealing substrate 1031, a sealant 1032a, a sealant 1032b, and the like are illustrated. The sealant 1032b can be mixed with a desiccant. Further, coloring layers (a red coloring layer 1034R, a green coloring layer 1034G, and a blue coloring layer 1034B) are provided on a transparent base material 1033. Further, a black layer (a black matrix) 1035 may be additionally provided. The position of the transparent base material 1033 provided with the coloring layers and the black layer is aligned and the transparent base material 1033 is fixed to the substrate 1001. Note that the coloring layers and the black layer are covered with an overcoat layer 1036. In this embodiment, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

Figure 6:
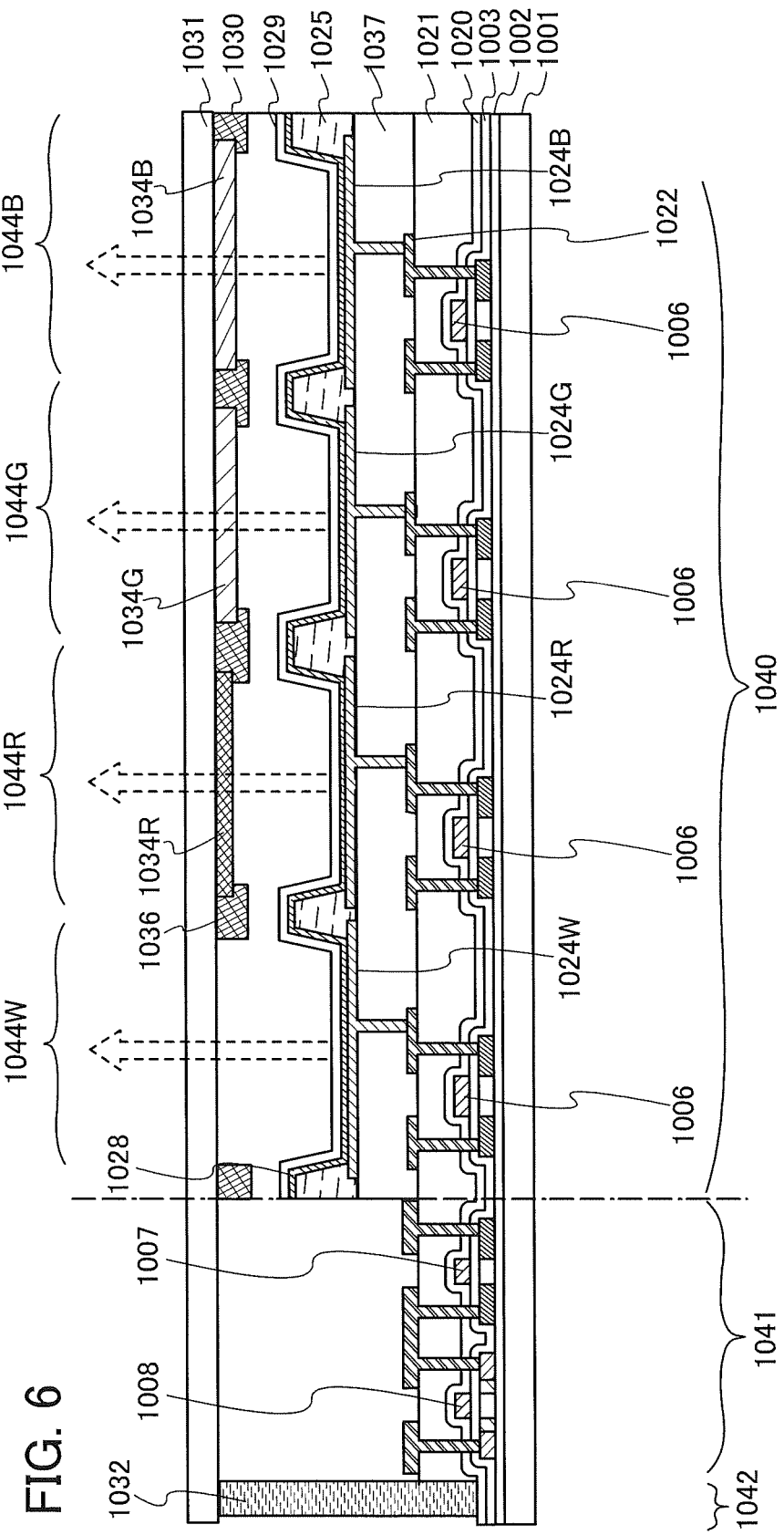
FIG. 6 is a schematic diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. The process up to the step of forming of a connection electrode which connects the TFT and the anode of the light-emitting element is performed in a manner similar to that of the light-emitting device having a bottom emission structure. After that, a third interlayer insulating film 1037 is formed to cover an electrode 1022. This insulating film may have a planarization function. The third interlayer insulating film 1037 can be formed using a material similar to that of the second interlayer insulating film 1021, and can alternatively be formed using any other known material.

The first electrodes 1024W, 1024R, 1024G, and 1024B of the light-emitting elements each serve as an anode here, but may serve as a cathode. Further, in the case of a light-emitting device having a top emission structure as illustrated in FIG. 6, the first electrodes are preferably reflective electrodes. The EL layer 1028 is formed to have a structure similar to the structure described in Embodiment 1 or 2, with which white light emission can be obtained. As the structure with which white light emission can be obtained, in the case where two EL layers are used, a structure with which blue light is obtained from a light-emitting layer in one of the EL layers and orange light is obtained from a light-emitting layer of the other of the EL layers; a structure in which blue light is obtained from a light-emitting layer of one of the EL layers and red light and green light are obtained from a light-emitting layer of the other of the EL layers; and the like can be given. Further, in the case where three EL layers are used, red light, green light, and blue light are obtained from respective light-emitting layers, so that a light-emitting element which emits white light can be obtained. Needless to say, the structure with which white light emission is obtained is not limited thereto as long as the structure described in Embodiment 1 or 2 is used.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034E and the blue coloring layer 1034B) are provided. The sealing substrate 1031 may be provided with a black layer (a black matrix) 1035 which is positioned between pixels. The coloring layers (the red coloring layer 1034R, the green coloring layer 1034E and the blue coloring layer 1034B) and the black layer (the black matrix) may be covered with the overcoat layer 1036. Note that a light-transmitting substrate is used as the sealing substrate 1031.

When voltage is applied between the pair of electrodes of the thus obtained light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiment 1 or 2; thus, a light-emitting device with low driving voltage and low power consumption can be obtained.

Further, although an example in which full color display is performed using four colors of red, green, blue, and white is shown here, there is no particular limitation and full color display using three colors of red, green, and blue may be performed.

This embodiment can be freely combined with any of other embodiments.

Embodiment 6

In this embodiment, examples of electronic devices each including the light-emitting element described in Embodiment 1 or 2 are described. The light-emitting element described in Embodiment 1 or 2 has high luminous efficiency and reduced power consumption. As a result, the electronic devices described in this embodiment can each include a light-emitting portion having reduced power consumption.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

Figure 7A:
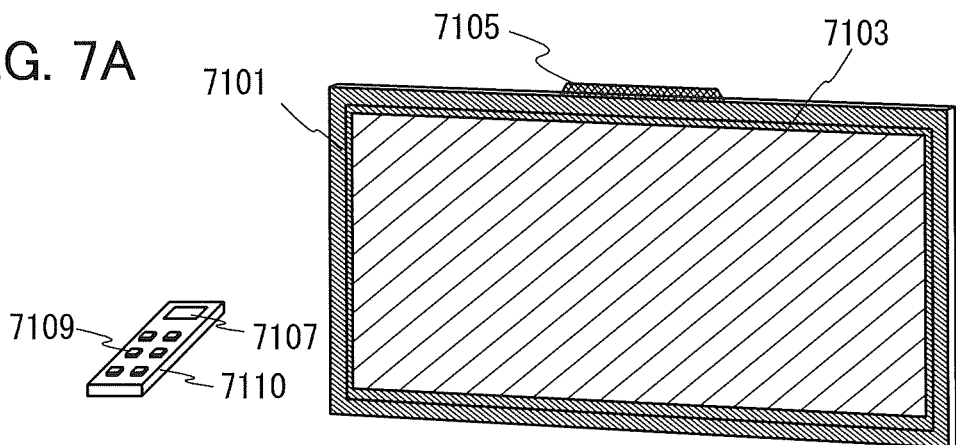
FIGS. 7A to 7E illustrate electronic devices.

FIG. 7A illustrates an example of a television device. In the television device, a display portion 7103 is incorporated in a housing 7101. In addition, here, the housing 7101 can be supported on the wall by a fixing member 7105. Images can be displayed on the display portion 7103, and in the display portion 7103, the light-emitting elements described in Embodiment 1 or 2 are arranged in a matrix. The light-emitting element can have high luminous efficiency. Thus, the television device having the display portion 7103 which is formed using the light-emitting element can have reduced power consumption.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Figure 7B:
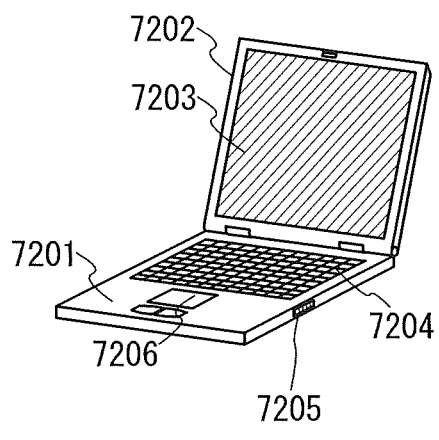
Figure 7C:
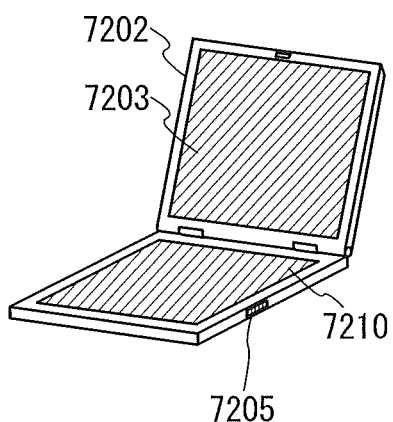

FIG. 7B illustrates a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 1 or 2. The computer illustrated in FIG. 7B may have a structure illustrated in FIG. 7C. A computer illustrated in FIG. 7C is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may be also a touch screen. Connecting the two screens with a hinge can prevent troubles; for example, the screens can be prevented from being cracked or broken while the computer is being stored or carried. Note that this computer is manufactured using the light-emitting elements each of which is described in Embodiment 1 or 2 and which are arranged in a matrix in the display portion 7203. The light-emitting elements can have high luminous efficiency. Therefore, this computer having the display portion 7203 which is formed using the light-emitting elements consumes less power.

Figure 7D:
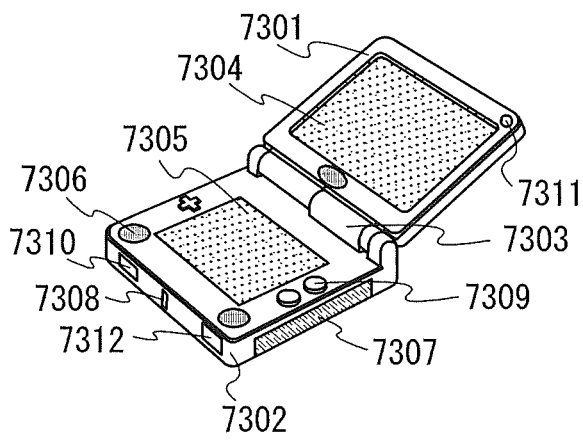

FIG. 7D illustrates a portable game machine, which includes two housings, a housing 7301 and a housing 7302, which are connected with a joint portion 7303 so that the portable game machine can be opened or folded. The housing 7301 incorporates a display portion 7304 including the light-emitting elements described in Embodiment 1 or 2 and arranged in a matrix, and the housing 7302 incorporates a display portion 7305.

In addition, the portable game machine illustrated in FIG. 7D includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as a display portion including the light-emitting elements described in Embodiment 1 or 2 which are arranged in a matrix is used for at least either the display portion 7304 or the display portion 7305, or both, and the structure can include other accessories as appropriate. The portable game machine illustrated in FIG. 7D has a function of reading out a program or data stored in a storage medium to display it on the display portion, and a function of sharing information with another portable game machine by wireless communication. The portable game machine illustrated in FIG. 7D can have a variety of functions without limitation to the above. The portable game machine having the display portion 7304 can consume less power because the light-emitting elements used in the display portion 7304 have high luminous efficiency. Since the light-emitting elements used in the display portion 7304 has low driving voltage, the portable game machine can also be a portable game machine having low driving voltage. Furthermore, since the light-emitting elements used in the display portion 7304 have a long lifetime, the portable game machine can also be a portable game machine having high reliability.

Figure 7E:
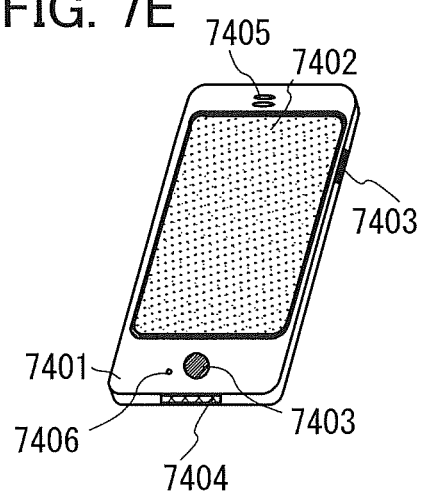

FIG. 7E illustrates an example of a cellular phone. The cellular phone is provided with a display portion 7402 incorporated in a housing 7401, operation buttons 7403, an external connection port 7404, a speaker 7405, a microphone 7406, and the like. Note that a mobile phone 7400 has the display portion 7402 including the light-emitting elements described in Embodiment 1 or 2 and arranged in a matrix. The light-emitting elements can have high luminous efficiency. In addition, a light-emitting element driven with a low driving voltage can be provided. Furthermore, the light-emitting elements can have a long lifetime. Therefore, this mobile phone having the display portion 7402 which is formed using the light-emitting elements consumes less power. In addition, a mobile phone driven with a low driving voltage can be provided. Further, a mobile phone having high reliability can be provided.

When the display portion 7402 of the mobile phone illustrated in FIG. 7E is touched with a finger or the like, data can be input into the mobile phone. In this case, operations such as making a call and creating an e-mail can be perforated by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor such as a gyroscope or an acceleration sensor for detecting inclination is provided inside the mobile phone, screen display of the display portion 7402 can be automatically changed by determining the orientation of the mobile phone (whether the mobile phone is placed horizontally or vertically).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 5 as appropriate.

Figure 8A:
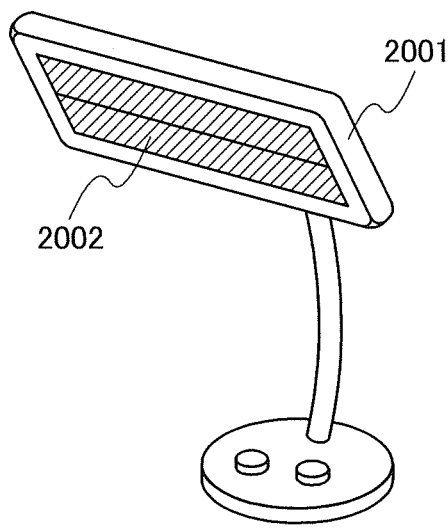
FIGS. 8A and 8B illustrate lighting devices.
Figure 8B:
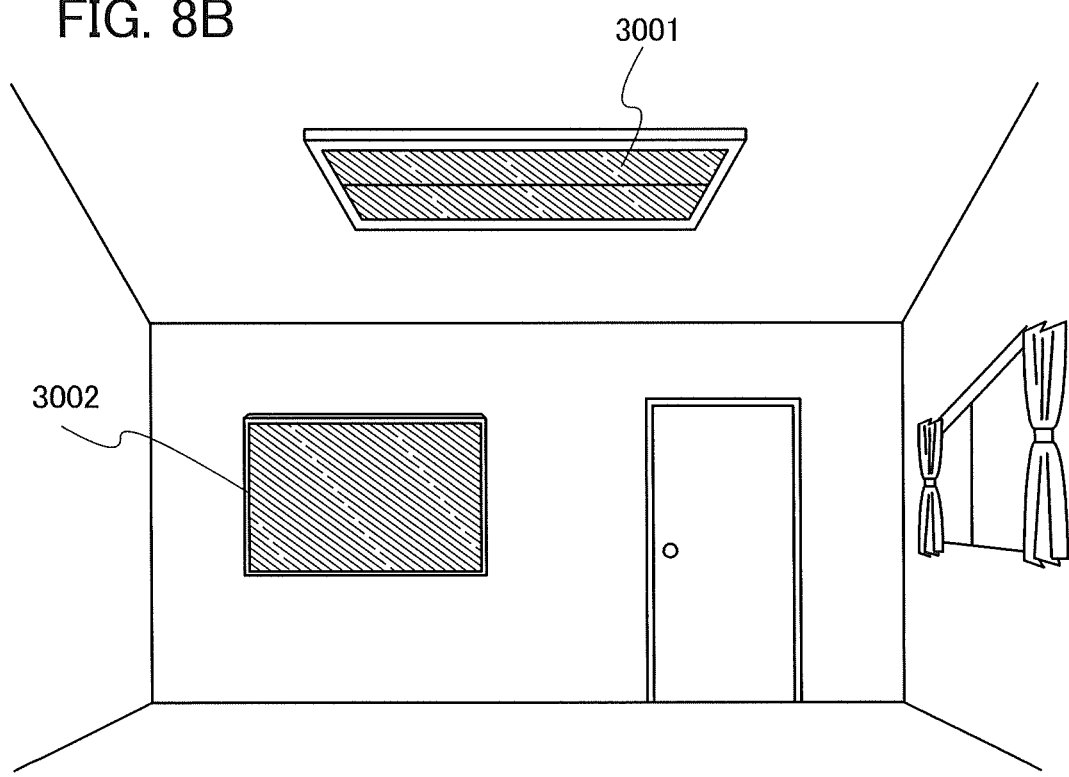

A table lamp 2003 illustrated in FIG. 8A is an example of a lighting device including the light-emitting element described in Embodiment 1 or 2. The table lamp 2003 includes a housing 2001 and a light source 2002, and the light-emitting element described in Embodiments 1 and 2 is used for the light source 2002. FIG. 8B illustrates an example in which the light-emitting element described in Embodiments 1 and 2 is used for an indoor lighting device 3001 and a television device 3002. The use of the light-emitting element described in Embodiment 1 or 2 for these lighting devices can make the lighting devices have reduced power consumption, a larger area, and a reduced thickness.

Figure 9A:
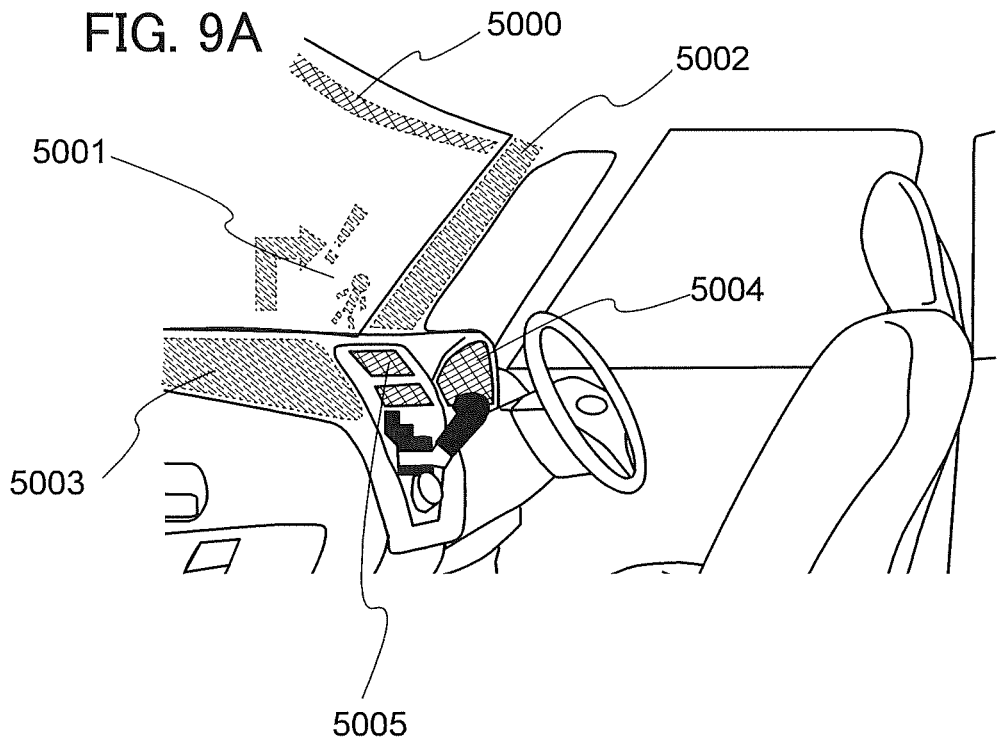
FIGS. 9A to 9C illustrate in-vehicle display devices and electronic devices.

The light-emitting element described in Embodiment 1 or 2 can also be used for an automobile windshield or an automobile dashboard. FIG. 9A illustrates one mode in which the light-emitting elements described in Embodiments 1 and 2 are used for an automobile windshield and an automobile dashboard.

A display 5000 and a display 5001 are provided in the automobile windshield in which the light-emitting elements described in Embodiment 1 or 2 are incorporated. The light-emitting element described in Embodiment 1 or 2 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

A display 5002 is provided in a pillar portion in which the light-emitting elements described in Embodiment 1 or 2 are incorporated. The display 5002 can compensate for the view hindered by the pillar portion by showing an image taken by an imaging unit provided in the car body. Similarly, a display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

A display 5004 and a display 5005 can provide a variety of kinds of information such as navigation data, a speedometer, a tachometer, a mileage, a fuel meter, a gearshift indicator, and air-condition setting. The content or layout of the display can be changed freely by a user as appropriate. Note that such information can also be shown by the displays 5000 to 5003. The displays 5000 to 5005 can also be used as lighting devices.

Figure 9B:
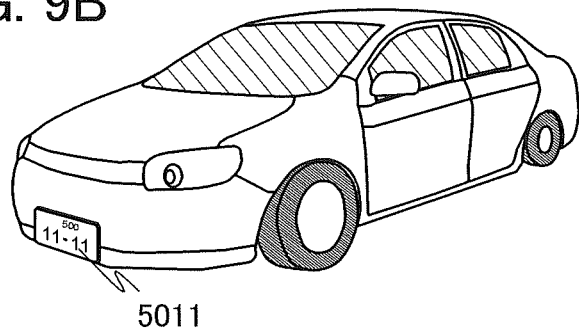

Further, as illustrated in FIG. 9B, the light-emitting element described in Embodiment 1 or 2 may be used for a display portion of the license plate 5011. Accordingly, the visibility of the license plate 5011 can be improved.

Figure 9C:
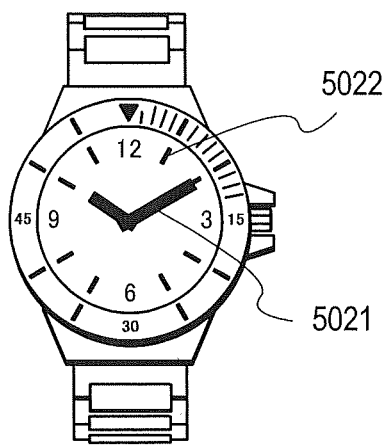

As illustrated in FIG. 9C, the light-emitting element described in Embodiment 1 or 2 may be used for hands 5021 or a display portion 5022 of a watch. Accordingly, without a radioactive substance such as tritium, which is used in a conventional light-emitting watch, the visibility of the watch in a dark place can be improved.

As described above, the application range of the light-emitting device having the light-emitting element described in Embodiment 1 or 2 is wide so that this light-emitting device can be applied to electronic devices in a variety of fields. By using the light-emitting element described in Embodiment 1 or 2, an electronic device having low power consumption can be obtained.

Example 1

In this example, a light-emitting element in which a mixture of a thermally activated delayed fluorescent substance and a fluorescent material is used for a light-emitting layer and a comparison light-emitting element in which a mixture of a material which does not emit thermally activated delayed fluorescence and a fluorescent material is used for a light-emitting layer were actually formed to be compared with each other. The comparison results are described with reference to FIG. 11 to FIG. 15.

Hereinafter, the light-emitting element 1 is a light-emitting element in which the thermally activated delayed fluorescent substance and the fluorescent material are mixed to be used for a light-emitting layer. The comparison light-emitting element 1 is a light-emitting element in which the material which does not emit thermally activated delayed fluorescence and the fluorescent material are mixed to be used for a light-emitting layer.

The fluorescent material which is used for the light-emitting element 1 and the comparison light-emitting element 1 is 5,6,11,12-tetraphenyl naphthacene (trivial name: rubrene).

As the thermally activated delayed fluorescent substance in the light-emitting element 1, two kinds of organic compounds which form an exciplex were used. Specifically, 2[3-(dibenzothiophen-4-yl)phenyl]dibenzo[f,h]quinoxaline (abbreviation: 2mDBTPDBq-II) was used as the first organic compound, and 2-[N-(9-phenylcarbazol-3-yl)-N-phenylamino]spiro-9,9'-bifluorene (abbreviation: PCASF) was used as the second organic compound.

As the material which does not emit thermally activated delayed fluorescence in the comparison light-emitting element 1, 2-[3-(dibenzothiophen-4-yl)phenyl]dibenzo[f,h]quinoxaline (abbreviation: 2mDBTPDBq-II) was used. That is, as the material which does not emit thermally activated delayed fluorescence, the first organic compound in the light-emitting element 1 was only used.

Chemical formulae of materials used in this example are shown below.

[Chemical formula 4]

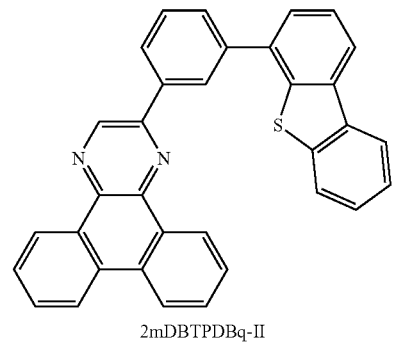

2mDBTPDBq-II

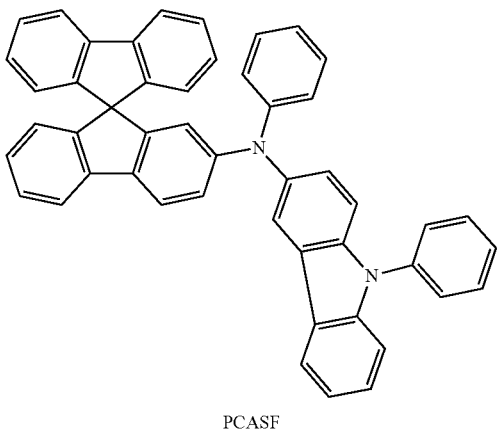

PCASF

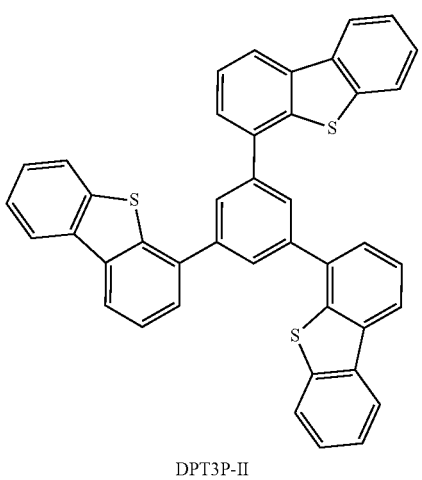

DPT3P-II

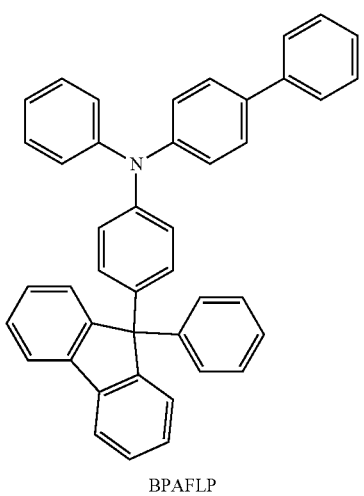

BPAFLP

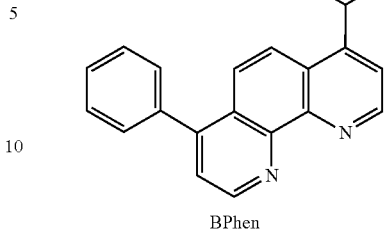

BPhen

Methods for manufacturing the light-emitting element 1 and the comparison light-emitting element 1 are described below.

Light-Emitting Element 1

First, a film of indium tin oxide containing silicon oxide (ITSO) was formed over a glass substrate 1100 by a sputtering method, so that a first electrode 1101 functioning as an anode was formed. The thickness thereof was 110 nm and the electrode area was 2 mm×2 mm (see FIG. 11).

Next, as pretreatment for forming the light-emitting element over the substrate 1100, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface on which the first electrode 1101 was formed faced downward. The pressure in the vacuum evaporation apparatus was reduced to about $10^{-4}$ Pa. After that, over the first electrode 1101, 1,3,5-tri(dibenzothiophen-4-yl)-benzene (abbreviated as DBT3P-II) and molybdenum oxide were deposited by co-evaporation, so that a hole-injection layer 1111 was formed. The thickness of the hole-injection layer 1111 was set to 40 nm, and the weight ratio of DBT3P-II to molybdenum oxide was adjusted to 1:0.5.

Next, a film of BPAFLP (abbreviation) was formed to a thickness of 20 nm over the hole-injection layer 1111 to form a hole-transport layer 1112.

2mDBTPDBq-II (abbreviation), PCASF (abbreviation), and rubrene were deposited by co-evaporation so that a light-emitting layer 1113 is formed over the hole-transport layer 1112. The weight ratio of 2mDBTPDBq-II to PCASF and rubrene was adjusted to be 0.8:0.2:0.01 (=2mDBTPDBq-II:PCASF:rubrene). The thickness of the light-emitting layer 1113 was set to 30 nm.

Next, over the light-emitting layer 1113, a film of 2mDBTPDBq-II (abbreviation) was formed to a thickness of 20 nm to form a first electron-transport layer 1114a.

Next, a film of bathophenanthroline (abbreviation: BPhen) was formed to a thickness of 20 nm over the first electron-transport layer 1114a to form a second electron-transport layer 1114b.

Lithium fluoride (LiF) was deposited over the second electron-transport layer 1114b by evaporation to a thickness of 1 nm, so that an electron-injection layer 1115 was formed.

Lastly, a 200 nm thick film of aluminum was deposited by evaporation to form a second electrode 1103 functioning as a cathode. Thus, Light-emitting Element 1 of this example was fabricated.

Comparison Light-Emitting Element 1

The light-emitting layer 1113 of the comparison light-emitting element 1 was deposited by co-evaporation of 2mDBTPDBq-II (abbreviation) and rubrene. The weight ratio of 2mDBTPDBq-II (abbreviation) to rubrene was adjusted to be 1:0.01 (=2mDBTPDBq-II:rubrene). The thickness of the light-emitting layer 1113 was set to 30 nm. Components other than the light-emitting layer 1113 were manufactured in a manner similar to that of the light-emitting element 1.

Note that in all the above evaporation steps, evaporation was performed by a resistance-heating method.

Element structures of the light-emitting element 1 and the comparison light-emitting element 1 obtained as described above are shown in Table 1.

TABLE 1

|  | Light-emitting Element 1 | Comparison Light-emitting Element 1 |
| --- | --- | --- |
| Electron-injection Layer | LiF<br>1 nm | LiF<br>1 nm |
| Electron-transport Layer | BPhen<br>20 nm<br>2mDBTPDBq-II<br>20 nm | BPhen<br>20 nm<br>2mDBTPDBq-II<br>20 nm |
| Light-emitting Layer | 2mDBTPDBq-II:PCASF:Rubrene<br>(=0.8:0.2:0.01)<br>30 nm | 2mDBTPDBq-II:Rubrene<br>(=0.8:0.01)<br>30 nm |
| Hole-transport Layer | BPAFLP<br>20 nm | BPAFLP<br>20 nm |
| Hole-injection Layer | DBT3P-II:MoOx<br>(=1:0.5)<br>20 nm | DBT3P-II:MoOx<br>(=1:0.5)<br>20 nm |

*First Electrode: Indium Tin Oxide Containing Silicon Oxide 110 nm
Second Electrode: Al 200 nm These light-emitting elements were each sealed in a glove box containing a nitrogen atmosphere so as not to be exposed to the air. Then, operation characteristics of these light-emitting elements were measured. Note that the measurements were carried out at room temperature (in an atmosphere kept at 25° C.).

Figure 12:
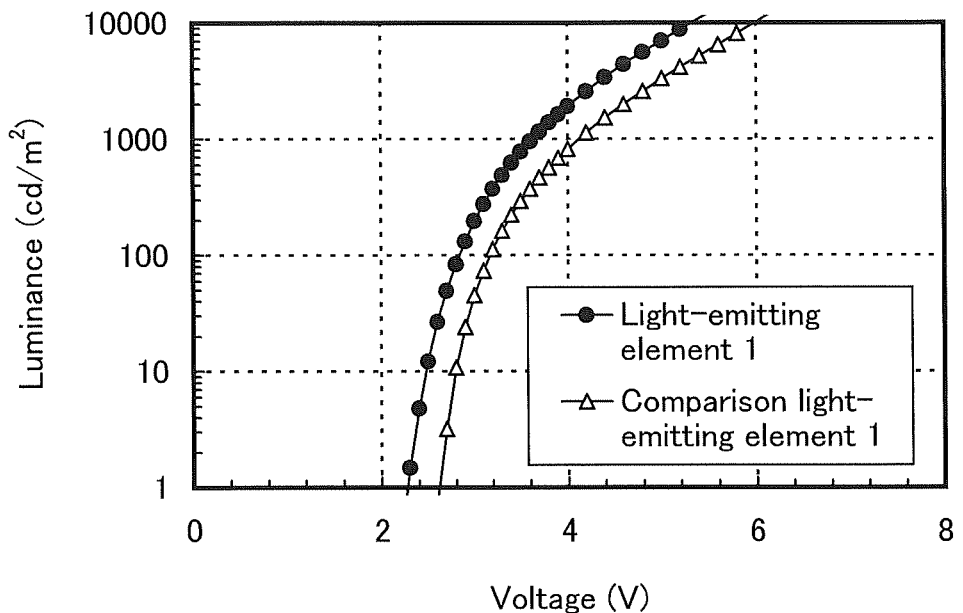
FIG. 12 shows voltage-luminance characteristics of the light-emitting element 1 and the comparison light-emitting element 1 of Example 1.
Figure 13:
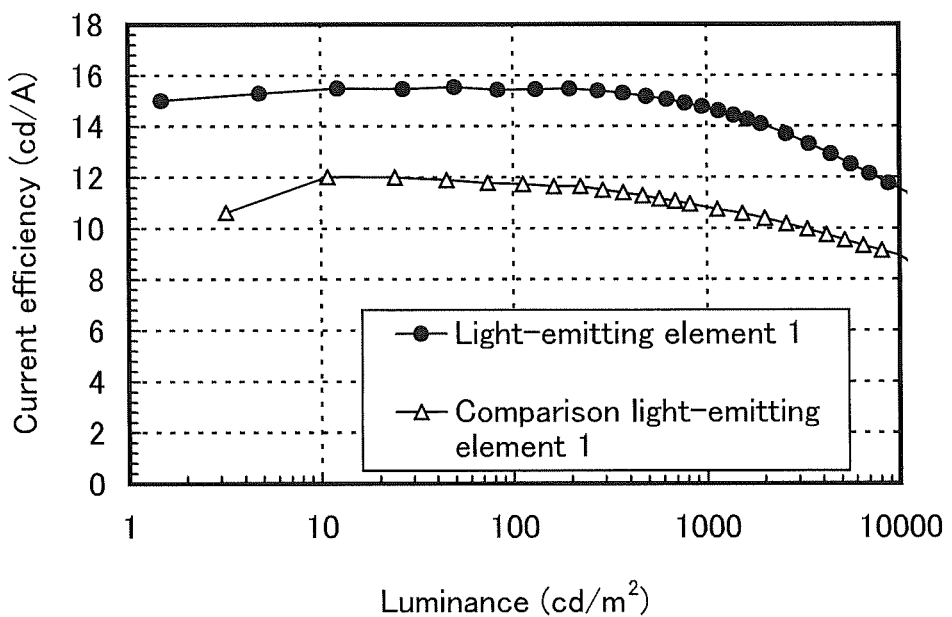
FIG. 13 shows luminance-current efficiency characteristics of the light-emitting element 1 and the comparison light-emitting element 1 of Example 1.
Figure 14:
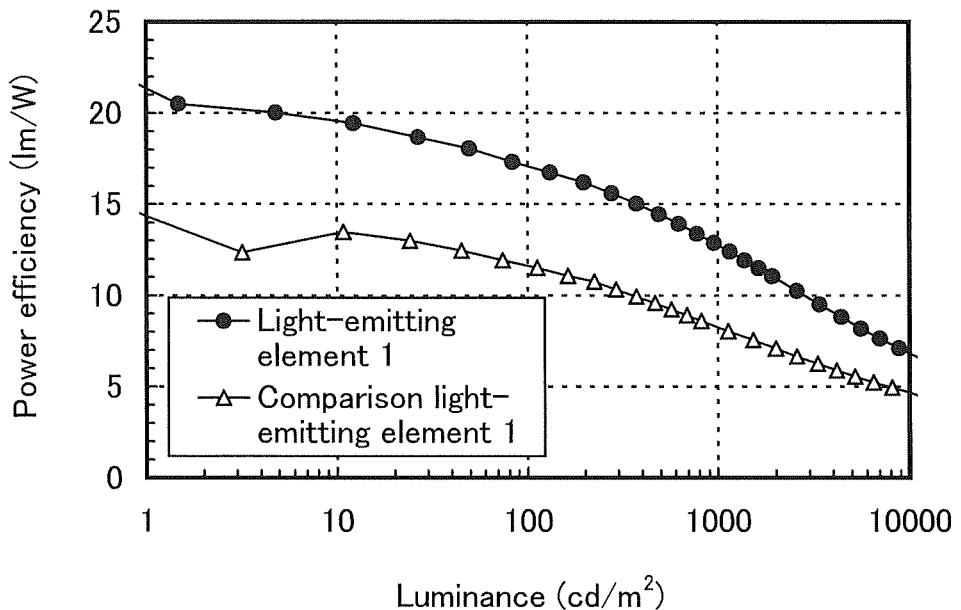
FIG. 14 shows luminance-power efficiency characteristics of the light-emitting element 1 and the comparison light-emitting element 1 of Example 1.
Figure 15:
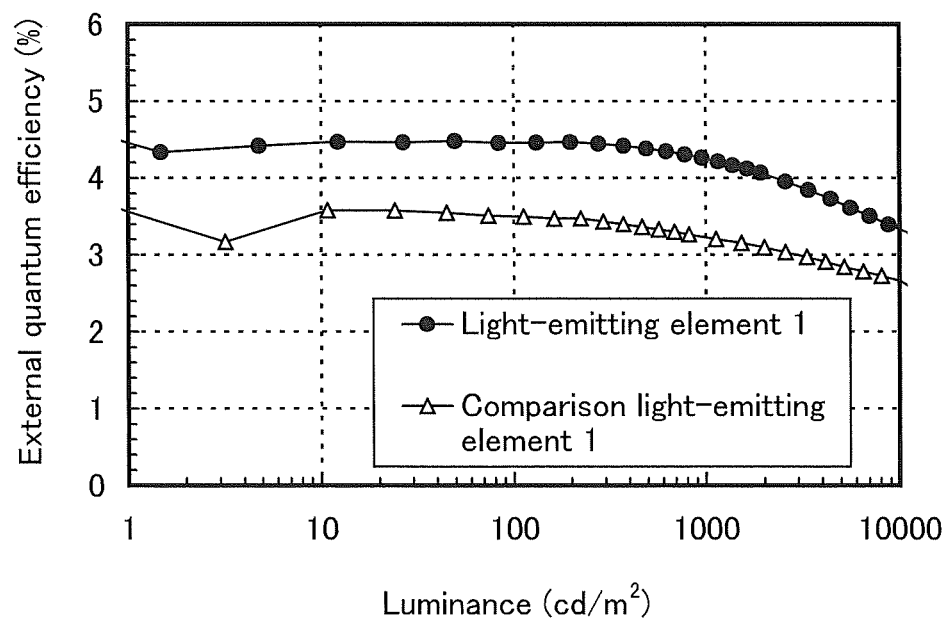
FIG. 15 shows luminance-external quantum efficiency characteristics of the light-emitting element 1 and the comparison light-emitting element 1 of Example 1.

FIG. 12 shows voltage-luminance characteristics of the light-emitting element 1 and the comparison light-emitting element 1. In FIG. 12, the horizontal axis represents voltage (V) and the vertical axis represents luminance (cd/m$^2$). FIG. 13 shows luminance-current efficiency characteristics. In FIG. 13, the horizontal axis indicates luminance (cd/m$^2$) and the vertical axis indicates current efficiency (cd/A). FIG. 14 shows luminance-power efficiency characteristics thereof. In FIG. 14, the horizontal axis represents luminance (cd/m$^2$), and the vertical axis represents power efficiency (lm/W). In addition, FIG. 15 shows luminance-external quantum efficiency characteristics thereof. In FIG. 15, the horizontal axis represents luminance (cd/m$^2$) and the vertical axis represents external quantum efficiency (%).

Further, Table 2 shows the voltage (V), current density (mA/cm$^2$), CIE chromaticity coordinates (x, y), current efficiency (cd/A), power efficiency (lm/W), and external quantum efficiency (%) of each of the light-emitting element 1 and the comparison light-emitting element 1 at a luminance of around 1000 cd/m$^2$.

TABLE 2

|  | Light-emitting Element 1 | Comparison Light-emitting Element 1 |
| --- | --- | --- |
| Voltage (V) | 3.6 | 4.2 |
| Current Density (mA/cm$^2$) | 6.5 | 10.5 |
| Chromaticity (x, y) | (0.47, 0.52) | (0.46, 0.50) |
| Luminance (cd/m$^2$) | 950 | 1130 |
| Current Efficiency (cd/A) | 15 | 11 |
| Power Efficiency (lm/W) | 13 | 8 |
| External Quantum Efficiency (%) | 4.3 | 3.2 |

As shown in Table 2, CIE chromaticity coordinates of the light-emitting element 1 at luminance of around 1000 cd/m$^2$ were (x,y)=(0.47, 0.52), and CIE chromaticity coordinates of the comparison light-emitting element 1 at luminance of around 1000 cd/m$^2$ were (x,y)=(0.46, 0.50). These results show that the light-emitting element 1 and the comparison light-emitting element 1 emit yellow light derived from rubrene.

As apparent from Table 2, FIG. 12, FIG. 13, FIG. 14, and FIG. 15, the light-emitting element 1 has a low threshold voltage at which the fluorescent material starts to emit light (light emission start voltage), high current efficiency, high power efficiency, and high external quantum efficiency as compared to the comparison light-emitting element 1. Since 2mDBTPDBq-II and PCASF which are used for the light-emitting layer 1113 form an exciplex, a singlet excited state is formed from part of a triplet excited state of the exciplex in the light-emitting layer 1113. The reason why the luminous efficiency was improved is considered to be because of the energy transfer of this singlet excited state of the exciplex to the singlet excited state of the fluorescent material. The reason why the light emission start voltage was lowered is considered to be because of the formation of this exciplex.

Example 2

In this example, as in Example 1, a light-emitting element in which a mixture of a thermally activated delayed fluorescent substance and a fluorescent material is used for a light-emitting layer and a comparison light-emitting element in which a mixture of a material which does not emit thermally activated delayed fluorescence and a fluorescent material is used for a light-emitting layer are manufactured to be compared with each other. The comparison results are described with reference to FIG. 16 to FIG. 22.

Hereinafter, the light-emitting element 2 is a light-emitting element in which the thermally activated delayed fluorescent substance and the fluorescent material are mixed to be used for a light-emitting layer. The comparison light-emitting element 2 is a light-emitting element in which the material which does not emit thermally activated delayed fluorescence and the fluorescent material are mixed to be used for a light-emitting layer. The fluorescent material which is used for the light-emitting element 2 and the comparison light-emitting element 2 is 5,6,11,12-tetraphenyl naphthacene (trivial name: rubrene).

As the thermally activated delayed fluorescent substance in the light-emitting element 2, two kinds of organic compounds which form an exciplex were used. Specifically, 4,6-bis[3-(9H-carbazol-9-yl)-phenyl]pyrimidine (abbreviation: 4,6mCzP2Pm) was used as the first organic compound, and N-(1,1'-biphenyl-4-yl)-N-[4-(9-phenyl-9H-carbazol-3-yl)phenyl]-9,9-dimethyl-9H-fluoren-2-amine (abbreviation: PCBBiF) was used as the second organic compound.

As the material which does not emit thermally activated delayed fluorescence in the comparison light-emitting element 2, 4,6-bis[3-(9H-carbazol-9-yl)-phenyl]pyrimidine (abbreviation: 4,6mCzP2Pm) was used. That is, as the material which does not emit thermally activated delayed fluorescence, the first organic compound in the light-emitting element 2 was only used.

Chemical formulae of materials used in this example are shown below.

[Chemical formula 5]

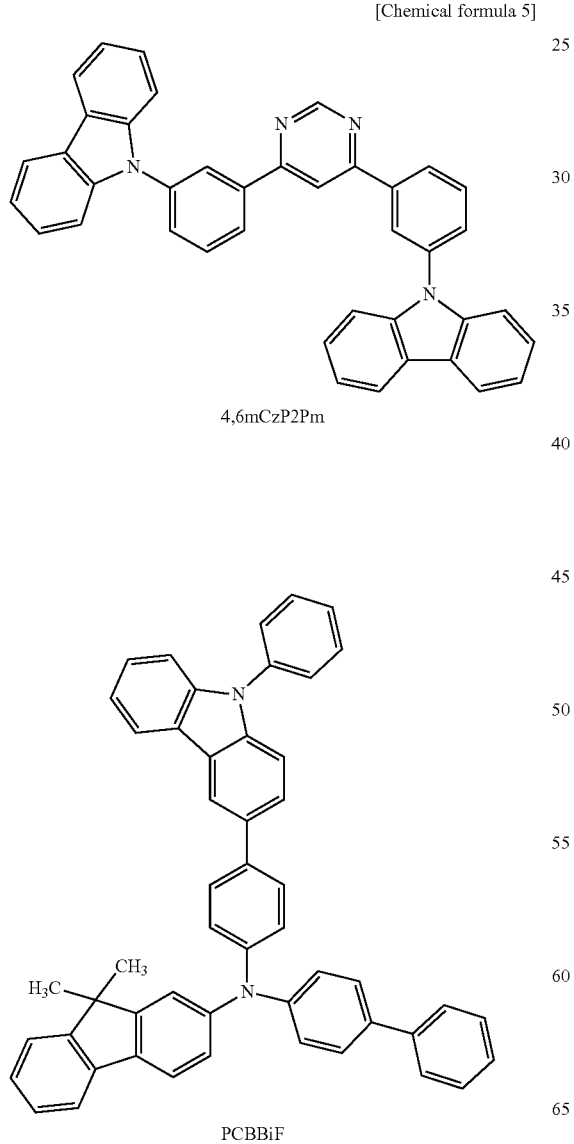

4,6mCzP2Pm

PCBBiF

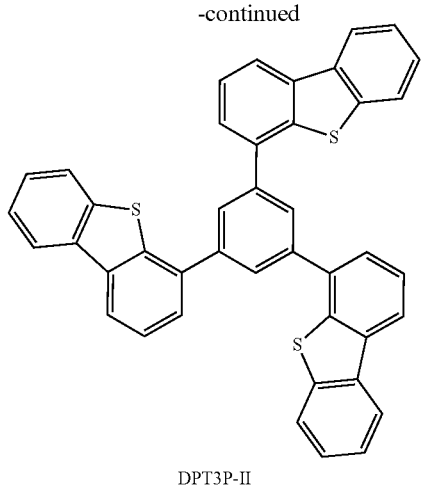

DPT3P-II

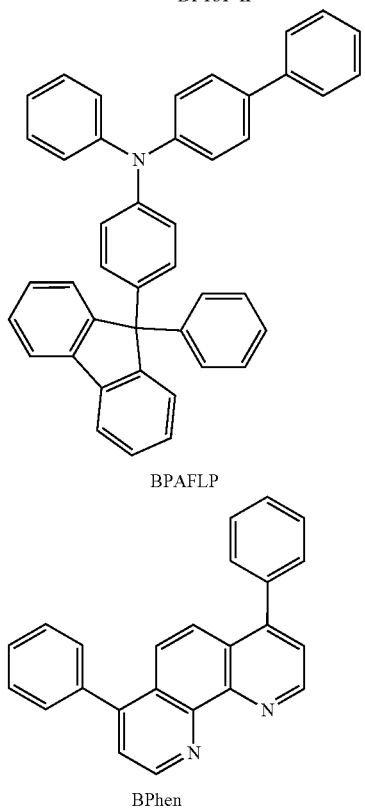

BPAFLP

BPhen

Methods for manufacturing the light-emitting element 2 and the comparison light-emitting element 2 are described below.

Light-Emitting Element 2

First, the first electrode 1101, the hole-injection layer 1111, and the hole-transport layer 1112 were formed over the glass substrate 1100 using a material and a method similar to those of the light-emitting element 1.

Next, 4,6mCzP2Pm (abbreviation), PCBBiF (abbreviation), and rubrene were deposited by co-evaporation, so that the light-emitting layer 1113 was formed over the hole-transport layer 1112. The weight ratio of 4,6mCzP2Pm to PCBBiF and rubrene was adjusted to be 0.8:0.2:0.0075 (=4,6mCzP2Pm:PCBBiF:rubrene). The thickness of the light-emitting layer 1113 was set to 40 nm.

Further, over the light-emitting layer 1113, a film of 4,6mCzP2Pm (abbreviation) was formed to a thickness of 10 nm to form the first electron-transport layer 1114*a*.

Next, a film of bathophenanthroline (abbreviation: BPhen) was formed to a thickness of 15 nm over the first electron-transport layer 1114*a* to form the second electron-transport layer 1114*b*.

Further, the electron-injection layer 1115 and a second electrode were formed using a material and a condition similar to the material and the condition for the electron-injection layer 1115 and the second electrode of the light-emitting element 1, so that the light-emitting element 2 in this example was formed.

Comparison Light-Emitting Element 2

The light-emitting layer 1113 of the comparison light-emitting element 2 was deposited by co-evaporation of 4,6mCzP2Pm (abbreviation) and rubrene. The weight ratio of 4,6mCzP2Pm and rubrene was adjusted to be 1:0.005 (=4,6mCzP2Pm:rubrene). The thickness of the light-emitting layer 1113 was set to 40 nm. Components other than the light-emitting layer 1113 were manufactured in a manner similar to that of the light-emitting element 2.

Note that in all the above evaporation steps, evaporation was performed by a resistance-heating method.

Element structures of the light-emitting element 2 and the comparison light-emitting element 2 obtained as described above are shown in Table 3.

TABLE 3

|  | Light-emitting Element 2 | Comparison Light-emitting Element 2 |
| --- | --- | --- |
| Electron-injection Layer | LiF 1 nm | LiF 1 nm |
| Electron-transport Layer | BPhen 15 nm 4,6mCzP2Pm 10 nm | BPhen 15 nm 4,6mCzP2Pm 10 nm |
| Light-emitting Layer | 4,6mCzP2Pm:PCBBiF:Rubrene (=0.8:0.2:0.0075) 40 nm | 4,6mCzP2Pm:Rubrene (=1:0.005) 40 nm |
| Hole-transport Layer | BPAFLP 20 nm | BPAFLP 20 nm |
| Hole-injection Layer | DBT3P-II:MoOx (=1:0.5) 20 nm | DBT3P-II:MoOx (=1:0.5) 20 nm |

*First Electrode: Indium Tin Oxide Containing Silicon Oxide 110 nm
Second Electrode: Al 200 nm These light-emitting elements were each sealed in a glove box containing a nitrogen atmosphere so as not to be exposed to the air. Then, operation characteristics of these light-emitting elements were measured. Note that the measurements were carried out at room temperature (in an atmosphere kept at 25° C.).

Figure 16:
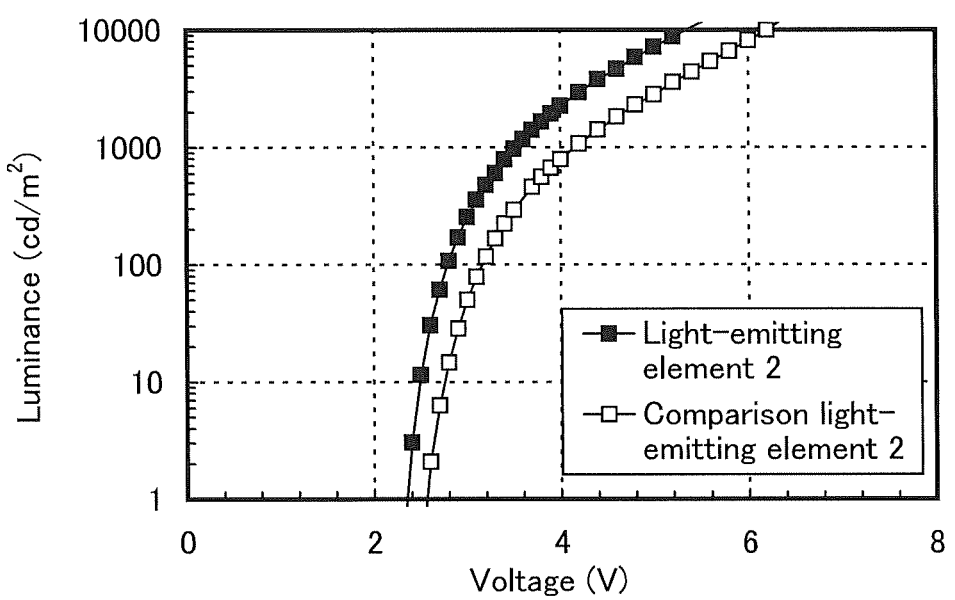
FIG. 16 shows voltage-luminance characteristics of a light-emitting element 2 and a comparison light-emitting element 2 of Example 2.
Figure 17:
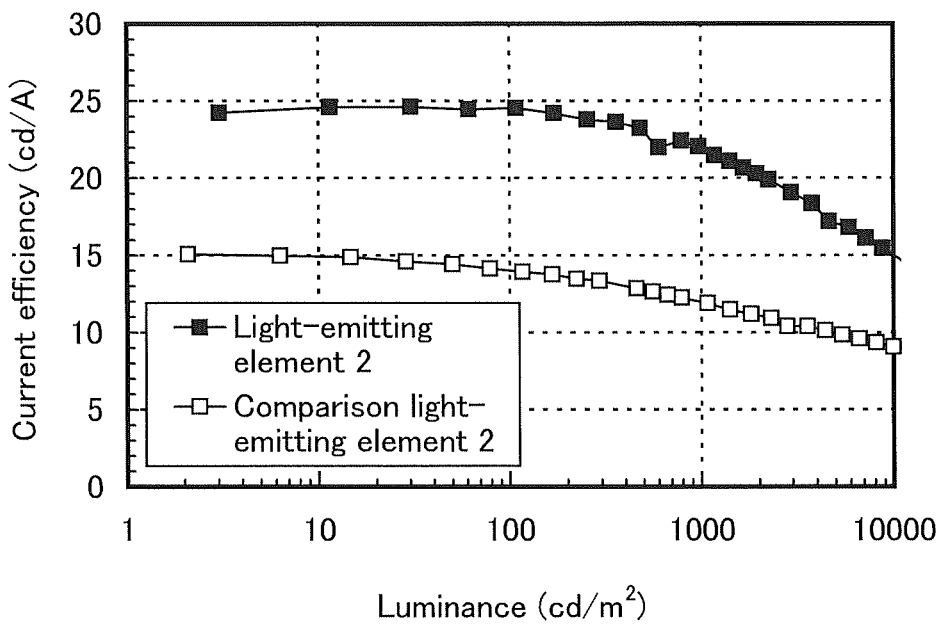
FIG. 17 shows luminance-current efficiency characteristics of the light-emitting element 2 and the comparison light-emitting element 2 of Example 2.
Figure 18:
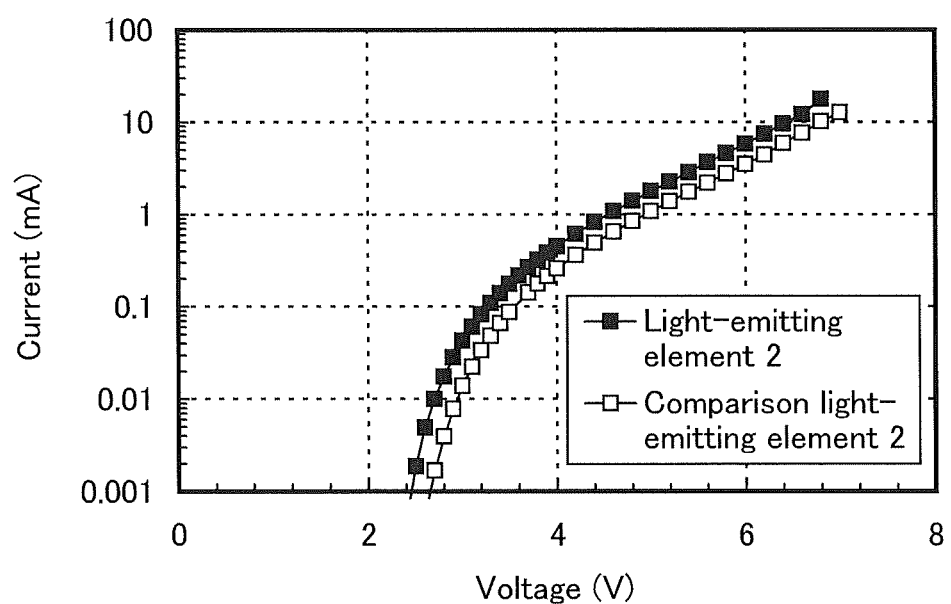
FIG. 18 shows voltage-current characteristics of the light-emitting element 2 and the comparison light-emitting element 2 of Example 2.
Figure 19:
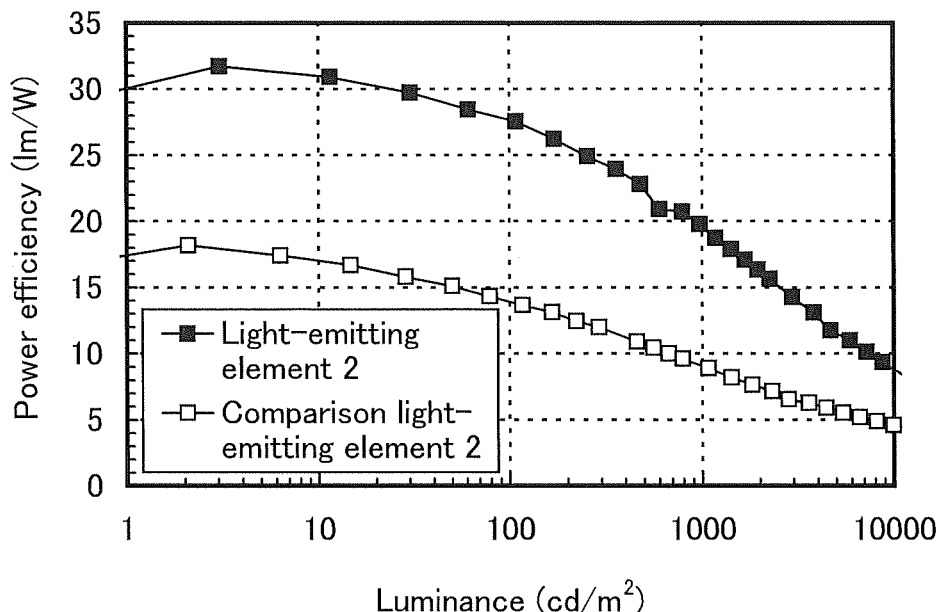
FIG. 19 shows luminance-power efficiency characteristics of the light-emitting element 2 and the comparison light-emitting element 2 of Example 2.
Figure 20:
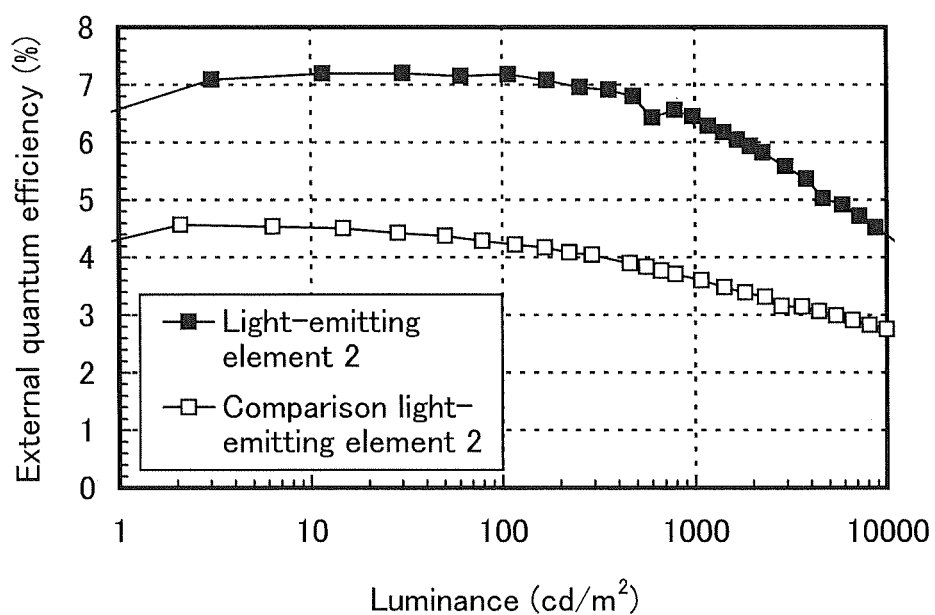
FIG. 20 shows luminance-external quantum efficiency characteristics of the light-emitting element 2 and the comparison light-emitting element 2 of Example 2.

FIG. 16 shows voltage-luminance characteristics of the light-emitting element 2 and the comparison light-emitting element 2. In FIG. 16, the horizontal axis represents voltage (V) and the vertical axis represents luminance ($cd/m^2$). FIG. 17 shows luminance-current efficiency characteristics. In FIG. 17, the horizontal axis indicates luminance ($cd/m^2$) and the vertical axis indicates current efficiency (cd/A). FIG. 18 shows voltage-current characteristics. In FIG. 18, the horizontal axis indicates voltage (V) and the vertical axis indicates current (mA). FIG. 19 shows luminance-power efficiency characteristics thereof. In FIG. 19, the horizontal axis represents luminance ($cd/m^2$), and the vertical axis represents power efficiency (lm/W). In addition, FIG. 20 shows luminance-external quantum efficiency characteristics thereof. In FIG. 20, the horizontal axis represents luminance ($cd/m^2$) and the vertical axis represents external quantum efficiency (%).

Further, Table 4 shows the voltage (V), current density ($mA/cm^2$), CIE chromaticity coordinates (x, y), current efficiency (cd/A), power efficiency (lm/W), and external quantum efficiency (%) of each of the light-emitting element 2 and the comparison light-emitting element 2 at a luminance of around 1000 $cd/m^2$.

TABLE 4

|  | Light-emitting Element 2 | Comparison Light-emitting Element 2 |
| --- | --- | --- |
| Voltage (V) | 3.5 | 4.2 |
| Current Density ($mA/cm^2$) | 4.4 | 9.1 |
| Chromaticity (x, y) | (0.47, 0.52) | (0.47, 0.50) |
| Luminance ($cd/m^2$) | 972 | 1076 |
| Current Efficiency (cd/A) | 22 | 12 |
| Power Efficiency (lm/W) | 20 | 9 |
| External Quantum Efficiency (%) | 6.5 | 3.6 |

As shown in Table 4, CIE chromaticity coordinates of the light-emitting element 2 at luminance of around 1000 $cd/m^2$ were (x,y)=(0.47, 0.52), and CIE chromaticity coordinates of the comparison light-emitting element 2 at luminance of around 1000 $cd/m^2$ were (x,y)=(0.47, 0.50).

Figure 21:
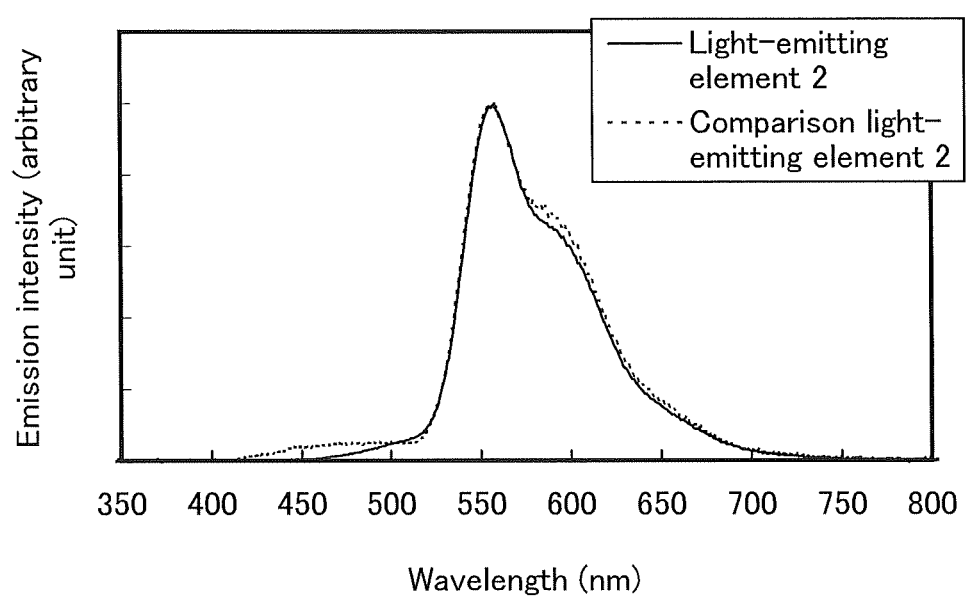
FIG. 21 shows emission spectra of the light-emitting element 2 and the comparison light-emitting element 2 of Example 2.

FIG. 21 shows emission spectra of the light-emitting element 2 and the comparison light-emitting element 2 which were obtained by applying a current of 0.1 mA. In FIG. 21, the vertical axis represents emission intensity (arbitrary unit) and the horizontal axis represents wavelength (nm). The emission intensity is shown as a value relative to the maximum emission intensity assumed to be 1. As shown in FIG. 21, the light-emitting element 2 and the comparison light-emitting element 2 each show a spectrum having a maximum emission wavelength at around 558 nm, which is derived from rubrene. This and the results of Table 4 show that the light-emitting element 2 and the comparison light-emitting element 2 emit yellow light.

Figure 22:
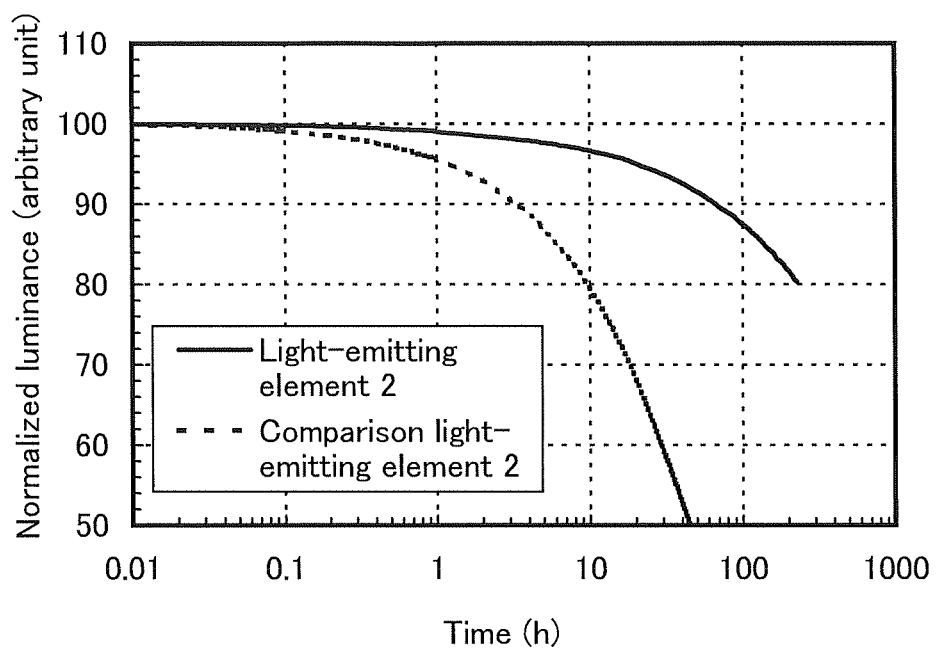
FIG. 22 shows results obtained by reliability tests of the light-emitting element 2 and the comparison light-emitting element 2 of Example 2.

The reliability tests were carried out, and the results thereof are shown in FIG. 22. In the reliability tests, the light-emitting element 2 and the comparison light-emitting element 2 were driven under the conditions where the initial luminance was set to 5000 $cd/m^2$ and the current density was constant. FIG. 22 shows a change in normalized luminance where the initial luminance is 100%.

As apparent from Table 4, FIG. 16 to FIG. 22, the light-emitting element 2 has a low threshold voltage at which the fluorescent material starts to emit light (light emission start voltage), high current efficiency, high power efficiency, and high external quantum efficiency as compared to the comparison light-emitting element 2. The light-emitting element 2 is a highly-reliable light-emitting element which shows a small luminance decrease relative to driving time.

Since 4,6mCzP2Pm and PCBBiF which are used for the light-emitting layer 1113 form an exciplex, a singlet excited state is formed from part of a triplet excited state of the exciplex in the light-emitting layer 1113. The reason why the luminous efficiency was improved is considered to be because of the energy transfer of this singlet excited state of the exciplex to the singlet excited state of the fluorescent material. The reason why the light emission start voltage was lowered is considered to be because of the formation of this exciplex.

Example 3

In this example, as in Example 1, a light-emitting element in which a mixture of a thermally activated delayed fluorescent substance and a fluorescent material is used for a light-emitting layer and a comparison light-emitting element in which a mixture of a material which does not emit thermally activated delayed fluorescence and a fluorescent material is used for a light-emitting layer are manufactured to be compared with each other. The comparison results are described with reference to FIG. 23 to FIG. 29.

Hereinafter, the light-emitting element 3 is a light-emitting element in which the thermally activated delayed fluorescent substance and the fluorescent material are mixed to be used for a light-emitting layer. The comparison light-emitting element 3 is a light-emitting element in which the material which does not emit thermally activated delayed fluorescence and the fluorescent material are mixed to be used for a light-emitting layer.

The fluorescent material which is used for the light-emitting element 3 and the comparison light-emitting element 3 is coumarin 6 (trivial name).

As the thermally activated delayed fluorescent substance in the light-emitting element 3, the two kinds of organic compounds which form an exciplex and which are the same as the organic compounds in Example 2 were used. Specifically, 4,6-bis[3-(9H-carbazol-9-yl)-phenyl]pyrimidine (abbreviation: 4,6mCzP2Pm) was used as the first organic compound, and N-(1,1'-biphenyl-4-yl)-N-[4-(9-phenyl-9H-carbazol-3-yl)phenyl]-9,9-dimethyl-9H-fluorene-2-amine (abbreviation: PCBBiF) was used as the second organic compound.

As the material which does not emit thermally activated delayed fluorescence in the comparison light-emitting element 3, 4,6-bis[3-(9H-carbazol-9-yl)-phenyl]pyrimidine (abbreviation: 4,6mCzP2Pm), which is the same as the one in Example 2, was used. That is, as the material which does not emit thermally activated delayed fluorescence, the first organic compound in the light-emitting element 3 was only used.

For the chemical formulae of the materials used in this example, the chemical formulae in Example 2 can be referred to. Methods for manufacturing the light-emitting element 3 and the comparison light-emitting element 3 are described below.

Light-Emitting Element 3

First, the first electrode 1101, the hole-injection layer 1111, and the hole-transport layer 1112 were formed over the glass substrate 1100 using a material and a method similar to those of the light-emitting element 1.

Next, 4,6mCzP2Pm (abbreviation), PCBBiF (abbreviation), and coumarin 6 were deposited by co-evaporation, so that the light-emitting layer 1113 was formed over the hole-transport layer 1112. The weight ratio of 4,6mCzP2Pm to PCBBiF and coumarin 6 was adjusted to be 0.8:0.2:0.005 (=4,6mCzP2Pm:PCBBiF:coumarin 6). The thickness of the light-emitting layer 1113 was set to 40 nm.

Further, over the light-emitting layer 1113, a film of 4,6mCzP2Pm (abbreviation) was formed to a thickness of 10 nm to form the first electron-transport layer 1114a.

Next, a film of bathophenanthroline (abbreviation: BPhen) was formed to a thickness of 15 nm over the first electron-transport layer 1114a to form the second electron-transport layer 1114b.

Further, the electron-injection layer 1115 and a second electrode were formed using a material and a condition similar to the material and the condition for the electron-injection layer 1115 and the second electrode of the light-emitting element 1, so that the light-emitting element 3 in this example was formed.

Comparison Light-Emitting Element 3

The light-emitting layer 1113 of the comparison light-emitting element 3 was deposited by co-evaporation of 4,6mCzP2Pm (abbreviation) and coumarin 6. The weight ratio of 4,6mCzP2Pm and coumarin 6 was adjusted to be 1:0.005 (=4,6mCzP2Pm:coumarin 6). The thickness of the light-emitting layer 1113 was set to 40 nm. Components other than the light-emitting layer 1113 were manufactured in a manner similar to that of the light-emitting element 3.

Note that in all the above evaporation steps, evaporation was performed by a resistance-heating method.

Element structures of the light-emitting element 3 and the comparison light-emitting element 3 obtained as described above are shown in Table 5.

TABLE 5

|  | Light-emitting Element 3 | Comparison Light-emitting Element 3 |
|---|---|---|
| Electron-injection Layer | LiF 1 nm | LiF 1 nm |
| Electron-transport Layer | BPhen 15 nm 4,6mCzP2Pm 10 nm | BPhen 15 nm 4,6mCzP2Pm 10 nm |
| Light-emitting Layer | 4.6mCzP2Pm:PCBBiF:Coumarin6 (=0.8:0.2:0.005) 40 nm | 4,6mCzP2Pm:Coumarin6 (=1:0:0.005) 40 nm |
| Hole-transport Layer | BPAFLP 20 nm | BPAFLP 20 nm |
| Hole-injection Layer | DBT3P-II:MoOx (=1:0.5) 20 nm | DBT3P-II:MoOx (=1:0.5) 20 nm |

*First Electrode: Indium Tin Oxide Containing Silicon Oxide 110 nm
Second Electrode: Al 200 nm These light-emitting elements were each sealed in a glove box containing a nitrogen atmosphere so as not to be exposed to the air. Then, operation characteristics of these light-emitting elements were measured. Note that the measurements were carried out at room temperature (in an atmosphere kept at 25° C.).

Figure 23:
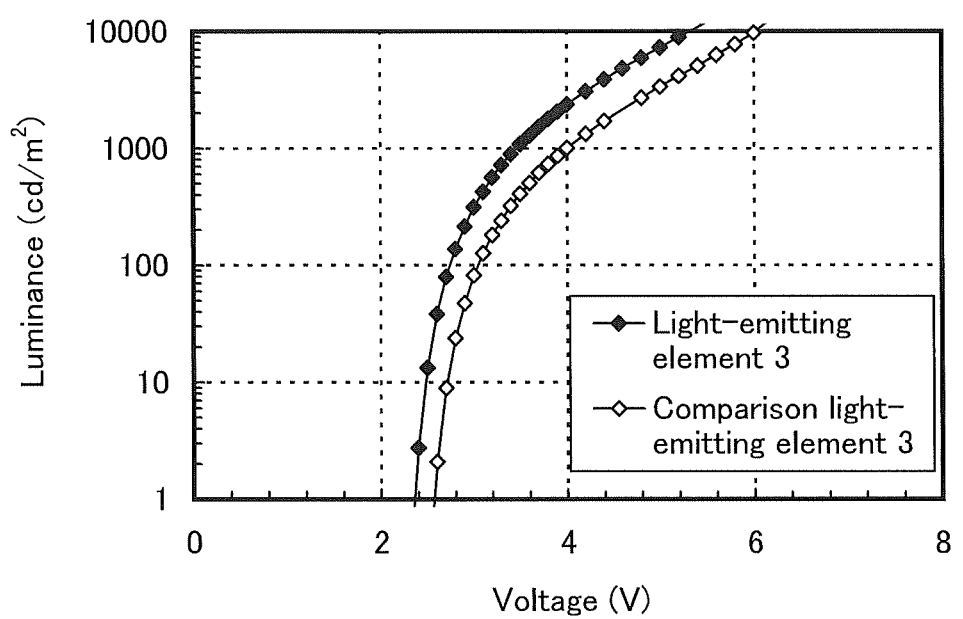
FIG. 23 shows voltage-luminance characteristics of a light-emitting element 3 and a comparison light-emitting element 3 of Example 3.
Figure 24:
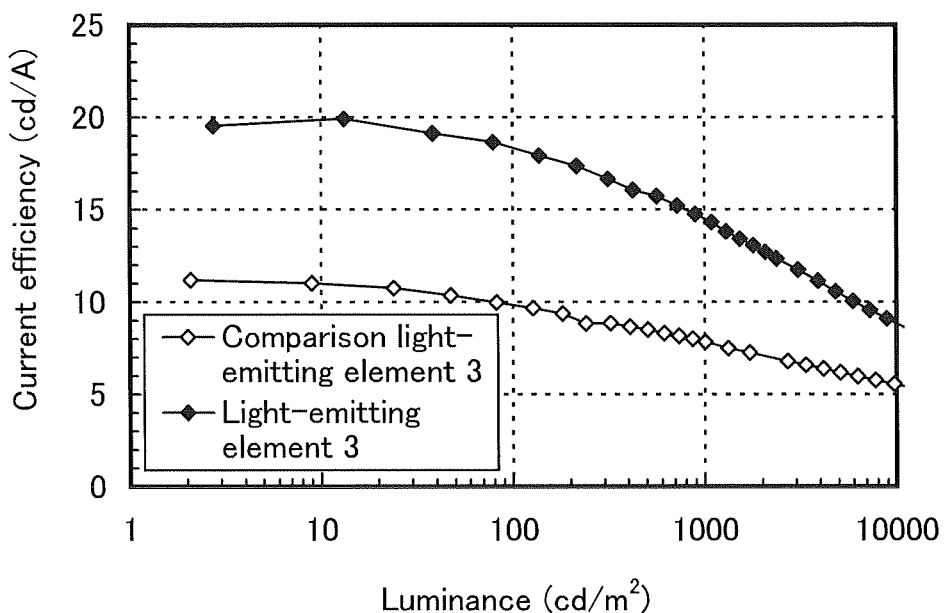
FIG. 24 shows luminance-current efficiency characteristics of the light-emitting element 3 and the comparison light-emitting element 3 of Example 3.
Figure 25:
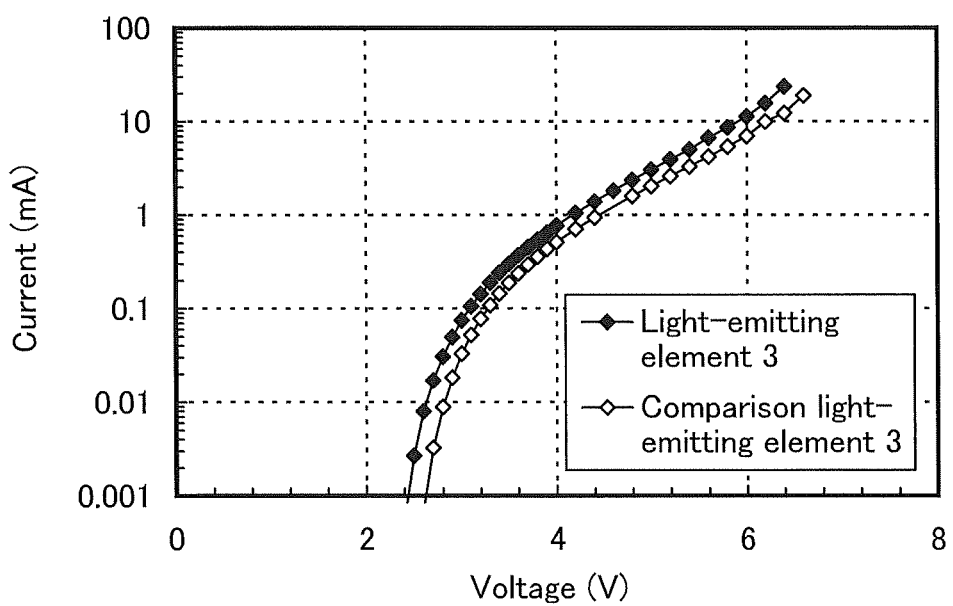
FIG. 25 shows voltage-current characteristics of the light-emitting element 3 and the comparison light-emitting element 3 of Example 3.
Figure 26:
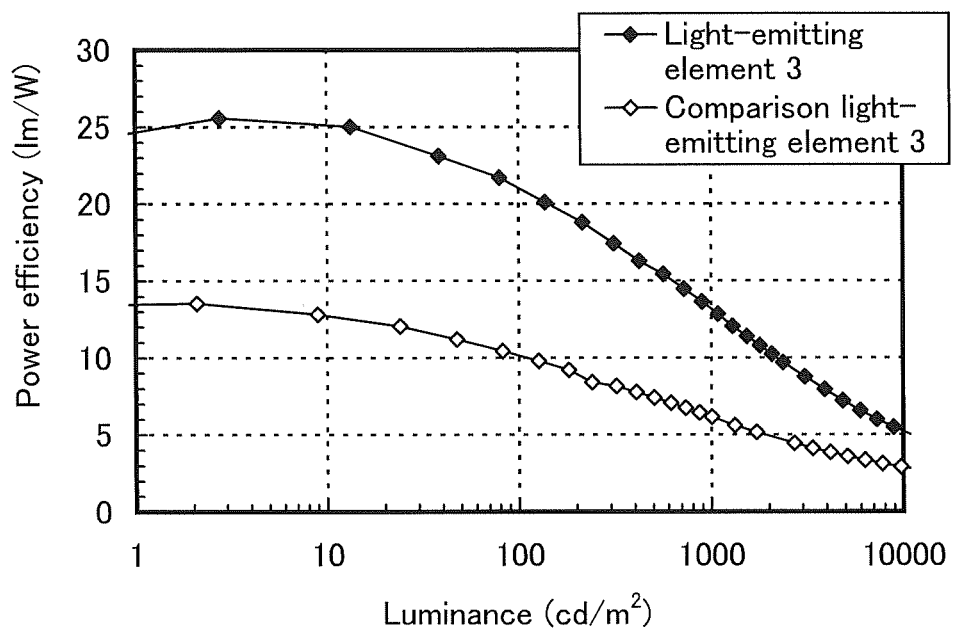
FIG. 26 shows luminance-power efficiency characteristics of the light-emitting element 3 and the comparison light-emitting element 3 of Example 3.
Figure 27:
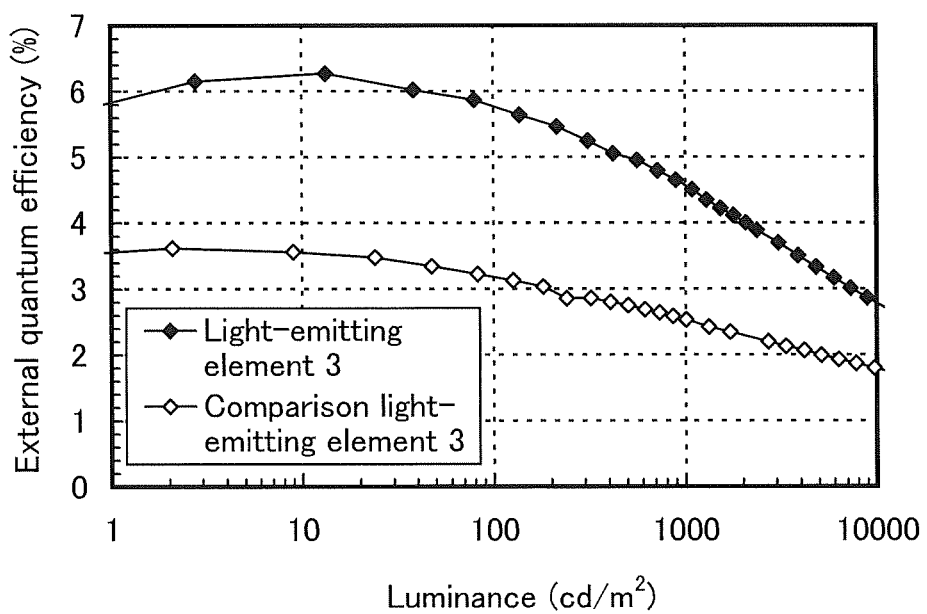
FIG. 27 shows luminance-external quantum efficiency characteristics of the light-emitting element 3 and the comparison light-emitting element 3 of Example 3.

FIG. 23 shows voltage-luminance characteristics of the light-emitting element 3 and the comparison light-emitting element 3. In FIG. 23, the horizontal axis represents voltage (V) and the vertical axis represents luminance (cd/m$^2$). FIG. 24 shows luminance-current efficiency characteristics. In FIG. 24, the horizontal axis indicates luminance (cd/m$^2$) and the vertical axis indicates current efficiency (cd/A). FIG. 25 shows voltage-current characteristics. In FIG. 25, the horizontal axis indicates voltage (V) and the vertical axis indicates current (mA). FIG. 26 shows luminance-power efficiency characteristics thereof. In FIG. 26, the horizontal axis represents luminance (cd/m$^2$), and the vertical axis represents power efficiency (lm/W). In addition, FIG. 27 shows luminance-external quantum efficiency characteristics thereof. In FIG. 27, the horizontal axis represents luminance (cd/m$^2$) and the vertical axis represents external quantum efficiency (%).

Further, Table 6 shows the voltage (V), current density (mA/cm$^2$), CIE chromaticity coordinates (x, y), current efficiency (cd/A), power efficiency (lm/W), and external quantum efficiency (%) of each of the light-emitting element 3 and the comparison light-emitting element 3 at a luminance of around 1000 cd/m$^2$.

TABLE 6

|  | Light-emitting Element 3 | Comparison Light-emitting Element 3 |
| --- | --- | --- |
| Voltage (V) | 3.5 | 3.9 |
| Current Density (mA/cm$^2$) | 7.6 | 10.8 |
| Chromaticity (x, y) | (0.28, 0.60) | (0.26, 0.58) |
| Luminance (cd/m$^2$) | 1087 | 865 |
| Current Efficiency (cd/A) | 14 | 8 |
| Power Efficiency (lm/W) | 13 | 6 |
| External Quantum Efficiency (%) | 4.5 | 2.6 |

As shown in Table 6, CIE chromaticity coordinates of the light-emitting element 3 at luminance of around 1000 cd/m$^2$ were (x,y)=(0.28, 0.60), and CIE chromaticity coordinates of the comparison light-emitting element 3 at luminance of around 1000 cd/m$^2$ were (x,y)=(0.26, 0.58).

Figure 28:
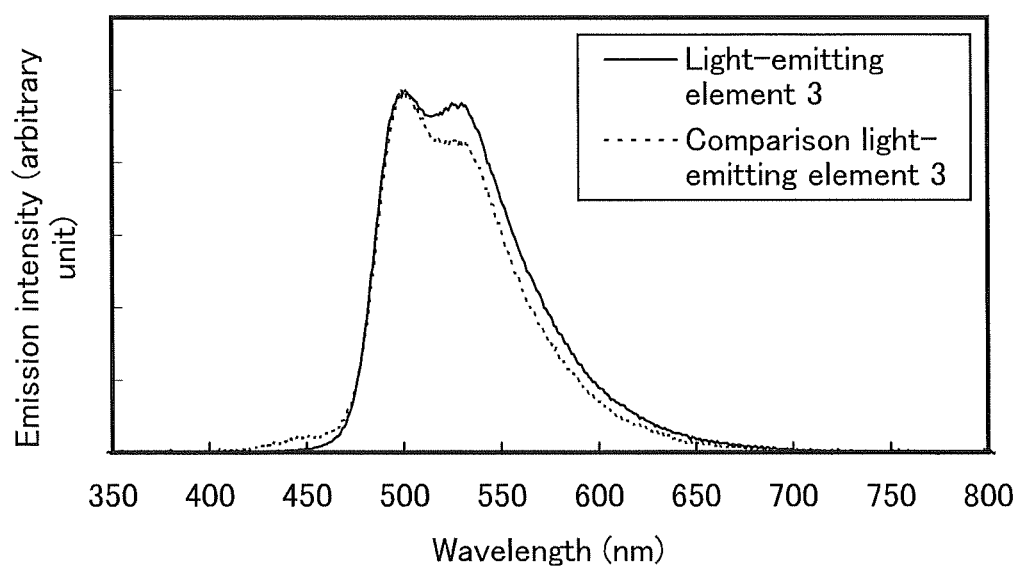
FIG. 28 shows an emission spectrum of the light-emitting element 3 and the comparison light-emitting element 3 of Example 3.

FIG. 28 shows emission spectra of the light-emitting element 3 and the comparison light-emitting element 3 which were obtained by applying a current of 0.1 mA. In FIG. 28, the vertical axis represents emission intensity (arbitrary unit) and the horizontal axis represents wavelength (nm). The emission intensity is shown as a value relative to the maximum emission intensity assumed to be 1. As shown in FIG. 28, the light-emitting element 3 and the comparison light-emitting element 3 each show a spectrum having a maximum emission wavelength at around 500 nm, which is derived from coumarin 6. This and the results of Table 6 show that the light-emitting element 3 and the comparison light-emitting element 3 emit green light.

Figure 29:
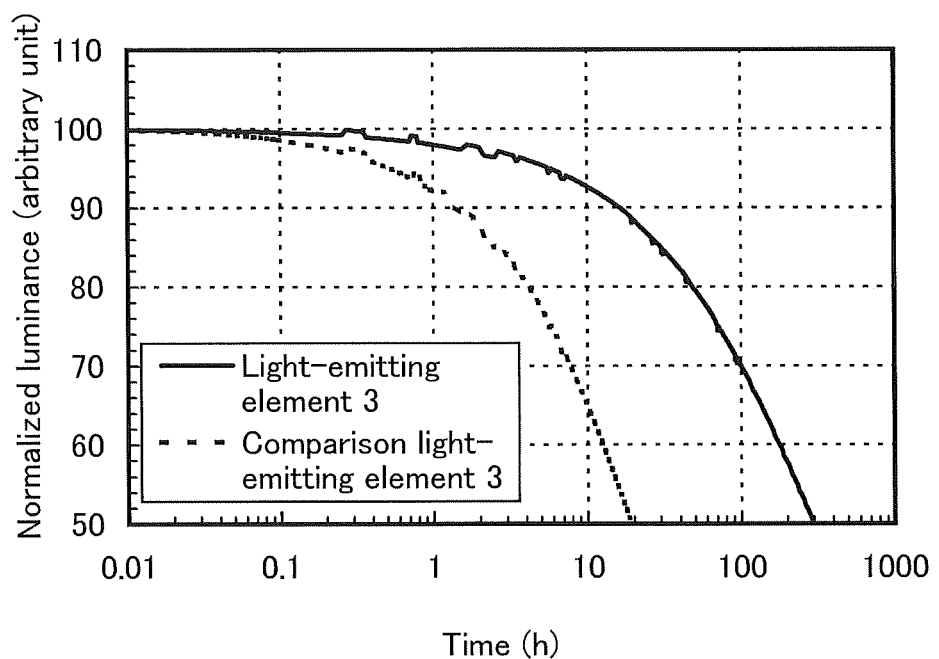
FIG. 29 shows results obtained by reliability tests of the light-emitting element 3 and the comparison light-emitting element 3 of Example 3.

The reliability tests were carried out, and the results thereof is shown in FIG. 29. In the reliability tests, the light-emitting element 3 and the comparison light-emitting element 3 were driven under the conditions where the initial luminance was set to 5000 cd/m$^2$ and the current density was constant. FIG. 29 shows a change in normalized luminance where the initial luminance is 100%.

As apparent from Table 6, FIG. 23 to FIG. 29, the light-emitting element 3 has a low threshold voltage at which the fluorescent material starts to emit light (light emission start voltage), high current efficiency, high power efficiency, and high external quantum efficiency as compared to the comparison light-emitting element 3. The light-emitting element 3 is a highly-reliable light-emitting element which shows a small luminance decrease relative to driving time.

Since 4,6mCzP2Pm and PCBBiF which are used for the light-emitting layer 1113 form an exciplex, a singlet excited state is formed from part of a triplet excited state of the exciplex in the light-emitting layer 1113. The reason why the luminous efficiency was improved is considered to be because of the energy transfer of this singlet excited state of the exciplex to the singlet excited state of the fluorescent material. The reason why the light emission start voltage was lowered is considered to be because of the formation of this exciplex.

Example 4

In this example, as in Example 1, a light-emitting element in which a mixture of a thermally activated delayed fluorescent substance and a fluorescent material is used for a light-emitting layer and a comparison light-emitting element in which a mixture of a material which does not emit thermally activated delayed fluorescence and a fluorescent material is used for a light-emitting layer are manufactured to be compared with each other. The comparison results are described with reference to FIG. 30 to FIG. 35.

Hereinafter, the light-emitting element 4 is a light-emitting element in which the thermally activated delayed fluorescent substance and the fluorescent material are mixed to be used for a light-emitting layer. The comparison light-emitting element 4 is a light-emitting element in which the material which does not emit thermally activated delayed fluorescence and the fluorescent material are mixed to be used for a light-emitting layer.

The fluorescent material which is used for the light-emitting element 3 and the comparison light-emitting element 3 is {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB).

As the thermally activated delayed fluorescent substance in the light-emitting element 4, two kinds of organic compounds which form an exciplex and are the same as the organic compounds in Example 2 were used. Specifically, 4,6-bis[3-(9H-carbazol-9-yl)-phenyl]pyrimidine (abbreviation: 4,6mCzP2Pm) was used as the first organic compound, and N-(1,1'-biphenyl-4-yl)-N-[4-(9-phenyl-9H-carbazol-3-yl)phenyl]-9,9-dimethyl-9H-fluorene-2-amine (abbreviation: PCBBiF) was used as the second organic compound.

As the material which does not emit thermally activated delayed fluorescence in the comparison light-emitting element 4, 6-bis[3-(9H-carbazol-9-yl)-phenyl]pyrimidine (abbreviation: 4,6mCzP2Pm), which is the same as the one in Example 2, was used. That is, as the material which does not emit thermally activated delayed fluorescence, the first organic compound in the light-emitting element 4 was only used.

For the chemical formulae of the materials used in this example, the chemical formulae in Example 2 can be referred to.

Methods for manufacturing the light-emitting element 4 and the comparison light-emitting element 4 are described below.

Light-Emitting Element 4

First, the first electrode 1101, the hole-injection layer 1111, and the hole-transport layer 1112 were formed over the glass substrate 1100 using a material and a method similar to those of the light-emitting element 1.

Next, 4,6mCzP2Pm (abbreviation), PCBBiF (abbreviation), and DCJTB (abbreviation) were deposited by co-evaporation, so that the light-emitting layer 1113 was formed over the hole-transport layer 1112. The weight ratio of 4,6mCzP2Pm to PCBBiF and DCJTB was adjusted to be 0.8:0.2:0.005 (=4,6mCzP2Pm:PCBBiF:DCJTB). The thickness of the light-emitting layer 1113 was set to 40 nm.

Further, over the light-emitting layer 1113, a film of 4,6mCzP2Pm (abbreviation) was formed to a thickness of 10 nm to form the first electron-transport layer 1114a.

Next, a film of bathophenanthroline (abbreviation: BPhen) was formed to a thickness of 15 nm over the first electron-transport layer 1114a to foam the second electron-transport layer 1114b.

Further, the electron-injection layer 1115 and a second electrode were formed using a material and a condition similar to the material and the condition for the electron-injection layer 1115 and the second electrode of the light-emitting element 1, so that the light-emitting element 4 in this example was formed.

Comparison Light-Emitting Element 4

The light-emitting layer 1113 of the comparison light-emitting element 3 was deposited by co-evaporation of 4,6mCzP2Pm (abbreviation) and DCJTB (abbreviation). The weight ratio of 4,6mCzP2Pm and DCJTB was adjusted to be 1:0.005 (=4,6mCzP2Pm:DCJTB). The thickness of the light-emitting layer 1113 was set to 40 nm. Components other than the light-emitting layer 1113 were manufactured in a manner similar to that of the light-emitting element 4.

Note that in all the above evaporation steps, evaporation was performed by a resistance-heating method.

Element structures of the light-emitting element 4 and the comparison light-emitting element 4 obtained as described above are shown in Table 7.

TABLE 7

| | Light-emitting Element 4 | Comparison Light-emitting Element 4 |
|---|---|---|
| Electron-injection Layer | LiF 1 nm | LiF 1 nm |
| Electron-transport Layer | BPhen 15 nm 4,6mCzP2Pm 10 nm | BPhen 15 nm 4,6mCzP2Pm 10 nm |
| Light-emitting Layer | 4,6mCzP2Pm:PCBBiF:DCJTB (=0.8:0.2:0.005) 40 nm | 4,6mCzP2Pm:DCJTB (=1:0.005) 40 nm |
| Hole-transport Layer | BPAFLP 20 nm | BPAFLP 20 nm |
| Hole-injection Layer | DBT3P-II:MoOx (=1:0.5) 20 nm | DBT3P-II:MoOx (=1:0.5) 20 nm |

*First Electrode: Indium Tin Oxide Containing Silicon Oxide 110 nm
Second Electrode: Al 200 nm These light-emitting elements were each sealed in a glove box containing a nitrogen atmosphere so as not to be exposed to the air. Then, operation characteristics of these light-emitting elements were measured. Note that the measurements were carried out at room temperature (in an atmosphere kept at 25° C.).

Figure 30:
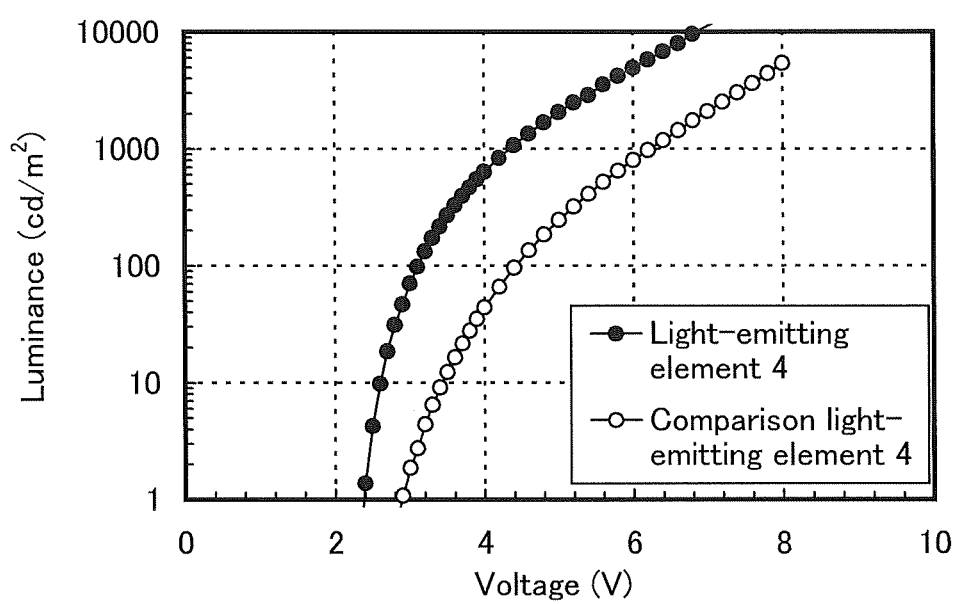
FIG. 30 shows voltage-luminance characteristics of a light-emitting element 4 and a comparison light-emitting element 4 of Example 4.
Figure 31:
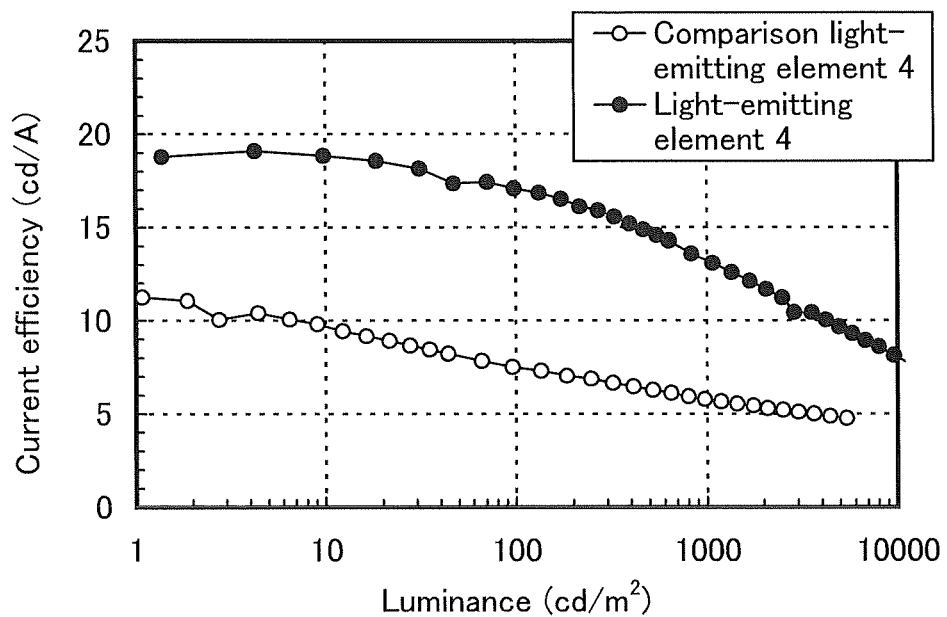
FIG. 31 shows luminance-current efficiency characteristics of the light-emitting element 4 and the comparison light-emitting element 4 of Example 4.
Figure 32:
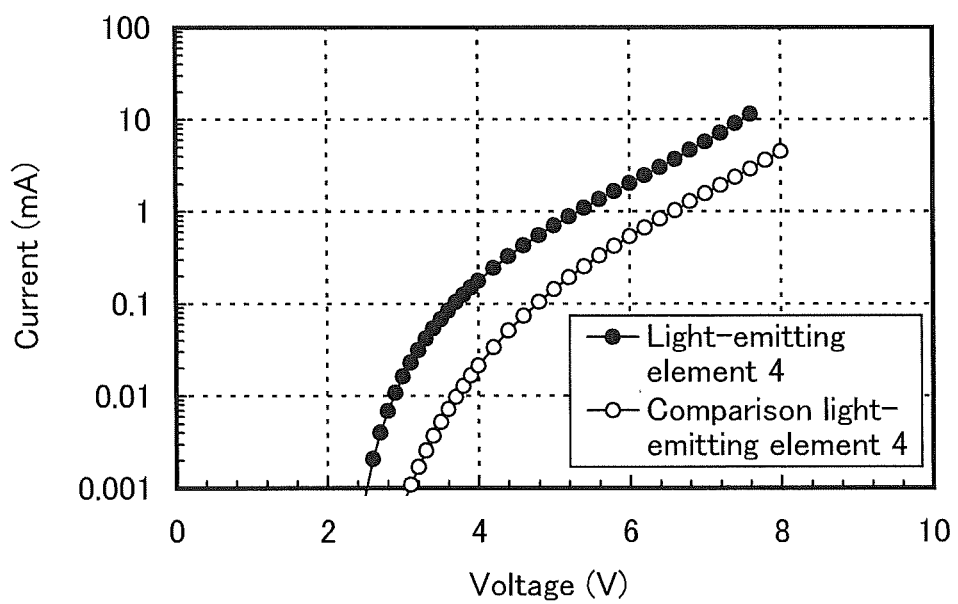
FIG. 32 shows voltage-current characteristics of the light-emitting element 4 and the comparison light-emitting element 4 of Example 4.
Figure 33:
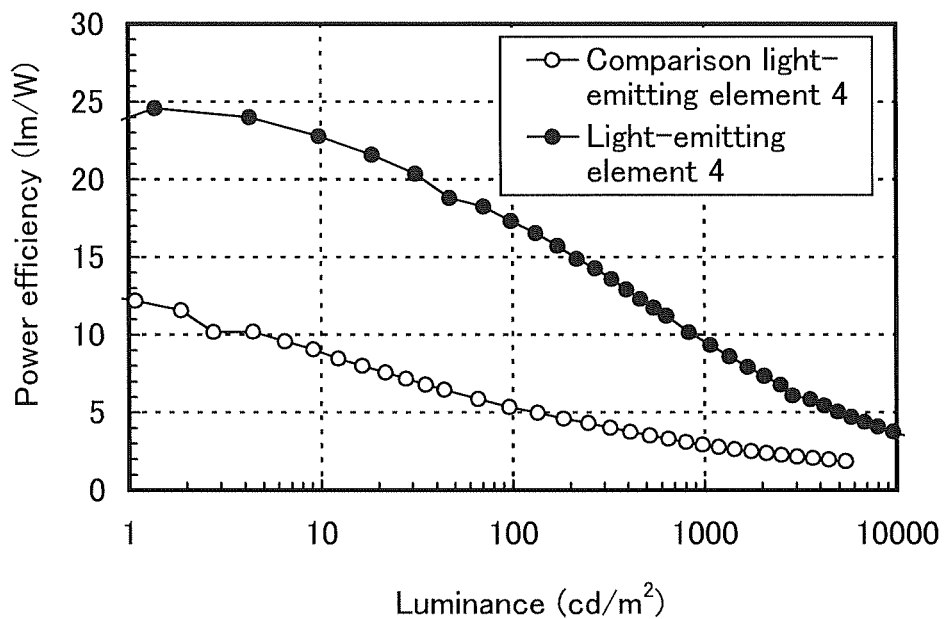
FIG. 33 shows luminance-power efficiency characteristics of the light-emitting element 4 and the comparison light-emitting element 4 of Example 4.
Figure 34:
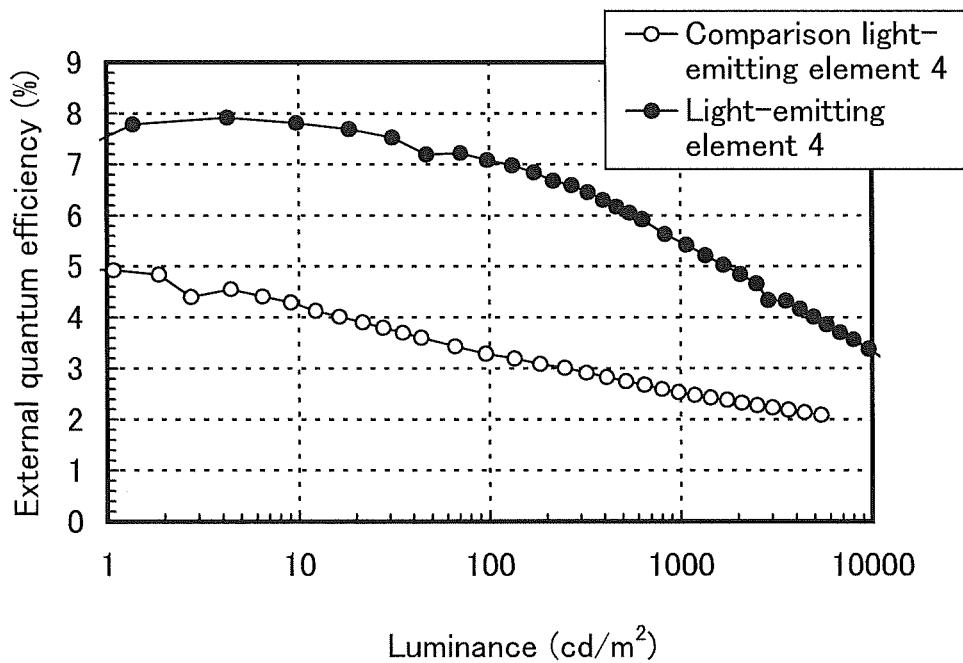
FIG. 34 shows luminance-external quantum efficiency characteristics of the light-emitting element 4 and the comparison light-emitting element 4 of Example 4.

FIG. 30 shows voltage-luminance characteristics of the light-emitting element 3 and the comparison light-emitting element 3. In FIG. 30, the horizontal axis represents voltage (V) and the vertical axis represents luminance (cd/m²). FIG. 31 shows luminance-current efficiency characteristics. In FIG. 31, the horizontal axis indicates luminance (cd/m²) and the vertical axis indicates current efficiency (cd/A). FIG. 32 shows voltage-current characteristics. In FIG. 32, the horizontal axis indicates voltage (V) and the vertical axis indicates current (mA). FIG. 33 shows luminance-power efficiency characteristics thereof. In FIG. 33, the horizontal axis represents luminance (cd/m²), and the vertical axis represents power efficiency (lm/W). In addition, FIG. 34 shows luminance-external quantum efficiency characteristics thereof. In FIG. 34, the horizontal axis represents luminance (cd/m²) and the vertical axis represents external quantum efficiency (%).

Further, Table 8 shows the voltage (V), current density (mA/cm²), CIE chromaticity coordinates (x, y), current efficiency (cd/A), power efficiency (lm/W), and external quantum efficiency (%) of each of the light-emitting element 4 and the comparison light-emitting element 4 at a luminance of around 1000 cd/m².

TABLE 8

| | Light-emitting Element 4 | Comparison Light-emitting Element 4 |
|---|---|---|
| Voltage (V) | 4.4 | 6.2 |
| Current Density (mA/cm²) | 8.2 | 16.8 |
| Chromaticity (x, y) | (0.57, 0.43) | (0.56, 0.41) |
| Luminance (cd/m²) | 1075 | 976 |
| Current Efficiency (cd/A) | 13 | 6 |
| Power Efficiency (lm/W) | 9 | 3 |
| External Quantum Efficiency (%) | 5.4 | 2.5 |

As shown in Table 8, CIE chromaticity coordinates of the light-emitting element 4 at luminance of around 1000 cd/m² were (x,y)=(0.57, 0.43), and CIE chromaticity coordinates of the comparison light-emitting element 4 at luminance of around 1000 cd/m² were (x,y)=(0.56, 0.41).

Figure 35:
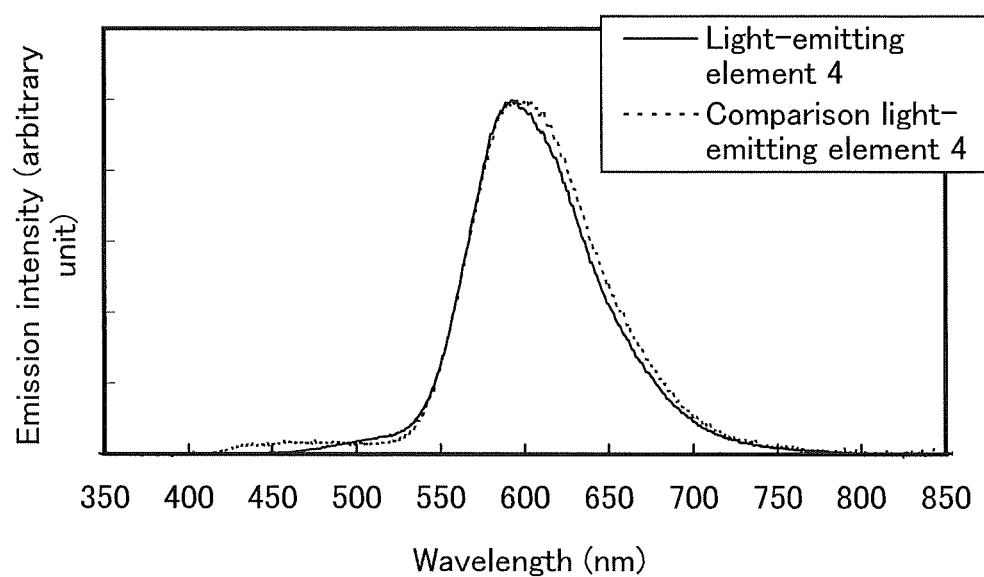
FIG. 35 shows emission spectra of the light-emitting element 4 and the comparison light-emitting element 4 of Example 4.

FIG. 35 shows emission spectra of the light-emitting element 4 and the comparison light-emitting element 4 which were obtained by applying a current of 0.1 mA. In FIG. 35, the vertical axis represents emission intensity (arbitrary unit) and the horizontal axis represents wavelength (nm). The emission intensity is shown as a value relative to the maximum emission intensity assumed to be 1. As shown in FIG. 35, the light-emitting element 4 and the comparison light-emitting element 4 each show a spectrum having a maximum emission wavelength at around 595 nm, which is derived from DCJTB. This and the results of Table 8 show that the light-emitting element 4 and the comparison light-emitting element 4 emit yellow light.

Figure 36:
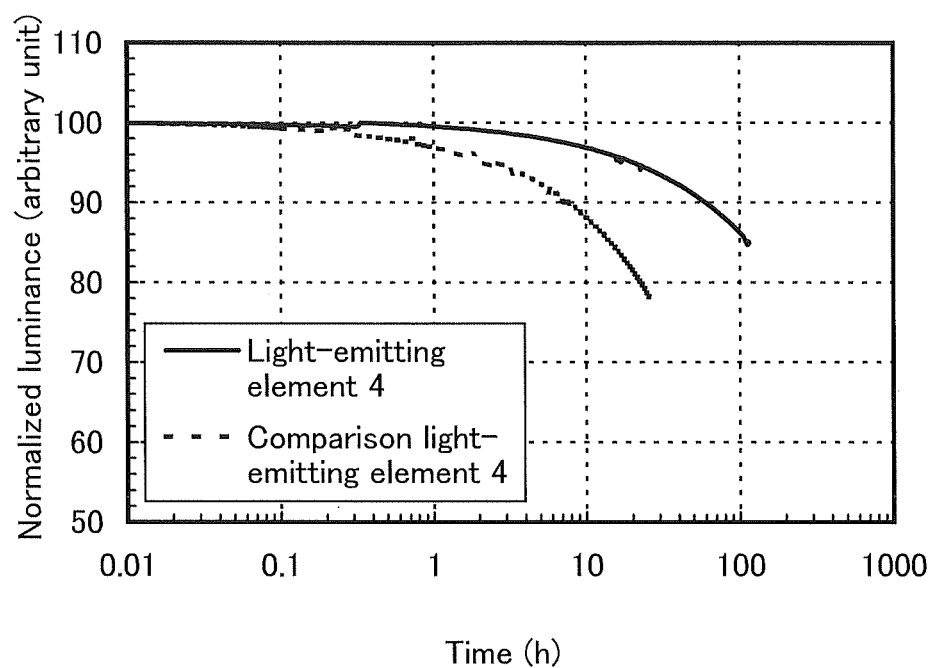
FIG. 36 shows results obtained by reliability tests of the light-emitting element 4 and the comparison light-emitting element 4 of Example 4.

The reliability tests were carried out, and the results thereof is shown in FIG. 36. In the reliability tests, the light-emitting element 4 and the comparison light-emitting element 4 were driven under the conditions where the initial luminance was set to 5000 cd/m² and the current density was constant. FIG. 36 shows a change in normalized luminance where the initial luminance is 100%.

As apparent from Table 8, FIG. 30 to FIG. 36, the light-emitting element 4 has a low threshold voltage at which the fluorescent material starts to emit light (light emission start voltage), high current efficiency, high power efficiency, and high external quantum efficiency as compared to the comparison light-emitting element 4. The light-emitting element 4 is a highly-reliable light-emitting element which shows a small luminance decrease relative to driving time.

Since 4,6mCzP2Pm and PCBBiF which are used for the light-emitting layer 1113 form an exciplex, a singlet excited state is formed from part of a triplet excited state of the exciplex in the light-emitting layer 1113. The reason why the luminous efficiency was improved is considered to be because of the energy transfer of this singlet excited state of the exciplex to the singlet excited state of the fluorescent material. The reason why the light emission start voltage was lowered is considered to be because of the formation of this exciplex.

This application is based on Japanese Patent Application serial No. 2012-172830 filed with Japan. Patent Office on Aug. 3, 2012, the entire contents of which are hereby incorporated by reference.

What is claimed is:

1. A light-emitting element comprising:
a light-emitting layer between a pair of electrodes,
wherein the light-emitting layer comprises a thermally activated delayed fluorescent substance and a material which emits fluorescence, the thermally activated delayed fluorescent substance generating a singlet excited state from a triplet excited state by reverse intersystem crossing,
wherein the thermally activated delayed fluorescent substance comprises a x-electron rich heteroaromatic ring,
wherein a level of the singlet excited state generated by the thermally activated delayed fluorescent substance is higher than a level of a singlet excited state of the material which emits fluorescence, and
wherein an emission spectrum of the thermally activated delayed fluorescent substance overlaps with an absorption band on the longest wavelength side in an absorption spectrum of the material which emits fluorescence.

2. The light-emitting element according to claim 1, wherein the T-electron rich heteroaromatic ring is any one of a carbazole skeleton, a thiophene skeleton, and a furan skeleton.

3. The light-emitting element according to claim 1, wherein a peak wavelength of the emission spectrum of the thermally activated delayed fluorescent substance is longer than or equal to a peak wavelength of the absorption band on the longest wavelength side in the absorption spectrum of the material which emits fluorescence.

4. The light-emitting element according to claim 1, wherein a difference between a peak wavelength of the emission spectrum of the thermally activated delayed fluorescent substance and a peak wavelength of an emission spectrum of the material which emits fluorescence is 30 nm or less.

5. The light-emitting element according to claim 1, wherein a difference in equivalent energy value between a peak wavelength of the emission spectrum of the thermally activated delayed fluorescent substance and a peak wavelength of an emission spectrum of the material which emits fluorescence is smaller than or equal to +0.2 eV.

6. A light-emitting device comprising the light-emitting element according to claim 1.

7. A light-emitting element comprising:
a light-emitting layer between a pair of electrodes,
wherein the light-emitting layer comprises a thermally activated delayed fluorescent substance and a material which emits fluorescence, the thermally activated delayed fluorescent substance generating a singlet excited state from a triplet excited state by reverse intersystem crossing,
wherein the thermally activated delayed fluorescent substance comprises a x-electron deficient heteroaromatic ring,
wherein a level of the singlet excited state generated by the thermally activated delayed fluorescent substance is higher than a level of a singlet excited state of the material which emits fluorescence, and
wherein an emission spectrum of the thermally activated delayed fluorescent substance overlaps with an absorption band on the longest wavelength side in an absorption spectrum of the material which emits fluorescence.

8. The light-emitting element according to claim 7, wherein the x-electron deficient heteroaromatic ring is any one of a polyazole skeleton, a diazine skeleton, and a pyridine skeleton.

9. The light-emitting element according to claim 7, wherein a peak wavelength of the emission spectrum of the thermally activated delayed fluorescent substance is longer than or equal to a peak wavelength of the absorption band on the longest wavelength side in the absorption spectrum of the material which emits fluorescence.

10. The light-emitting element according to claim 7, wherein a difference between a peak wavelength of the emission spectrum of the thermally activated delayed fluorescent substance and a peak wavelength of an emission spectrum of the material which emits fluorescence is 30 nm or less.

11. The light-emitting element according to claim 7, wherein a difference in equivalent energy value between a peak wavelength of the emission spectrum of the thermally activated delayed fluorescent substance and a peak wavelength of an emission spectrum of the material which emits fluorescence is smaller than or equal to +0.2 eV.

12. A light-emitting device comprising the light-emitting element according to claim 7.

13. A light-emitting element comprising:
a light-emitting layer between a pair of electrodes,
wherein the light-emitting layer comprises a thermally activated delayed fluorescent substance and a material which emits fluorescence, the thermally activated delayed fluorescent substance generating a singlet excited state from a triplet excited state by reverse intersystem crossing,
wherein the thermally activated delayed fluorescent substance comprises a x-electron rich heteroaromatic ring and a x-electron deficient heteroaromatic ring,
wherein a level of the singlet excited state generated by the thermally activated delayed fluorescent substance is higher than a level of a singlet excited state of the material which emits fluorescence, and
wherein an emission spectrum of the thermally activated delayed fluorescent substance overlaps with an absorption band on the longest wavelength side in an absorption spectrum of the material which emits fluorescence.

14. The light-emitting element according to claim 13, wherein the x-electron rich heteroaromatic ring is any one of a carbazole skeleton, a thiophene skeleton, and a furan skeleton.

15. The light-emitting element according to claim 13, wherein the x-electron deficient heteroaromatic ring is any one of a polyazole skeleton, a diazine skeleton, and a pyridine skeleton.

16. The light-emitting element according to claim 13, wherein a peak wavelength of the emission spectrum of the thermally activated delayed fluorescent substance is longer than or equal to a peak wavelength of the absorption band on the longest wavelength side in the absorption spectrum of the material which emits fluorescence.

17. The light-emitting element according to claim 13, wherein a difference between a peak wavelength of the emission spectrum of the thermally activated delayed fluorescent substance and a peak wavelength of an emission spectrum of the material which emits fluorescence is 30 nm or less.

18. The light-emitting element according to claim 13, wherein a difference in equivalent energy value between a peak wavelength of the emission spectrum of the thermally activated delayed fluorescent substance and a peak wavelength of an emission spectrum of the material which emits fluorescence is smaller than or equal to +0.2 eV.

19. A light-emitting device comprising the light-emitting element according to claim 13.

* * * * *